(12) United States Patent
Nosaka

(10) Patent No.: US 11,082,031 B2
(45) Date of Patent: Aug. 3, 2021

(54) FILTER DEVICE, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/826,324

(22) Filed: Mar. 23, 2020

(65) Prior Publication Data

US 2020/0220522 A1 Jul. 9, 2020

Related U.S. Application Data

(63) Continuation of application No. PCT/JP2018/033979, filed on Sep. 13, 2018.

(30) Foreign Application Priority Data

Sep. 28, 2017 (JP) .............................. JP2017-188830

(51) Int. Cl.
*H03H 9/64* (2006.01)
*H04B 1/40* (2015.01)
(Continued)

(52) U.S. Cl.
CPC ............ *H03H 9/6489* (2013.01); *H03F 3/19* (2013.01); *H03H 9/145* (2013.01); *H03H 9/25* (2013.01);
(Continued)

(58) Field of Classification Search
CPC ........ H03H 9/6489; H03H 9/145; H03H 9/25; H03H 9/6483; H03H 9/72; H03F 3/19; H03F 2200/451; H04B 1/40
(Continued)

(56) References Cited

U.S. PATENT DOCUMENTS

2008/0238572 A1 10/2008 Funami et al.
2011/0316649 A1 12/2011 Link et al.
(Continued)

FOREIGN PATENT DOCUMENTS

JP 08-065089 A 3/1996
JP 09-167937 A 6/1997
(Continued)

OTHER PUBLICATIONS

International Search Report dated Nov. 27, 2018 in International Application No. PCT/JP2018/033979, 4 pages.
(Continued)

*Primary Examiner* — Lee Nguyen
(74) *Attorney, Agent, or Firm* — Xsensus LLP

(57) ABSTRACT

A filter device includes a first input/output terminal and a second input/output terminal, as well as a series-arm circuit disposed on a path that connects the first input/output terminal and the second input/output terminal, and a parallel-arm circuit connected to a node on the path and a ground. At least one of the series-arm circuit or the parallel-arm circuit includes a resonance circuit, and the resonance circuit includes a first acoustic wave resonator, and a first capacitor connected in parallel to the first acoustic wave resonator, and having a greater electrostatic capacitance per unit area than that for the first acoustic wave resonator.

19 Claims, 34 Drawing Sheets

(51) Int. Cl.
   *H03F 3/19*    (2006.01)
   *H03H 9/145*   (2006.01)
   *H03H 9/25*    (2006.01)
   *H03H 9/72*    (2006.01)

(52) U.S. Cl.
   CPC ............ *H03H 9/6483* (2013.01); *H03H 9/72* (2013.01); *H04B 1/40* (2013.01); *H03F 2200/451* (2013.01)

(58) Field of Classification Search
   USPC ................. 455/73–83; 333/133, 189, 193
   See application file for complete search history.

(56) References Cited

U.S. PATENT DOCUMENTS

| | | | |
|---|---|---|---|
| 2017/0214389 A1 | 7/2017 | Tsutsumi | |
| 2018/0159506 A1 | 6/2018 | Ito | |
| 2020/0235720 A1* | 7/2020 | Nosaka | ................ H04B 1/0057 |

FOREIGN PATENT DOCUMENTS

| | | | |
|---|---|---|---|
| JP | 2004-023593 | A | 1/2004 |
| JP | 2004-343168 | A | 12/2004 |
| JP | 2005-260833 | A | 9/2005 |
| JP | 2007-036856 | A | 2/2007 |
| JP | 2008-271511 | A | 11/2008 |
| JP | 2010-103920 | A | 5/2010 |
| JP | 2011-146768 | A | 7/2011 |
| JP | 2012-049758 | A | 3/2012 |
| JP | 2012-519447 | A | 8/2012 |
| JP | 2017-135568 | A | 8/2017 |
| WO | 2016/190216 | A1 | 12/2016 |

OTHER PUBLICATIONS

Written Opinion of the International Searching Authority dated Nov. 27, 2018 in International Application No. PCT/JP2018/033979, 13 pages.

* cited by examiner (a) Comparative Example 1
$C_z(s1) = C_z(Cs1)$ (b) Example 1
$C_z(s1) < C_z(Cs1)$ (a)

(b)

Example 5

$Cz(s1) < Cz(Cs1)$
$C0(s1//Cs1) < C0(p1)$

Example 6

$Cz(p1) < Cz(Cp1)$
$C0(p1//Cp1) > C0(s1)$

Comparative Example 3

$Cz(p1) = Cz(Cp1)$
$Cz(s1) = Cz(Cs1)$

Example 9

Comparative Example 5

Comparative Example 6

Example 10

Cz(s1)<Cz(Cs1)

Example 11

(a)

IDT electrode    Comb-shaped capacitor electrode (b)

IDT electrode    Comb-shaped capacitor electrode

FILTER DEVICE, MULTIPLEXER, RADIO FREQUENCY FRONT-END CIRCUIT, AND COMMUNICATION DEVICE

CROSS REFERENCE TO RELATED APPLICATIONS

This is a continuation application of PCT International Application No. PCT/JP2018/033979 filed on Sep. 13, 2018, designating the United States of America, which is based on and claims priority of Japanese Patent Application No. 2017-188830 filed on Sep. 28, 2017. The entire disclosures of the above-identified applications, including the specifications, drawings and claims are incorporated herein by reference in their entirety.

FIELD

The present disclosure relates to a filter device, a multiplexer, a radio frequency (RF) front-end circuit, and a communication device.

BACKGROUND

Conventionally, a filter device that uses acoustic waves is widely used as a bandpass filter disposed in a front-end portion of a mobile communication device. A radio frequency front-end circuit that includes a plurality of filter devices has been put into practical use in order to support multiplex technology such as multi-mode and multiband technology.

As a filter device that supports multi-mode and multiband technology, a ladder filter that includes a series-arm resonator and a parallel-arm resonator as disclosed in Japanese Unexamined Patent Application Publication No. 2004-343168 has been known. Specifically, a series-arm resonator disposed on a path that connects a first input/output terminal and a second input/output terminal, and a parallel-arm resonator connected to the ground and a node on the path are included in a ladder filter. Then, a capacitive element (capacitor) is connected in parallel to one of the series-arm resonator and the parallel-arm resonator in order that the one resonator has an effective electromechanical coupling factor different from that of the other resonator, which achieves a filter device having a highly steep skirt in a narrow band.

SUMMARY

Technical Problems

There has been a strong demand for size reduction of a mobile communication device that supports multi-mode/multiband technology due to a large number of filter devices included. However, as recognized by the present inventor, a filter device described in Japanese Unexamined Patent Application Publication No. 2004-343168 has a problem that the size of the filter device is increased due to a large size of a capacitor connected in parallel to a resonator to adjust the effective electromechanical coupling factor. Furthermore, the filter device has a problem that a line that connects the resonator and the capacitor is long due to the large size of the capacitor, and insertion loss in a passband of the filter device is increased due to the resistance of the line.

In view of this, the present disclosure provides a filter device miniaturized while maintaining filter characteristics, a multiplexer, a radio frequency front-end circuit, and a communication device.

Solutions

In order to achieve the above, and other, objects, a filter device according to an aspect of the present disclosure includes a first input/output terminal and a second input/output terminal, as well as a series-arm circuit disposed on a path that connects the first input/output terminal and the second input/output terminal, and a parallel-arm circuit connected to a node on the path and a ground. At least one of the series-arm circuit or the parallel-arm circuit includes a resonance circuit, and the resonance circuit includes a first acoustic wave resonator, and a first capacitor connected in parallel to the first acoustic wave resonator, and having a greater electrostatic capacitance per unit area than that for the first acoustic wave resonator.

According to the above configuration, the first capacitor contributes to decreasing a difference between the antiresonant frequency and the resonant frequency of the resonance circuit. Here, electrostatic capacitance of the first capacitor per unit area is made greater than the electrostatic capacitance of the first acoustic wave resonator per unit area, thus miniaturizing the first capacitor. Furthermore, a line that connects the first acoustic wave resonator and the first capacitor can be shortened by miniaturizing the first capacitor.

Accordingly, the filter device can be miniaturized while maintaining filter characteristics determined according to the frequency difference.

One of the series-arm circuit and the parallel-arm circuit may include the resonance circuit, an other of the series-arm circuit and the parallel-arm circuit may include a second acoustic wave resonator not connected in parallel to a capacitor, and under a condition that a value obtained by dividing a difference between an antiresonant frequency of an acoustic wave resonator and a resonant frequency of the acoustic wave resonator by the resonant frequency of the acoustic wave resonator is defined as a fractional bandwidth of the acoustic wave resonator, the first acoustic wave resonator may have a fractional bandwidth greater than a fractional bandwidth of the second acoustic wave resonator.

The fractional bandwidth of the first acoustic wave resonator is greater than the fractional bandwidth of the second acoustic wave resonator, and thus the electrostatic capacitance of the first capacitor for decreasing the fractional bandwidth of the resonance circuit can be increased. Accordingly, the greater electrostatic capacitance of the first capacitor is, the higher the proportion of the area occupied, within the resonance circuit, by the first capacitor having relatively large electrostatic capacitance per unit area is, and thus the resonance circuit can be more effectively miniaturized. Accordingly, the filter device can be effectively miniaturized.

One of the series-arm circuit and the parallel-arm circuit may include the resonance circuit, an other of the series-arm circuit and the parallel-arm circuit may include a second acoustic wave resonator not connected in parallel to a capacitor, and the resonance circuit may have an electrostatic capacitance greater than that of the second acoustic wave resonator.

The electrostatic capacitance of the resonance circuit is determined by a sum of electrostatic capacitance of the first acoustic wave resonator and electrostatic capacitance of the first capacitor, and impedance of the resonance circuit decreases with an increase in the sum of the electrostatic capacitance. Here, when the electrostatic capacitance of the resonance circuit is the same as the electrostatic capacitance of the second acoustic wave resonator, the first capacitor having great electrostatic capacitance per unit area is connected to the resonance circuit, and thus the resonance circuit is smaller than the second acoustic wave resonator. From this viewpoint, when the electrostatic capacitance of the resonance circuit is greater than the electrostatic capacitance of the second acoustic wave resonator as in the above configuration, the filter device can be more effectively miniaturized.

Under a condition that a fractional bandwidth of the acoustic wave resonator is defined as a value obtained by dividing a difference between an antiresonant frequency of an acoustic wave resonator and a resonant frequency of the acoustic wave resonator by the resonant frequency of the acoustic wave resonator, and under a condition that a fractional bandwidth of the resonance circuit value is defined as a value obtained by dividing a difference between an antiresonant frequency of a resonance circuit and a resonant frequency of the resonance circuit by the resonant frequency of the resonance circuit, the antiresonant frequency of the resonance circuit being a frequency at which an impedance of the resonance circuit has a local maximum value, and the resonant frequency of the resonance circuit being a frequency at which the impedance of the resonance circuit has a local minimum value, the resonance circuit may have a fractional bandwidth narrower than or equal to a fractional bandwidth of the second acoustic wave resonator.

Accordingly, the steepness of a skirt on the passband low-frequency side or the passband high-frequency side of the filter device can be improved.

The filter device may include: one or more other series-arm circuits; the parallel-arm circuit includes one or more other parallel-arm circuits each connected to a node on the path and the ground; and two or more resonance circuits disposed in two or more of the one or more other series-arm circuits and the one or more other parallel-arm circuits, the two or more resonance circuits having a same structure as the resonance circuit, wherein the one or more other series-arm circuits and the one or more other parallel-arm circuits are included in a multi-level ladder filter circuit.

Accordingly, the filter device can be further miniaturized while maintaining filter characteristics.

The parallel-arm circuit may include: the resonance circuit; and a switch circuit connected in series to the resonance circuit. The switch circuit may include: an impedance element that is one of a second capacitor and an inductor; and a switch element connected in parallel to the impedance element.

According to the parallel-arm circuit, impedance of the switch circuit can be changed by switching between the conducting and non-conducting states of the switch element, thus switching the resonant frequency of the parallel-arm circuit to another frequency. On the other hand, since the switch circuit and the resonance circuit are connected in series, the resonance circuit is to be designed to have low impedance (to have great electrostatic capacitance), yet electrostatic capacitance per unit area of the first capacitor included in the resonance circuit is greater than the electrostatic capacitance of the first acoustic wave resonator per unit area, and thus the resonance circuit can be miniaturized. Accordingly, a small filter device having a frequency-tunable function can be achieved.

The at least one of the series-arm circuit or the parallel-arm circuit may include other resonance circuits each of which having a same structure as the resonance circuit, and the other resonance circuits may be connected in series to one another.

When high power is applied to a series-arm circuit or a parallel-arm circuit that consumes a lot of power and includes an acoustic wave resonator, the acoustic wave resonator may be damaged. Accordingly, use of serially divided acoustic wave resonators is a typical measure. In this case, electrostatic capacitance of each of the serially divided acoustic wave resonators is to be increased, which results in an increase in the sizes of the acoustic wave resonators.

According to the above configuration of the present disclosure, instead of such serially divided acoustic wave resonators, resonance circuits are connected in series not via an acoustic wave resonator, in the series-arm circuit/the parallel-arm circuit that consumes a lot of power and includes an acoustic wave resonator. Thus, power durability of the series-arm circuit and the parallel-arm circuit can be ensured. Accordingly, a small filter device having ensured power durability can be achieved.

The at least one of the series-arm circuit or the parallel-arm circuit may be connected to a terminal through which power is applied out of the first input/output terminal and the second input/output terminal, and not via a circuit that includes an acoustic wave resonator.

Power durability of an acoustic wave resonator is the lowest at the antiresonant frequency of the acoustic wave resonator. On the other hand, the first capacitor is connected in parallel to the first acoustic wave resonator in the resonance circuit, and thus the antiresonant frequency of the resonance circuit is lower than the antiresonant frequency of the first acoustic wave resonator. Accordingly, power consumption can be decreased at the antiresonant frequency at which power durability of the first acoustic wave resonator is low. Consequently, power durability of the series-arm circuit/the parallel-arm circuit that includes a resonance circuit can be improved, and power durability of the filter device can be increased.

The first acoustic wave resonator may be a surface acoustic wave resonator that includes: a piezoelectric substrate; and an interdigital transducer (IDT) electrode that is formed on the piezoelectric substrate and includes electrode fingers. The first capacitor may include a comb-shaped capacitor that is formed on the piezoelectric substrate and includes electrode fingers, and a gap between adjacent electrode fingers out of the electrode fingers included in the comb-shaped capacitor may be narrower than a gap between adjacent electrode fingers out of the electrode fingers included in the IDT electrode.

Accordingly, the size of the first capacitor can be decreased.

A repeating pitch of the electrode fingers included in the comb-shaped capacitor may be narrower than a repeating pitch of the electrode fingers included in the IDT electrode.

Accordingly, the size of the first capacitor can be decreased and furthermore, the Q characteristics improve.

The electrode fingers included in the comb-shaped capacitor may be thinner than the electrode fingers included in the IDT electrode.

The electrode finger pitch of the comb-shaped capacitor included in the first capacitor can be further decreased. Furthermore, the size of the first capacitor can be further decreased, and the Q characteristics further improve.

Under a condition that a ratio of a width of electrode fingers to a pitch of the electrode fingers is defined as a duty ratio, electrode fingers of the comb-shaped capacitor have a duty ratio higher than that for the IDT electrode.

Accordingly, the size of the first capacitor can be further decreased.

The first acoustic wave resonator may be a surface acoustic wave resonator that includes: a piezoelectric substrate; and an interdigital transducer (IDT) electrode that is formed on the piezoelectric substrate and includes electrode fingers. The first capacitor may include: a first electrode; a second electrode facing the first electrode; and an insulating component disposed between the first electrode and the second electrode, and the insulating component may have a permittivity higher than a permittivity of the piezoelectric substrate.

Accordingly, the size of the first capacitor can be decreased. Also, this allows the self-resonant frequency to have a higher frequency.

The first capacitor may include: a first electrode; a second electrode facing the first electrode; and an insulating component disposed between the first electrode and the second electrode. The first acoustic wave resonator may include: a third electrode; a fourth electrode facing the third electrode; and a piezoelectric component disposed between the third electrode and the fourth electrode, and the insulating component may have a permittivity higher than a permittivity of the piezoelectric component.

Accordingly, the size of the first capacitor can be decreased. Also, this allows the self-resonant frequency to have a higher frequency.

The first capacitor may include: a first electrode; a second electrode facing the first electrode; and an insulating component disposed between the first electrode and the second electrode. The first acoustic wave resonator may include: a third electrode; a fourth electrode facing the third electrode; and a piezoelectric component disposed between the third electrode and the fourth electrode, and the insulating component may be thinner than the piezoelectric component.

Accordingly, the size of the first capacitor can be decreased. Also, this allows the self-resonant frequency to have a higher frequency.

A multiplexer according to an aspect of the present disclosure includes: a plurality of filters that include the filter device described above. Input terminals or output terminals of the plurality of filters are directly or indirectly connected to a common terminal.

One of the input terminal and the output terminal of the filter device may be connected, not via a series-arm circuit that includes an acoustic wave resonator or a parallel-arm circuit that includes an acoustic wave resonator, to the at least one of the series-arm circuit or the parallel-arm circuit that includes the resonance circuit, and at least one of the plurality of filters except the filter device may have a passband having a frequency range higher than a frequency range of a passband of the filter device.

Loss due to bulk waves radially traveling (bulk wave loss) occurs in a frequency range higher than the antiresonant frequency of an acoustic wave resonator, and the acoustic wave resonator operates as a capacitor having a low Q factor. Accordingly, in a multiplexer that includes a filter having a passband with a higher frequency range than that of the passband of a filter device, insertion loss of the filter is assumed to increase.

In contrast, according to the above configuration, the resonance circuit constituted by the first acoustic wave resonator and the first capacitor connected in parallel, power is distributed to the first acoustic wave resonator having bulk wave loss and the first capacitor having no bulk wave loss, and thus bulk wave loss in the resonance circuit be decreased. Accordingly, insertion loss in the passband of the filter having a passband with a high frequency range can be decreased.

A radio frequency front-end circuit according to an aspect of the present disclosure includes: one of the filter device described above and the multiplexer described above; and an amplifier circuit directly or indirectly connected to the one of the filter device and the multiplexer.

Accordingly, insertion loss in the passband of the one of the filter device and the multiplexer can be decreased, and furthermore, the one of the filter device and the multiplexer can be miniaturized. Accordingly, the gain in the radio frequency front-end circuit increases and furthermore, the radio frequency front-end circuit can be miniaturized.

A communication device according to an aspect of the present disclosure includes: a radio frequency (RF) signal processing circuit that processes a radio frequency signal to be transmitted by an antenna element and a radio frequency signal received by the antenna element; and the above-described radio frequency front-end circuit that conveys the radio frequency signals between the antenna element and the RF signal processing circuit.

Accordingly, communication quality of the communication device can be improved, and the size thereof can be reduced.

Advantageous Effects

According to the present disclosure, a filter device miniaturized while maintaining filter characteristics, a multiplexer, a radio frequency front-end circuit, and a communication device can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
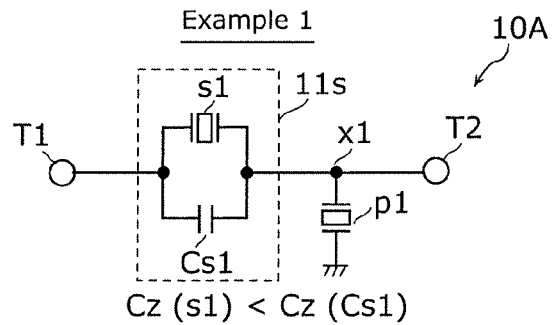
FIG. 1A illustrates a circuit configuration of a filter device according to Example 1.

The following describes in detail embodiments of the present disclosure, using examples and drawings. Note that the embodiments described below each show a general or specific example. The numerical values, shapes, materials, elements, the arrangement and connection of the elements, and others indicated in the following embodiments are mere examples, and are therefore not intended to limit the present disclosure. Thus, among the elements in the following embodiments, elements not recited in any independent claim are described as arbitrary elements. In addition, the sizes of elements and the ratios of the sizes illustrated in the drawings are not necessarily accurate. Throughout the drawings, the same numeral is given to substantially the same element, and redundant description is omitted or simplified. Constants of circuit elements such as resonators may be adjusted as appropriate according to, for instance, requirement specification. Accordingly, even if circuit elements have the same reference numeral, constants thereof may be different.

In the following, a "passband low-frequency edge" means "the lowest frequency in a passband". A "passband high-frequency edge" means "the highest frequency in a passband". In the following, a "passband low-frequency side" means "a lower-frequency side relative to a passband, which is outside the passband". A "passband high-frequency side" means "a higher-frequency side relative to a passband, which is outside the passband". When referring to "passband", generally the passband is defined by the filter's 3 dB attenuation points.

A resonant frequency of a resonator or a circuit is for forming an attenuation pole in or near a passband of a filter that includes the resonator or the circuit, and is a frequency at a "resonance point" that is a singular point at which impedance of the resonator or the circuit has a local minimum value (a point at which the impedance is ideally 0), unless otherwise stated.

An antiresonant frequency of a resonator or a circuit is for forming an attenuation pole in or near a passband of a filter that includes the resonator or the circuit, and is a frequency at an "antiresonance point" that is a singular point at which impedance of the resonator or the circuit has a local maximum value (a point at which the impedance is ideally infinite), unless otherwise stated.

Note that a series-arm (resonant) circuit and a parallel-arm (resonant) circuit in the following embodiments are defined as follows.

A parallel-arm (resonant) circuit is disposed between the ground and a node on a path that connects a first input/output terminal and a second input/output terminal.

A series-arm (resonant) circuit is disposed between the first input/output terminal or the second input/output terminal and the node on the path connected with the parallel-arm (resonant) circuit, or between a node on the path connected with one parallel-arm (resonant) circuit and another node on the path connected with another parallel-arm (resonant) circuit.

Embodiment 1

[1.1 Filter Device According to Example 1]

FIG. 1A illustrates a circuit configuration of filter device 10A according to Example 1. Filter device 10A illustrated in FIG. 1A includes series-arm circuit 11s, parallel-arm resonator p1, and input/output terminals T1 and T2.

In this example, series-arm circuit 11s is connected to a path that connects input/output terminals T1 and T2, and includes series-arm resonator s1 and capacitor Cs1. Series-arm circuit 11s is a resonance circuit that includes series-arm resonator s1 and capacitor Cs1. Series-arm resonator s1 is a first acoustic wave resonator connected in parallel to capacitor Cs1. Capacitor Cs1 is a first capacitor connected in parallel to series-arm resonator s1, and has electrostatic capacitance per unit area (Cz (Cs1): which may be referred to as electrostatic capacitance density Cz (Cs1)) greater than electrostatic capacitance of series-arm resonator s1 per unit area (Cz (s1): which may be referred to as electrostatic capacitance density Cz (s1) in the following).

Parallel-arm resonator p1 is included in a parallel-arm circuit connected to node x1 on the path and the ground.

Table 1 shows circuit parameters of filter device 10A according to Example 1, and circuit parameters of filter device 500A according to Comparative Example 1.

TABLE 1

| | | | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Comp. Ex. 1 | S-arm ckt | s1 | 840 | 881 | 4.88 | 1.50 | 130.00 | 11538 |
| | | Cs1 | | | | 0.50 | 130.00 | 3846 |
| | P-arm ckt | p1 | 840 | 871 | 3.69 | 2.00 | 130.00 | 15385 |
| | | | 800 | 836 | 4.50 | 4.00 | 130.00 | 30769 |
| | Filt. device 500A | | | | | | | 46154 |
| Ex. 1 | S-arm ckt | s1 | 840 | 881 | 4.88 | 1.50 | 130.00 | 11538 |
| | 11s | Cs1 | | | | 0.50 | 300.00 | 1667 |
| | P-arm ckt | p1 | 840 | 871 | 3.69 | 2.00 | 130.00 | 13205 |
| | | | 800 | 836 | 4.50 | 4.00 | 130.00 | 30769 |
| | Filt. device 10A | | | | | | | 43974 |

Figure 1B:
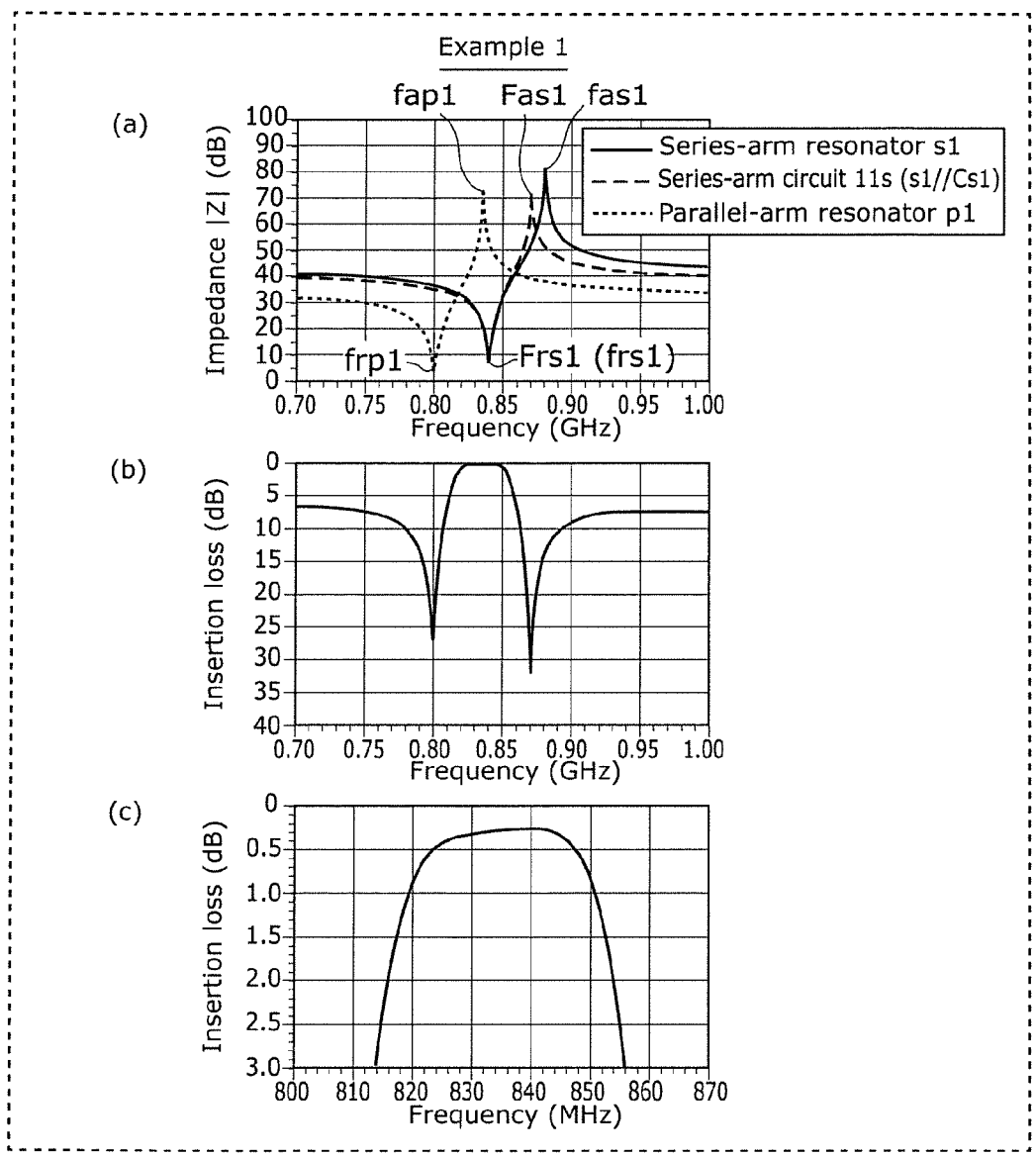
FIG. 1B illustrates graphs showing impedance characteristics and passing characteristics of the filter device according to Example 1.

FIG. 1B illustrates graphs showing impedance characteristics of resonators and a circuit included in filter device 10A according to Example 1, and passing characteristics of filter device 10A according to Example 1. As illustrated in (a) and (b) of FIG. 1B, in filter device 10A, when series-arm circuit 11s and parallel-arm resonator p1 are to form a bandpass filter, antiresonant frequency fap1 of parallel-arm resonator p1 and resonant frequency Frs1 of series-arm circuit 11s are set to values close to each other. Frequencies at and near frequency frp1 at which impedance of parallel-arm resonator p1 is substantially 0 form a lower-frequency stopband. In a frequency range higher than resonant frequency frp1, impedance of the parallel-arm resonator is high at antiresonant frequency fap1, and furthermore impedance of series-arm circuit 11s is substantially 0 at and near resonant frequency Frs1. Accordingly, a signal pass band on a signal path from input/output terminal T1 to input/output terminal T2 is formed at and near antiresonant frequency fap1 and resonant frequency Frs1. Furthermore, if a frequency is increased, and approaches and reaches antiresonant frequency Fas1 of series-arm circuit 11s, impedance of series-arm circuit 11s increases, and a high-frequency stopband is formed. Specifically, filter device 10A is a bandpass filter in which a passband is determined by antiresonant frequency fap1 and resonant frequency Frs1, a pole (attenuation pole) on the passband low-frequency side is determined by resonant frequency frp1, and a pole (attenuation pole) on the passband high-frequency side is determined by antiresonant frequency Fas1.

In filter device 10A according to Example 1, series-arm circuit 11s includes a resonance circuit constituted by series-arm resonator s1 and capacitor Cs1 connected in parallel, and thus a filter having a narrow band is achieved while ensuring the steepness of a skirt on the passband high-frequency side.

Here, a basic resonance operation of series-arm circuit 11s is described with reference to FIG. 3.

Figure 3:
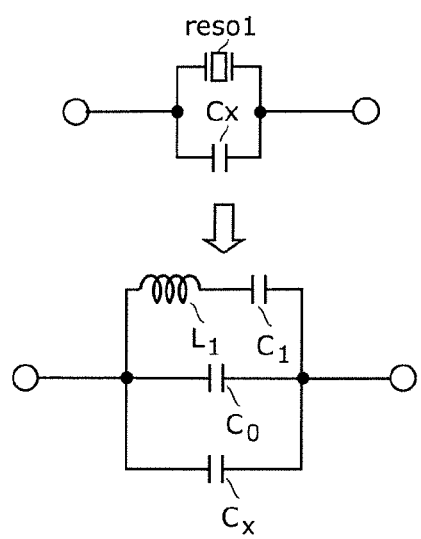
FIG. 3 illustrates an equivalent circuit of a resonance circuit constituted by an acoustic wave resonator and a capacitor connected in parallel, and impedance characteristics.
Figure 3:
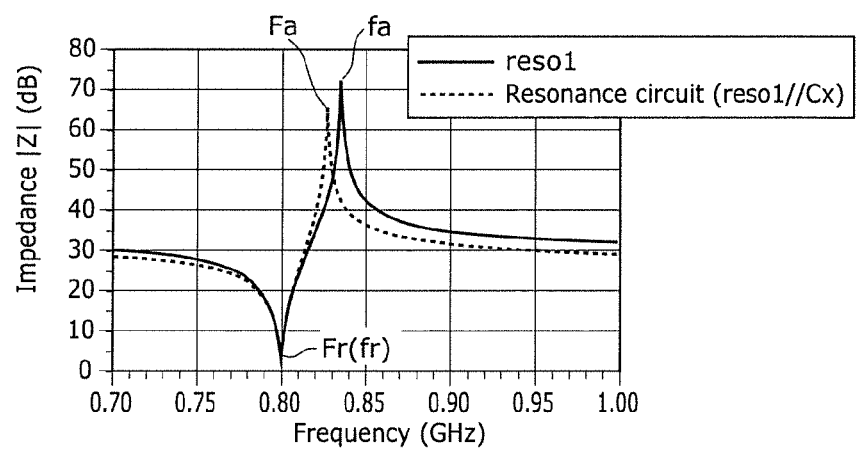

Part (a) of FIG. 3 is an equivalent circuit diagram of a resonance circuit constituted by acoustic wave resonator reso1 and capacitor Cx connected in parallel, and (b) of FIG. 3 illustrates a graph showing impedance characteristics of reso1 and the circuit. As illustrated in (a) of FIG. 3, acoustic wave resonator reso1 can be represented by a parallel circuit (parallel connection circuit) in which capacitor $C_0$ is connected in parallel to a series circuit (series connection circuit) constituted by capacitor $C_1$ and inductor $L_1$ connected in series. Here, capacitor $C_0$ has electrostatic capacitance of acoustic wave resonator reso1. Note that this equivalent circuit is expressed using an ideal element for which resistance of acoustic wave resonator reso1 and capacitor Cx are not taken into consideration.

In the above equivalent circuit, resonant frequency fr of acoustic wave resonator reso1 is determined by the series circuit of capacitor $C_1$ and inductor $L_1$, and is a frequency at which impedance of the series circuit is 0. Thus, resonant frequency fr is represented by Expression 1.

[Math 1]

$$f_r = \frac{1}{2\pi\sqrt{L_1 C_1}} \quad \text{(Expression 1)}$$

Antiresonant frequency fa of acoustic wave resonator reso1 is a frequency at which admittance Y of the parallel circuit is 0, and thus can be represented by Expression 2.

[Math 2]

$$f_a = \frac{\sqrt{1 + \frac{C_1}{C_0}}}{2\pi\sqrt{L_1 C_1}} = f_r \sqrt{1 + \frac{C_1}{C_0}} \quad \text{(Expression 2)}$$

In the above equivalent circuit, resonant frequency Fr of the resonance circuit is a frequency at which impedance of the series circuit of capacitor $C_1$ and inductor $L_1$ is 0, and is the same as resonant frequency fr of acoustic wave resonator reso1. Thus, resonant frequency Fr is represented by Expression 3.

[Math 3]

$$F_r = \frac{1}{2\pi\sqrt{L_1 C_1}} \quad \text{(Expression 3)}$$

Antiresonant frequency Fa of the resonance circuit is a frequency at which admittance Y of the equivalent circuit is 0, and thus is represented by replacing $C_0$ in Expression 2 with ($C_0+Cx$).

[Math 4]

$$F_a = \frac{\sqrt{1 + \frac{C_1}{C_0 + Cx}}}{2\pi\sqrt{L_1 C_1}} = f_r \sqrt{1 + \frac{C_1}{C_0 + Cx}} \quad \text{(Expression 4)}$$

As shown by Expressions 1 to 4 above and (b) of FIG. 3, resonant frequency fr of acoustic wave resonator reso1 and resonant frequency Fr of the resonance circuit (reso1//Cx) are the same, and antiresonant frequency Fa of the resonance circuit (reso1//Cx) has shifted to a frequency lower than antiresonant frequency fa of acoustic wave resonator reso1.

Also in filter device 10A according to Example 1, as illustrated in (a) of FIG. 1B, resonant frequency Frs1 of series-arm circuit 11s is the same as resonant frequency frs1 of series-arm resonator s1. On the other hand, antiresonant frequency Fas1 of series-arm circuit 11s has shifted to a frequency lower than antiresonant frequency fas1 of series-arm resonator s1. Accordingly, in filter device 10A according to Example 1, as illustrated in (b) and (c) of FIG. 1B, a narrow-band filter is achieved while ensuring the steepness of a skirt on the passband high-frequency side.

Figure 2:
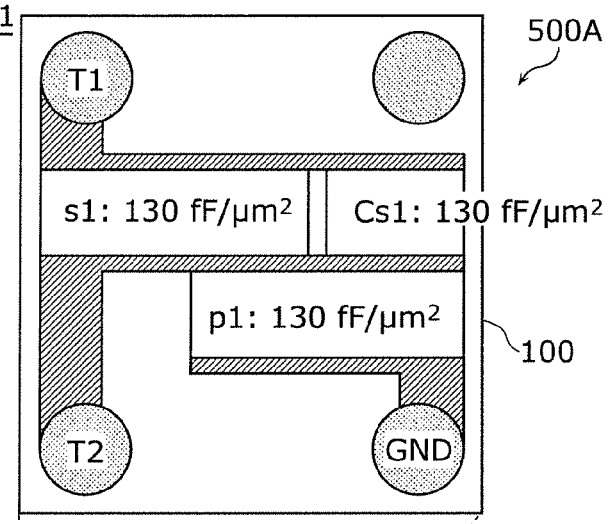
FIG. 2 illustrates a comparison of the sizes of the filter device according to Example 1 and a filter device according to Comparative Example 1.
Figure 2:
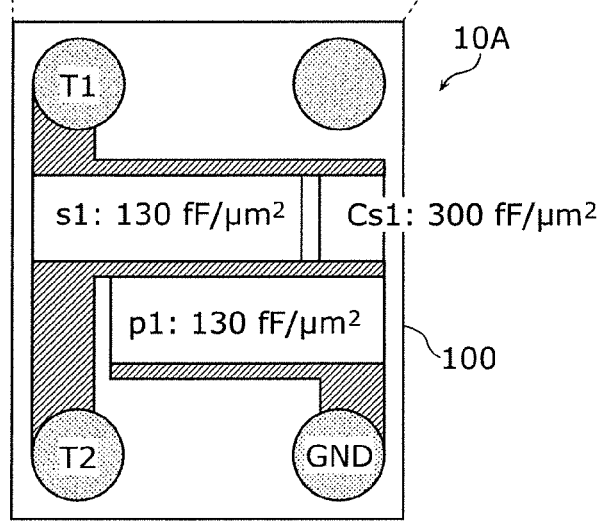

FIG. 2 illustrates a comparison of the sizes of filter device 10A according to Example 1 and filter device 500A according to Comparative Example 1. Part (a) of FIG. 2 illustrates the layout of circuit elements on substrate 100 of filter device 500A according to Comparative Example 1, whereas (b) of FIG. 2 illustrates the layout of circuit elements on substrate 100 of filter device 10A according to Example 1.

Here, filter device 500A according to Comparative Example 1 has the same circuit configuration as the circuit connection configuration of filter device 10A according to Example 1 illustrated in FIG. 1A, and is different from filter device 10A only in that electrostatic capacitance density Cz (s1) and electrostatic capacitance density Cz (Cs1) are the same. Thus, impedance characteristics and passing characteristics of filter device 500A according to Comparative Example 1 in and near the passband are the same as impedance characteristics and passing characteristics of filter device 10A according to Example 1 illustrated in FIG. 1B.

As illustrated in Table 1, electrostatic capacitance density Cz (Cs1) of filter device 500A according to Comparative Example 1 is 130 fF/μm$^2$, and electrostatic capacitance density Cz (Cs1) of filter device 10A according to Example 1 is 300 fF/μm$^2$. Furthermore, capacitance of capacitor Cs1 of filter device 500A and capacitance of capacitor Cs1 of filter device 10A are both 0.5 pF. Accordingly, as illustrated in FIG. 2, the area for forming capacitor Cs1 of filter device 10A according to Example 1 is smaller than the area for forming capacitor Cs1 of filter device 500A according to Comparative Example 1. Series-arm resonator s1 and parallel-arm resonator p1 that are circuit elements other than capacitor Cs1 have the same circuit parameter and the same size, and thus filter device 10A according to Example 1 has a smaller size than the size of filter device 500A according to Comparative Example 1.

According to the above configuration, capacitor Cs1 contributes to decreasing a difference between antiresonant frequency Fas1 and resonant frequency Frs1 of series-arm circuit 11s. Here, electrostatic capacitance density Cz (Cs1) of capacitor Cs1 is higher than electrostatic capacitance density Cz (s1) of series-arm resonator s1, and thus capacitor Cs1 can be miniaturized. Furthermore, since capacitor Cs1 is small, a line that connects series-arm resonator s1 and capacitor Cs1 can be shortened. Accordingly, filter device 10A can be miniaturized while maintaining filter characteristics determined by the difference between frequencies. For example, series-arm circuit 11s can be made smaller than a resonance circuit that decreases the above frequency difference by adjusting a structure of an acoustic wave resonator using, for instance, a Ksaw adjustment film that adjusts an electromechanical coupling factor (hereinafter denoted by Ksaw) and is formed between a piezoelectric component and an interdigital transducer (IDT) electrode.

[1.2 Filter Device According to Example 2]

Figure 4A:
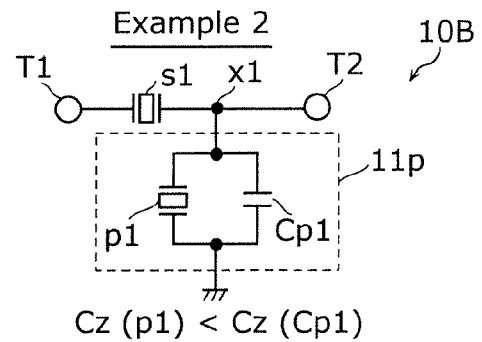
FIG. 4A illustrates a circuit configuration of a filter device according to Example 2.

FIG. 4A illustrates a circuit configuration of filter device 10B according to Example 2. Filter device 10B illustrated in FIG. 4A includes parallel-arm circuit 11p, series-arm resonator s1, and input/output terminals T1 and T2.

In this example, series-arm resonator s1 is a second acoustic wave resonator connected to a path that connects input/output terminals T1 and T2, and is included in a series-arm circuit.

Parallel-arm circuit 11p is connected to the ground and node x1 on the path, and includes parallel-arm resonator p1 and capacitor Cp1. Parallel-arm circuit 11p is a resonance circuit that includes parallel-arm resonator p1 and capacitor Cp1. Parallel-arm resonator p1 is a first acoustic wave resonator connected in parallel to capacitor Cp1. Capacitor Cp1 is a first capacitor connected in parallel to parallel-arm resonator p1, and has electrostatic capacitance per unit area (Cz (Cp1): which may be referred to as electrostatic capacitance density Cz (Cp1) in the following) greater than electrostatic capacitance per unit area of parallel-arm resonator p1 (Cz (p1): which may be referred to as electrostatic capacitance density Cz (p1) in the following).

Table 2 shows circuit parameters of filter device 10B according to Example 2, and circuit parameters of filter device 500B according to Comparative Example 2.

than resonant frequency Frp1, impedance of the parallel-arm circuit is high at antiresonant frequency Fap1, and impedance of series-arm resonator s1 is substantially 0 at and near resonant frequency frs1. Accordingly, a signal pass band on a signal path from input/output terminal T1 to input/output terminal T2 is formed at and near antiresonant frequency Fap1 and resonant frequency frs1. If a frequency is further increased, and approaches and reaches antiresonant frequency fas1 of series-arm resonator s1, impedance of series-arm resonator s1 increases, and a high-frequency stopband is formed. Specifically, filter device 10B is a bandpass filter in which a passband is determined by antiresonant frequency Fap1 and resonant frequency frs1, a pole (attenuation pole) on the passband low-frequency side is determined by resonant frequency Frp1, and a pole (attenuation pole) on the passband high-frequency side is determined by antiresonant frequency fas1.

In filter device 10B according to Example 2, parallel-arm circuit 11p includes a resonance circuit constituted by parallel-arm resonator p1 and capacitor Cp1 connected in parallel, and thus a filter having a narrow band is achieved while ensuring the steepness of a skirt on the passband low-frequency side.

Figure 4B:
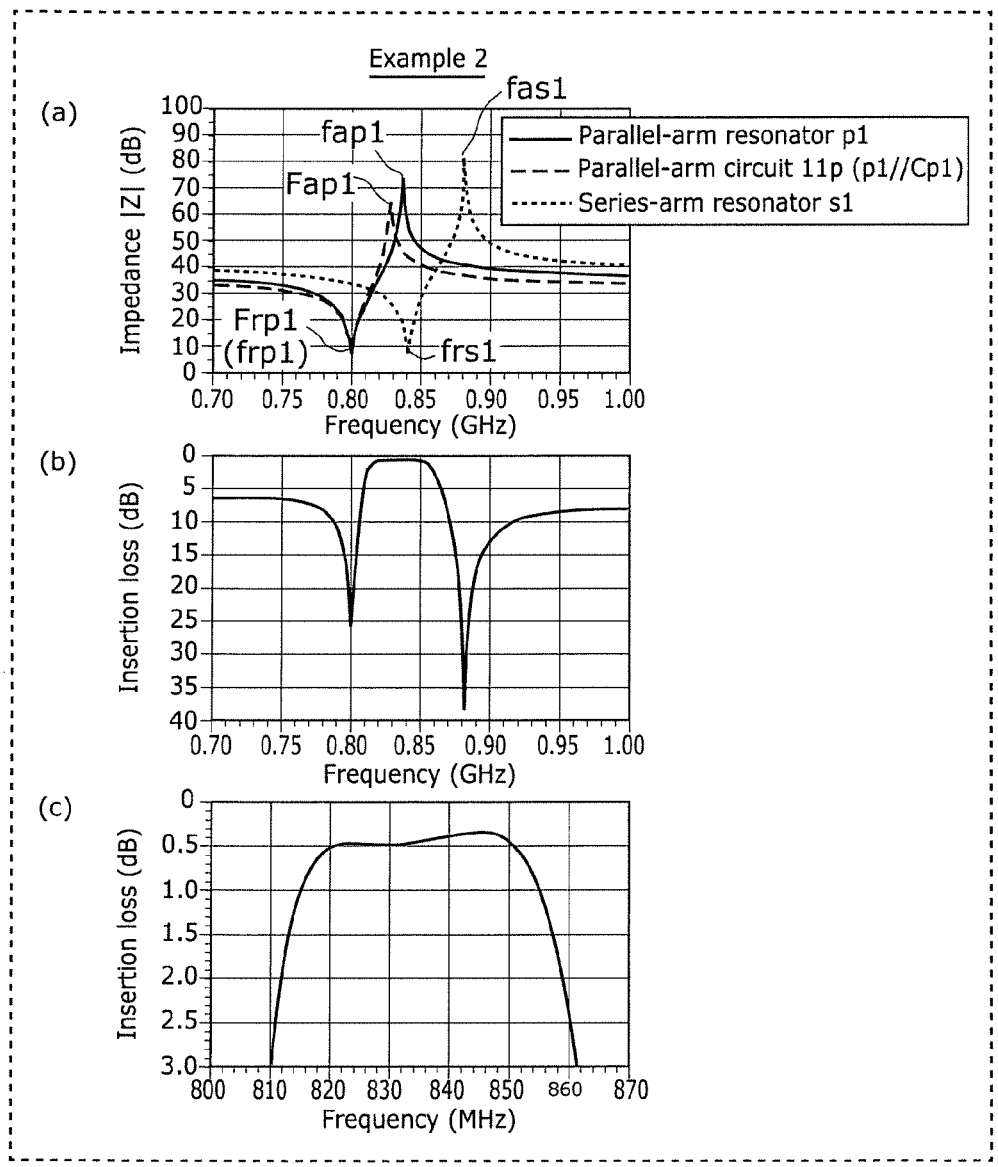
FIG. 4B illustrates graphs showing impedance characteristics and passing characteristics of the filter device according to Example 2.

Here, a detailed description of basic resonance operation of parallel-arm circuit 11p is omitted, yet in filter device 10B according to Example 2, resonant frequency Frp1 of parallel-arm circuit 11p is the same as resonant frequency frp1 of parallel-arm resonator p1, as illustrated in (a) of FIG. 4B. On the other hand, antiresonant frequency Fap1 of parallel-arm circuit 11p has shifted to a lower frequency than antiresonant frequency fap1 of parallel-arm resonator p1. Accordingly, in filter device 10B according to Example 2, as illustrated in (b) and (c) of FIG. 4B, a narrow-band filter is achieved while ensuring the steepness of a skirt on the passband low-frequency side.

TABLE 2

|  |  |  | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Comp. Ex. 2 | P-arm ckt | p1 | 800 | 836 | 4.50 | 3.00 | 130.00 | 23077 |
|  |  | Cp1 |  |  |  | 1.00 | 130.00 | 7692 |
|  | S-arm ckt | s1 | 800 840 | 827 881 | 3.38 4.88 | 4.00 2.00 | 130.00 | 30769 15385 |
|  | Filt. device 500B |  |  |  |  |  |  | 46154 |
| Ex. 2 | P-arm ckt 11p | p1 | 800 | 836 | 4.50 | 3.00 | 130.00 | 23077 |
|  |  | Cp1 |  |  |  | 1.00 | 300.00 | 3333 |
|  | S-arm ckt | s1 | 800 840 | 827 881 | 3.38 4.88 | 4.00 2.00 | 130.00 | 26410 15385 |
|  | Filt. device 10B |  |  |  |  |  |  | 41795 |

FIG. 4B illustrates graphs showing impedance characteristics of the resonators and the circuit included in filter device 10B according to Example 2, and passing characteristics of filter device 10B according to Example 2. As illustrated in (a) and (b) of FIG. 4B, in filter device 10B, when parallel-arm circuit 11p and series-arm resonator s1 are to form a bandpass filter, antiresonant frequency Fap1 of parallel-arm circuit 11p and resonant frequency frs1 of series-arm resonator s1 are set to values close to each other. Frequencies at and near resonant frequency Frp1 at which impedance of parallel-arm circuit 11p is substantially 0 form a lower-frequency stopband. In a frequency range higher Here, the sizes of filter device 10B according to Example 2 and filter device 500B according to Comparative Example 2 are to be compared. Filter device 500B according to Comparative Example 2 has the same circuit configuration as the circuit connection configuration of filter device 10B according to Example 2 illustrated in FIG. 4A, and is different from filter device 10B only in that electrostatic capacitance density Cz (p1) and electrostatic capacitance density Cz (Cp1) are the same. Thus, impedance characteristics and passing characteristics of filter device 500B according to Comparative Example 2 in and near the passband are the same as impedance characteristics and passing characteristics of filter device 10B according to Example 2 illustrated in FIG. 4B.

As illustrated in Table 2, electrostatic capacitance density Cz (Cp1) of filter device 500B according to Comparative Example 2 is 130 fF/μm$^2$, and electrostatic capacitance density Cz (Cp1) of filter device 10B according to Example 1 is 300 fF/μm$^2$. Furthermore, capacitance of capacitor Cp1 of filter device 500B and capacitance of capacitor Cp1 of filter device 10B are both 1.0 pF. Thus, the area for forming capacitor Cp1 of filter device 10B according to Example 2 is smaller than the area for forming capacitor Cp1 of filter device 500B according to Comparative Example 2. Series-arm resonator s1 and parallel-arm resonator p1 that are circuit elements other than capacitor Cp1 have the same circuit parameter and the same size, and thus filter device 10B according to Example 2 has a smaller size than the size of filter device 500B according to Comparative Example 2.

According to the above configuration, capacitor Cp1 contributes to decreasing a difference between antiresonant frequency Fap1 and resonant frequency Frp1 of parallel-arm circuit 11p. Here, electrostatic capacitance density Cz (Cp1) of capacitor Cp1 is higher than electrostatic capacitance density Cz (p1) of parallel-arm resonator p1, and thus capacitor Cp1 can be miniaturized. Furthermore, a line that connects parallel-arm resonator p1 and capacitor Cp1 can be shortened by miniaturizing capacitor Cp1. Accordingly, filter device 10B can be miniaturized while maintaining filter characteristics determined by the above frequency difference. For example, parallel-arm circuit 11p can be made smaller than a resonance circuit that decreases the above frequency difference by adjusting the structure of an acoustic wave resonator using, for instance, a Ksaw adjustment film, for instance, formed between a piezoelectric component and an IDT electrode.

[1.3 Filter Device According to Example 3]

Figure 5A:
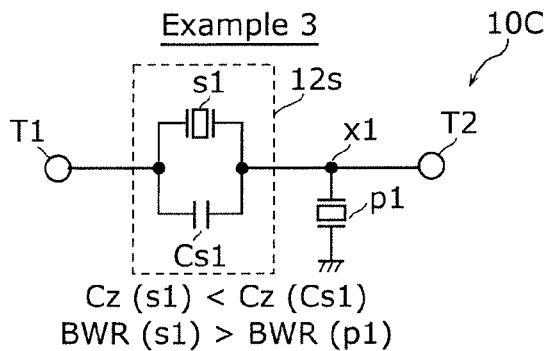
FIG. 5A illustrates a circuit configuration of a filter device according to Example 3.

FIG. 5A illustrates a circuit configuration of filter device 10C according to Example 3. Filter device 10C illustrated in FIG. 5A includes series-arm circuit 12s, parallel-arm resonator p1, and input/output terminals T1 and T2.

Filter device 10C according to Example 3 is different from filter device 10A according to Example 1 in that the fractional bandwidth of series-arm resonator s1 is greater than the fractional band width of parallel-arm resonator p1. In the following, description of common points of filter device 10C according to Example 3 to those of filter device 10A according to Example 1 is omitted, and different points are mainly described.

In this example, series-arm circuit 12s is connected to a path that connects input/output terminals T1 and T2, and includes series-arm resonator s1 and capacitor Cs1. Series-arm circuit 12s is a resonance circuit that includes series-arm resonator s1 and capacitor Cs1. Series-arm resonator s1 is a first acoustic wave resonator connected in parallel to capacitor Cs1, and capacitor Cs1 is a first capacitor connected in parallel to series-arm resonator s1. Parallel-arm resonator p1 is a second acoustic wave resonator not connected in parallel to a capacitor. Here, electrostatic capacitance density Cz (Cs1) of capacitor Cs1 is higher than electrostatic capacitance density Cz (Cs1) of series-arm resonator s1, and the fractional bandwidth of series-arm resonator s1 (which may be denoted by BWR (s1) in the following) is greater than the fractional bandwidth of parallel-arm resonator p1 (which may be denoted by BWR (p1) in the following). Note that regarding the fractional bandwidths, a value obtained by dividing a difference between the antiresonant frequency of an acoustic wave resonator and the resonant frequency of the acoustic wave resonator by the resonant frequency of the acoustic wave resonator is defined as the fractional bandwidth of the acoustic wave resonator.

Table 3 shows circuit parameters of filter device 10A according to Example 1, and circuit parameters of filter device 10C according to Example 3.

TABLE 3

| | | | Reso. freq. fr (MHz) | A-reso. freq. fa (MHz) | Fract. BW BWR (%) | ES cap. (PF) | ES cap. dens. Cz (fF/μm$^2$) | Size (μm$^2$) |
|---|---|---|---|---|---|---|---|---|
| Ex. 1 | S-arm ckt | s1 | 840 | 881 | 4.88 | 1.50 | 130.00 | 11538 |
| | 11s | Cs1 | | | | 0.50 | 300.00 | 1667 |
| | | | 840 | 871 | 3.69 | 2.00 | | 13205 |
| | P-arm ckt | p1 | 800 | 836 | 4.50 | 4.00 | 130.00 | 30769 |
| | Filt. device 10A | | | | | | | 43974 |
| Ex. 3 | S-arm ckt | s1 | 840 | 906 | 7.86 | 0.90 | 130.00 | 6923 |
| | 12s | Cs1 | | | | 1.10 | 300.00 | 3667 |
| | | | 840 | 871 | 3.69 | 2.00 | | 10590 |
| | P-arm ckt | p1 | 800 | 836 | 4.50 | 4.00 | 130.00 | 30769 |
| | Filt. device 10C | | | | | | | 41359 |

Figure 5B:
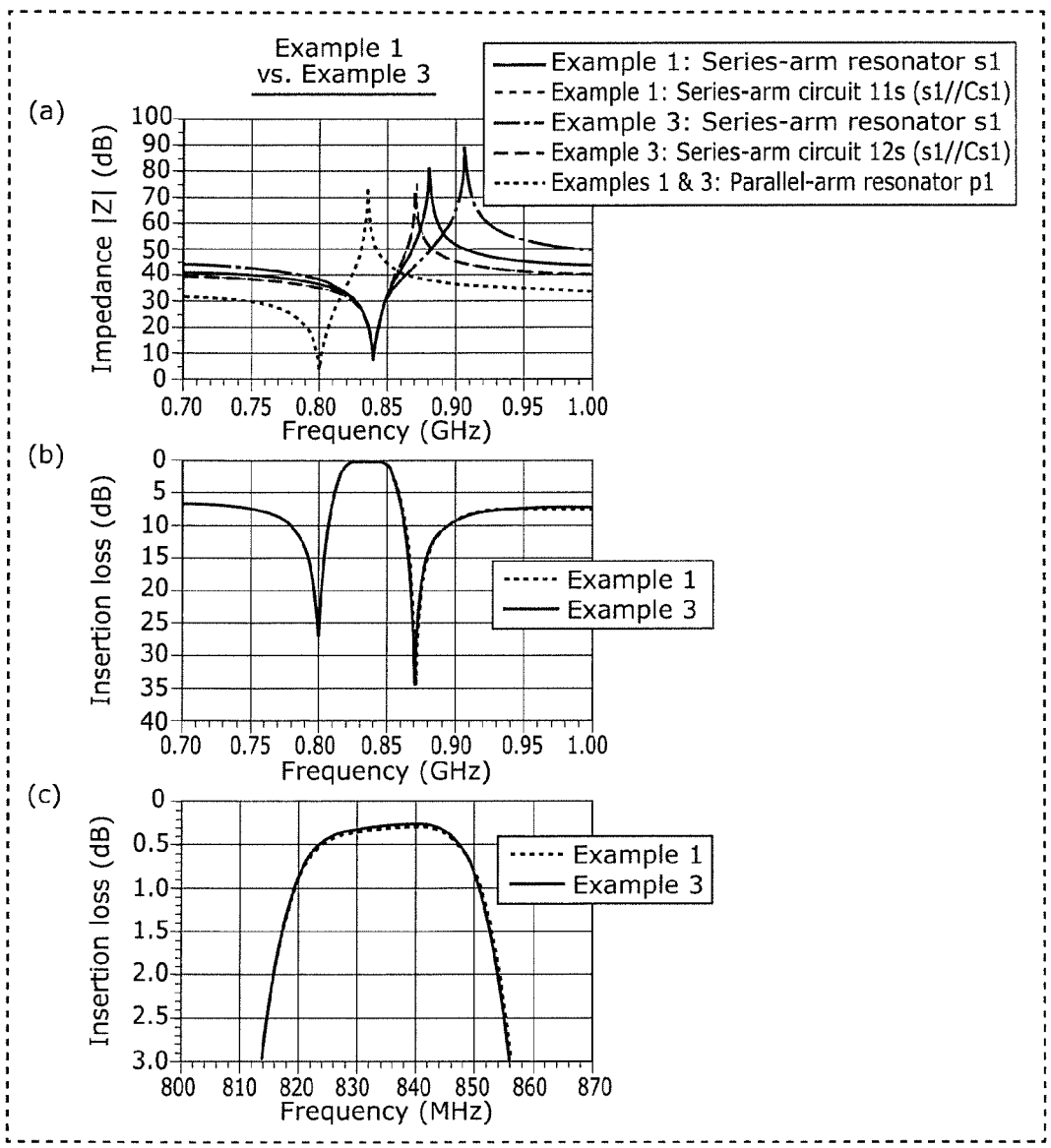
FIG. 5B illustrates graphs showing comparisons of impedance characteristics and passing characteristics of the filter devices according to Examples 1 and 3.

FIG. 5B illustrates graphs showing comparisons of impedance characteristics of the resonators and the circuits included in filter device 10A according to Example 1 and filter device 10C according to Example 3, and passing characteristics of filter device 10A according to Example 1 and filter device 10C according to Example 3. As illustrated in Table 3, electrostatic capacitance of series-arm resonator s1 of filter device 10A is 1.50 pF and electrostatic capacitance of capacitor Cs1 of filter device 10A is 0.50 pF, and thus electrostatic capacitance of series-arm circuit 11s of filter device 10A is 2.0 pF. On the other hand, electrostatic capacitance of series-arm resonator s1 of filter device 10C is 0.90 pF, and electrostatic capacitance of capacitor Cs1 of filter device 10C is 1.10 pF, and thus electrostatic capacitance of series-arm circuit 12s of filter device 10C is also 2.0 pF. Further, series-arm circuits 11s and 12s have same resonant frequency Frs1 and same antiresonant frequency Fas1, and thus also have same fractional bandwidth BWR.

Accordingly, as illustrated in (a) of FIG. 5B, series-arm circuits 11s and 12s have substantially the same impedance characteristics.

As described above, even if series-arm circuits 11s and 12s have substantially the same impedance characteristics, in Example 3, fractional bandwidth BWR (s1) of series-arm resonator s1 is greater than fractional bandwidth BWR (p1) of parallel-arm resonator p1. Thus, electrostatic capacitance of capacitor Cs1 for decreasing fractional bandwidth BWR (s1//Cs1) of series-arm circuit 12s can be increased, and electrostatic capacitance of series-arm resonator s1 can be decreased. The proportion of the area occupied, within series-arm circuit 12s, by capacitor Cs1 having electrostatic capacitance density Cz (Cs1) higher than electrostatic capacitance density Cz (s1) increases with an increase in electrostatic capacitance of capacitor Cs1 and a decrease in electrostatic capacitance of series-arm resonator s1. Accordingly, series-arm circuit 12s can be more effectively miniaturized. Accordingly, filter device 10C can be effectively miniaturized.

Figure 5C:
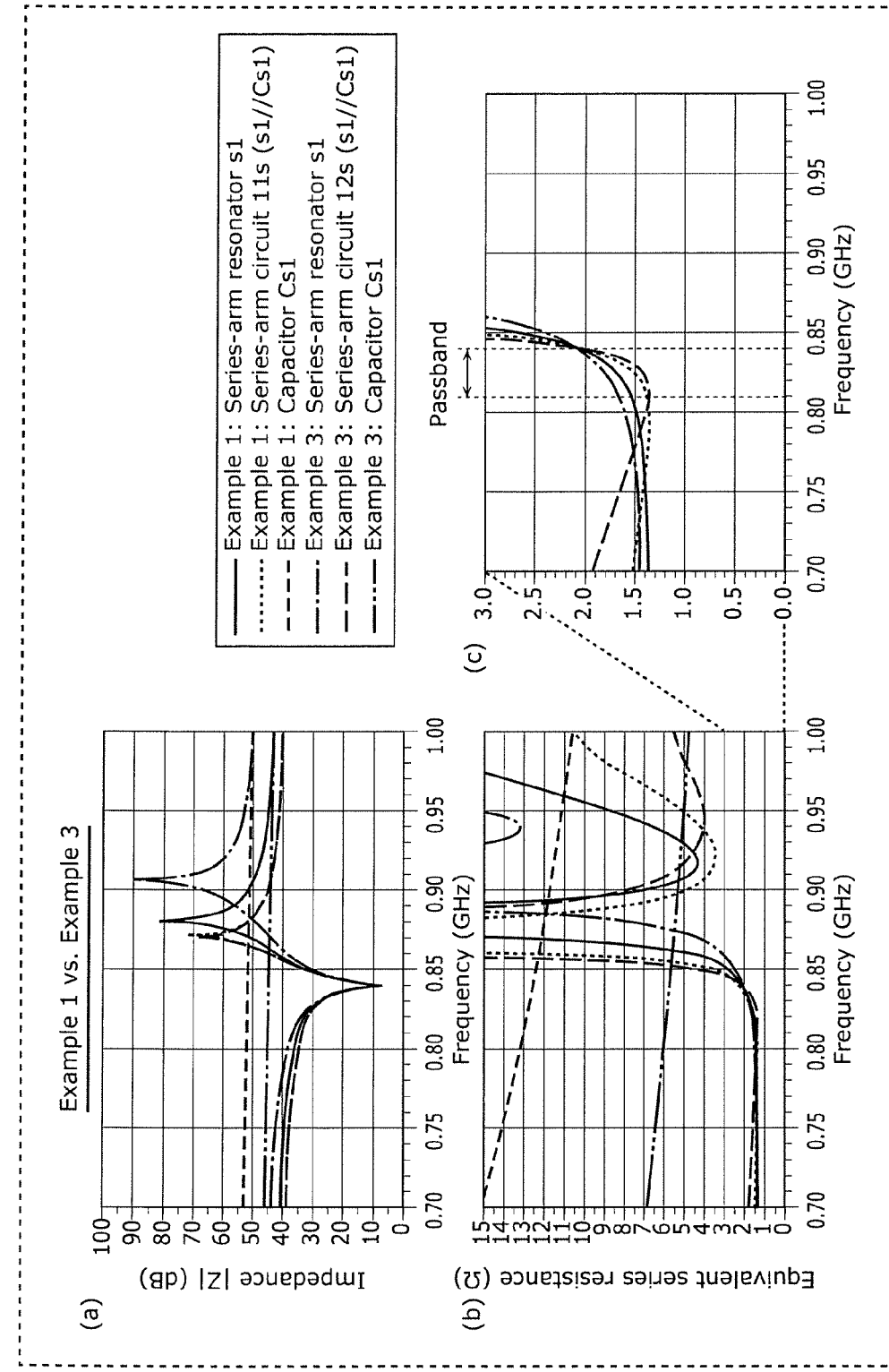
FIG. 5C illustrates comparisons of impedance characteristics and equivalent series resistance of the filter devices according to Examples 1 and 3.

FIG. 5C illustrates graphs showing comparisons of impedance characteristics and equivalent series resistance of the resonators and the circuits included in filter device 10A according to Example 1 and filter device 10C according to Example 3. As illustrated in (b) and (c) of FIG. 5C, in a frequency range lower than resonant frequency frs1, series-arm resonator s1 having small electrostatic capacitance (high impedance) has great equivalent series resistance, yet capacitor Cs1 having great electrostatic capacitance (low impedance) has low equivalent series resistance. Accordingly, in Example 3, the proportion of capacitor Cs1 in series-arm circuit 12s is increased, and thus equivalent series resistance of series-arm circuit 12s in the passband of filter device 10C is decreased and a resonance Q factor improves, insertion loss decreases as illustrated in (c) of FIG. 5B. Accordingly, insertion loss in the passband decreases, and furthermore the filter device can be further miniaturized.

[1.4 Filter Device According to Example 4]

Figure 6A:
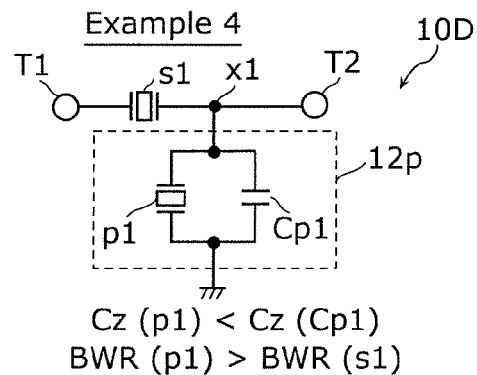
FIG. 6A illustrates a circuit configuration of a filter device according to Example 4.

FIG. 6A illustrates a circuit configuration of filter device 10D according to Example 4. Filter device 10D illustrated in FIG. 6A includes parallel-arm circuit 12p, series-arm resonator s1, and input/output terminals T1 and T2.

Filter device 10D according to Example 4 is different from filter device 10B according to Example 2 in that the fractional bandwidth of parallel-arm resonator p1 is greater than the fractional bandwidth of series-arm resonator s1. In the following, description of common points of filter device 10D according to Example 4 to those of filter device 10B according to Example 2 is omitted, and different points are mainly described.

In this example, series-arm resonator s1 is a second acoustic wave resonator connected to a path that connects input/output terminals T1 and T2, and included in a series-arm circuit.

Parallel-arm circuit 12p is connected to the ground and node x1 on the path, and includes parallel-arm resonator p1 and capacitor Cp1. Parallel-arm circuit 12p is a resonance circuit that includes parallel-arm resonator p1 and capacitor Cp1. Parallel-arm resonator p1 is a first acoustic wave resonator connected in parallel to capacitor Cp1, and capacitor Cp1 is a first capacitor connected in parallel to parallel-arm resonator p1. Capacitor Cp1 is connected in parallel to parallel-arm resonator p1, electrostatic capacitance density Cz (Cp1) of capacitor Cp1 is higher than electrostatic capacitance density Cz (p1) of parallel-arm resonator p1, and fractional bandwidth BWR (p1) of parallel-arm resonator p1 is greater than fractional bandwidth BWR (s1) of series-arm resonator s1.

Table 4 shows circuit parameters of filter device 10B according to Example 2, and circuit parameters of filter device 10D according to Example 4.

TABLE 4

|   |   |   | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Ex. 2 | P-arm ckt | p1 | 800 | 836 | 4.50 | 3.00 | 130.00 | 23077 |
|   | 11p | Cp1 |   |   |   | 1.00 | 300.00 | 3333 |
|   | S-arm ckt | s1 | 800 | 827 | 3.38 | 4.00 | 130.00 | 26410 |
|   |   |   | 840 | 881 | 4.88 | 2.00 |   | 15385 |
|   | Filt. device 10B |   |   |   |   |   |   | 41795 |
| Ex. 4 | P-arm ckt | p1 | 800 | 860 | 7.50 | 1.75 | 130.00 | 13462 |
|   | 12p | Cp1 |   |   |   | 2.25 | 300.00 | 7500 |
|   | S-arm ckt | s1 | 800 | 827 | 3.38 | 4.00 | 130.00 | 20962 |
|   |   |   | 840 | 881 | 4.88 | 2.00 |   | 15385 |
|   | Filt. device 10D |   |   |   |   |   |   | 36347 |

Figure 6B:
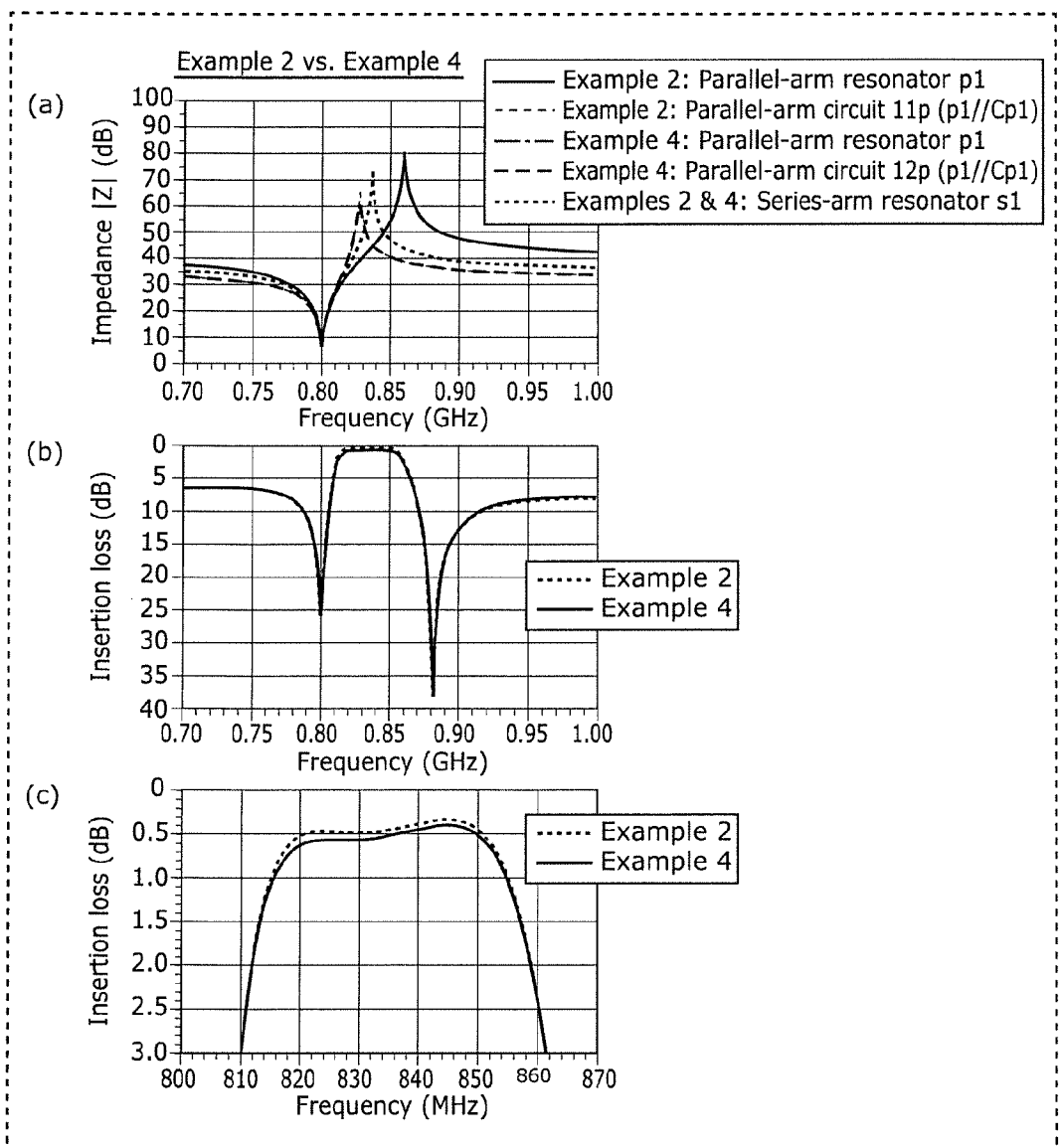
FIG. 6B illustrates graphs showing comparisons of impedance characteristics and passing characteristics of the filter devices according to Examples 2 and 4.

FIG. 6B illustrates graphs showing impedance characteristics of the resonators and the circuits included in filter device 10B according to Example 2 and filter device 10D according to Example 4, and passing characteristics of filter device 10B according to Example 2 and filter device 10D according to Example 4. As shown in Table 4, electrostatic capacitance of parallel-arm resonator p1 of filter device 10B is 3.00 pF and electrostatic capacitance of capacitor Cp1 of filter device 10B is 1.00 pF, and thus electrostatic capacitance of parallel-arm circuit 11p of filter device 10B is 4.0 pF. On the other hand, electrostatic capacitance of parallel-arm resonator p1 of filter device 10D is 1.75 pF and electrostatic capacitance of capacitor Cp1 of filter device 10D is 2.25 pF, and thus electrostatic capacitance of parallel-arm circuit 12p of filter device 10D is also 4.0 pF. Parallel-arm circuits 11p and 12p have same resonant frequency Frp1 and same antiresonant frequency Fap1, and thus also have same fractional bandwidth BWR. Accordingly, as illustrated in (a) of FIG. 6B, impedance characteristics of parallel-arm circuits 11p and 12p are substantially the same.

As described above, even if parallel-arm circuits 11p and 12p have substantially the same impedance characteristics, fractional bandwidth BWR (p1) of parallel-arm resonator p1 is greater than fractional bandwidth BWR (s1) of series-arm resonator s1 in Example 4, and thus electrostatic capacitance of capacitor Cp1 for decreasing fractional bandwidth BWR (p1//Cp1) of parallel-arm circuit 12p can be increased, and electrostatic capacitance of parallel-arm resonator p1 can be decreased. The proportion of the area occupied, within parallel-arm circuit 12p, by capacitor Cp1 having electrostatic capacitance density Cz (Cp1) higher than electrostatic capacitance density Cz (p1) increases with an increase in electrostatic capacitance of capacitor Cp1 and a decrease in electrostatic capacitance of parallel-arm resonator p1. Accordingly, parallel-arm circuit 12p can be more effectively miniaturized. Thus, the filter device can be effectively miniaturized.

Figure 6C:
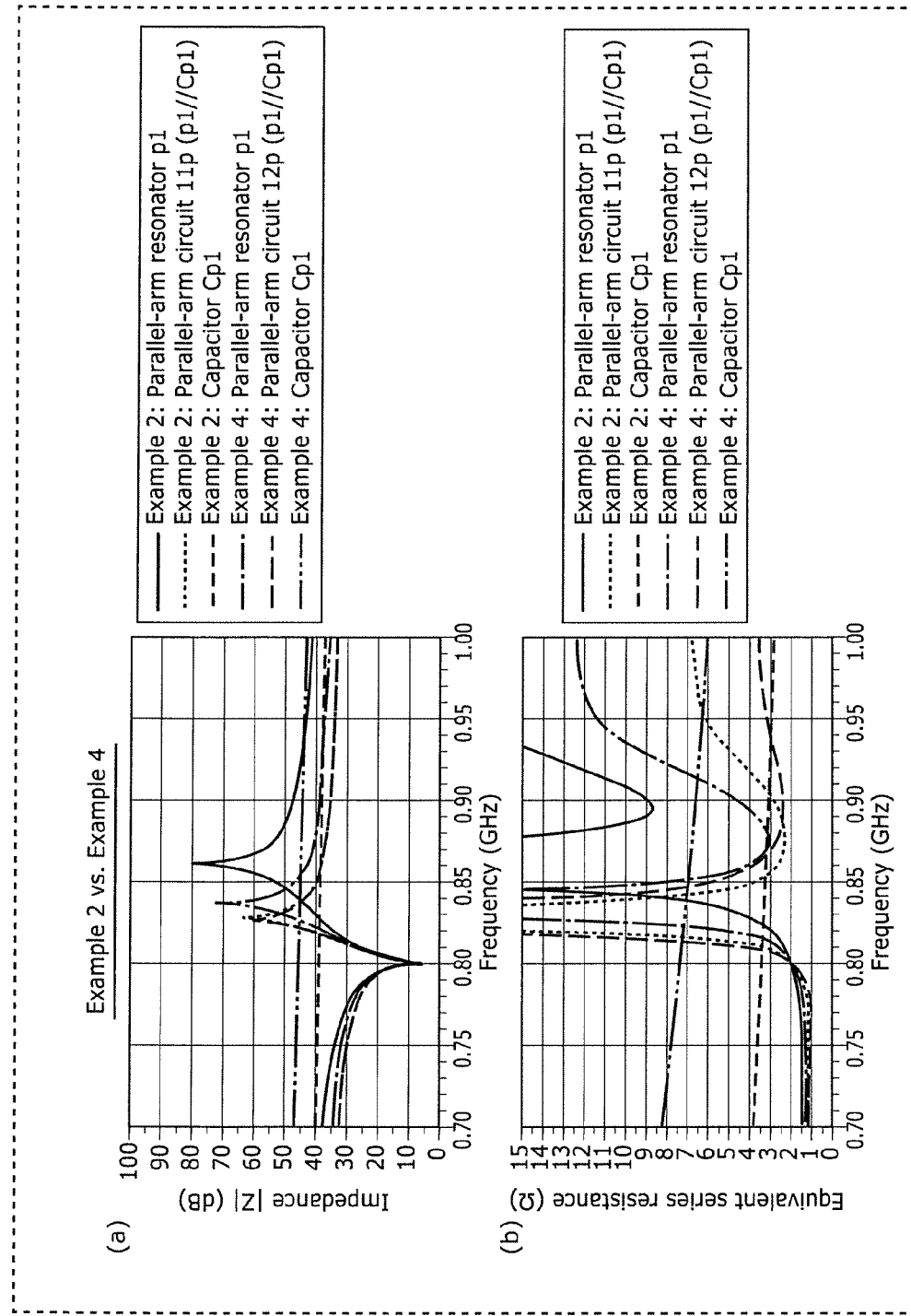
FIG. 6C illustrates comparisons of impedance characteristics and equivalent series resistance of the filter devices according to Examples 2 and 4.

FIG. 6C illustrates graphs showing comparisons of impedance characteristics and equivalent series resistance of the resonators and the circuits included in filter device 10B according to Example 2 and filter device 10D according to Example 4. As illustrated in (b) of FIG. 6C, capacitor Cp1 having great electrostatic capacitance (low impedance) has great equivalent series resistance in a frequency range higher than resonant frequency frs1. Accordingly, the proportion of capacitor Cp1 in parallel-arm circuit 12p increases in Example 4. Thus, resistance of parallel-arm circuit 12p increases in the passband of filter device 10D, and an antiresonance Q factor decreases, and as illustrated in (c) of FIG. 6B, filter device 10D has slightly greater insertion loss than that of filter device 10B according to Example 2, but can be further made smaller than filter device 10B.

[1.5 Adjustment of Fractional Bandwidth]

A method of adjusting the above fractional bandwidths of series-arm resonator s1 and parallel-arm resonator p1 is to be described.

Series-arm resonator s1 and parallel-arm resonator p1 described above are acoustic wave resonators that use acoustic waves, for example. Accordingly, filter devices 10A to 10D can be formed by an IDT electrode formed on piezoelectric substrate 102, and thus a filter circuit having a small size, a low height, and passing characteristics according to which a skirt is highly steep can be achieved.

Series-arm resonator s1 and parallel-arm resonator p1 each include an IDT electrode, a set of reflectors, and substrate 102.

Figure 7A:
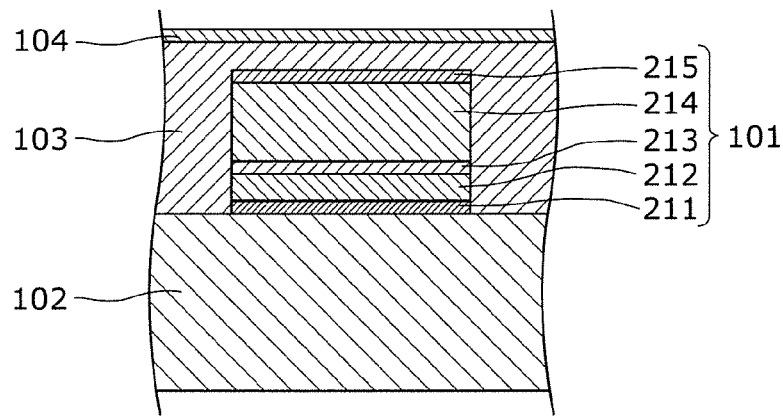
FIG. 7A is a cross-sectional view illustrating a first example of an electrode film that includes electrode fingers of an interdigital transducer (IDT) electrode in a series-arm resonator/a parallel-arm resonator in Embodiment 1, and the surrounding structure.

FIG. 7A is a cross-sectional view illustrating a first example of electrode film 101 that includes electrode fingers of the IDT electrode in series-arm resonator s1/parallel-arm resonator p1 in Embodiment 1, and a surrounding structure.

As illustrated in FIG. 7A, in the present embodiment, electrode film 101 is formed by stacking metal film 211 made of NiCr, metal film 212 made of Pt, metal film 213 made of Ti, metal film 214 made of AlCu, and metal film 215 made of Ti on piezoelectric substrate 102 in the stated order.

At this time, piezoelectric substrate 102 is made of a $LiNbO_3$ piezoelectric monocrystal, for example. Note that substrate 102 may be at least a partially piezoelectric substrate. For example, substrate 102 may include a piezoelectric thin film (piezoelectric component) on the surface, and a stack of a film having an acoustic velocity different from that of the piezoelectric thin film and a support substrate, for instance. Substrate 102 may be entirely piezoelectric. In this case, substrate 102 is a piezoelectric substrate made of a single layer made of a piezoelectric component.

Electrode film 101 may be covered with a second adjustment film that protects electrode film 101 from the outside environment and furthermore, adjusts the electromechanical coupling factors of series-arm resonator s1 and parallel-arm resonator p1, and the fractional bandwidths of series-arm resonator s1 and parallel-arm resonator p1 can be adjusted according to the thickness of the second adjustment film. The second adjustment film is formed by stacking protective layer 103 made of $SiO_2$, and protective layer 104 made of SiN on substrate 102 in the stated order in the present embodiment. Furthermore, the second adjustment film also has functions of adjusting frequency temperature characteristics and improving moisture resistant properties, for instance.

Figure 7B:
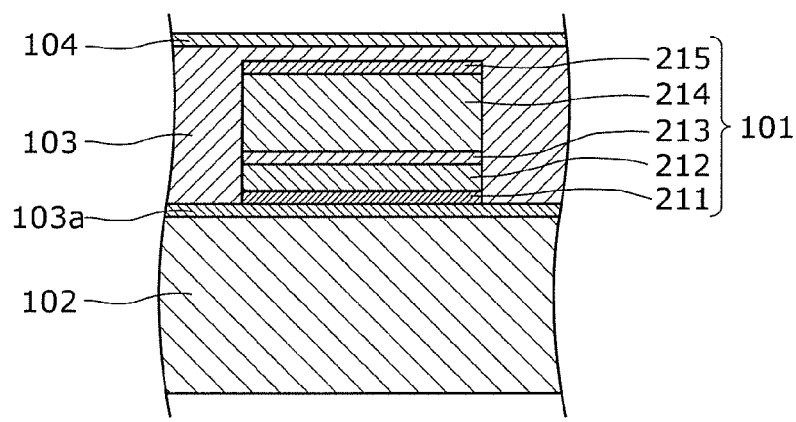
FIG. 7B is a cross-sectional view illustrating a second example of an electrode film that includes electrode fingers of an IDT electrode in a series-arm resonator/a parallel-arm resonator in Embodiment 1, and the surrounding structure.

FIG. 7B is a cross-sectional view illustrating a second example of electrode film 101 that includes electrode fingers of the IDT electrode in series-arm resonator s1/parallel-arm resonator p1 in Embodiment 1, and the surrounding structure. As illustrated in FIG. 7B, first adjustment film 103a that adjusts the electromechanical coupling factors of series-arm resonator s1 and parallel-arm resonator p1 may be disposed between electrode film 101 and substrate 102, and the fractional bandwidths of series-arm resonator s1 and parallel-arm resonator p1 can be adjusted according to the thickness of the first adjustment film. First adjustment film 103a is made of $SiO_2$, for example.

In the electrode finger structures illustrated in FIGS. 7A and 7B, the fractional bandwidth of series-arm resonator s1/parallel-arm resonator p1 can be decreased with an increase in the thickness of first adjustment film 103a. The fractional bandwidth of series-arm resonator s1/parallel-arm resonator p1 can be decreased with an increase in the thickness of the second adjustment film (protective layers 103 and 104).

Figure 7C:
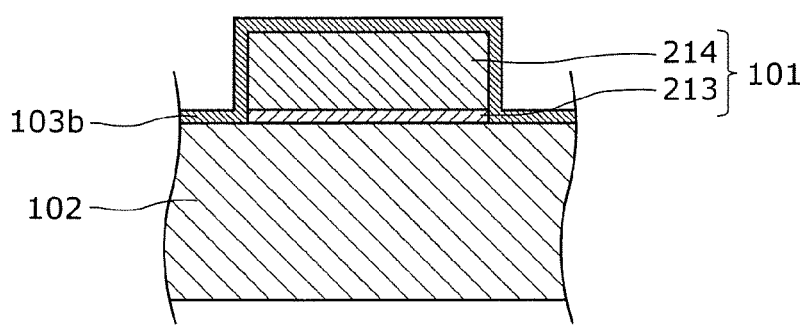
FIG. 7C is a cross-sectional view illustrating a third example of an electrode film that includes electrode fingers of an IDT electrode in a series-arm resonator/a parallel-arm resonator in Embodiment 1, and the surrounding structure.

The structure of electrode film 101 is not limited to the structures illustrated in FIGS. 7A and 7B, and may be the structure as illustrated in FIG. 7C.

FIG. 7C is a cross-sectional view showing a third example of electrode film 101 that includes electrode fingers of the IDT electrode in series-arm resonator s1/parallel-arm resonator p1, and the surrounding structure in Embodiment 1. Electrode film 101 illustrated in FIG. 7C is formed by metal films 213 and 214 described above.

At this time, piezoelectric substrate 102 is made of a $LiTaO_3$ piezoelectric monocrystal, for example. Protective layer 103b thinner than protective layer 103 described above is disposed.

Note that these configurations are examples, and the configuration of electrode film 101 that forms electrode fingers of IDT electrode 111 and electrode fingers of a comb-shaped capacitor electrode is not limited thereto. For example, electrode film 101 may be a metal single layer, rather than metal films having a stacked structure. The materials of the metal films and the protective layers are not limited to the above materials. Electrode film 101 may include a metal such as Ti, Al, Cu, Pt, Au, Ag, or Pd, or an alloy of at least one of such metals, for example, or may be a stack of layers made of such metals or such alloys. Piezoelectric substrate 102 may be made of $KNbO_3$ piezoelectric monocrystal, rock crystal, or piezoelectric ceramics, for example. The configurations of the protective layer and the adjustment film that adjusts the electromechanical coupling factors are not limited to the above configurations, and the protective layer and the adjustment film may include, for example, a dielectric or an insulator such as $SiO_2$, SiN, AlN, polyimide, or a stack of such materials. Further, protective layers 103 and 104 may not be formed.

Figure 8:
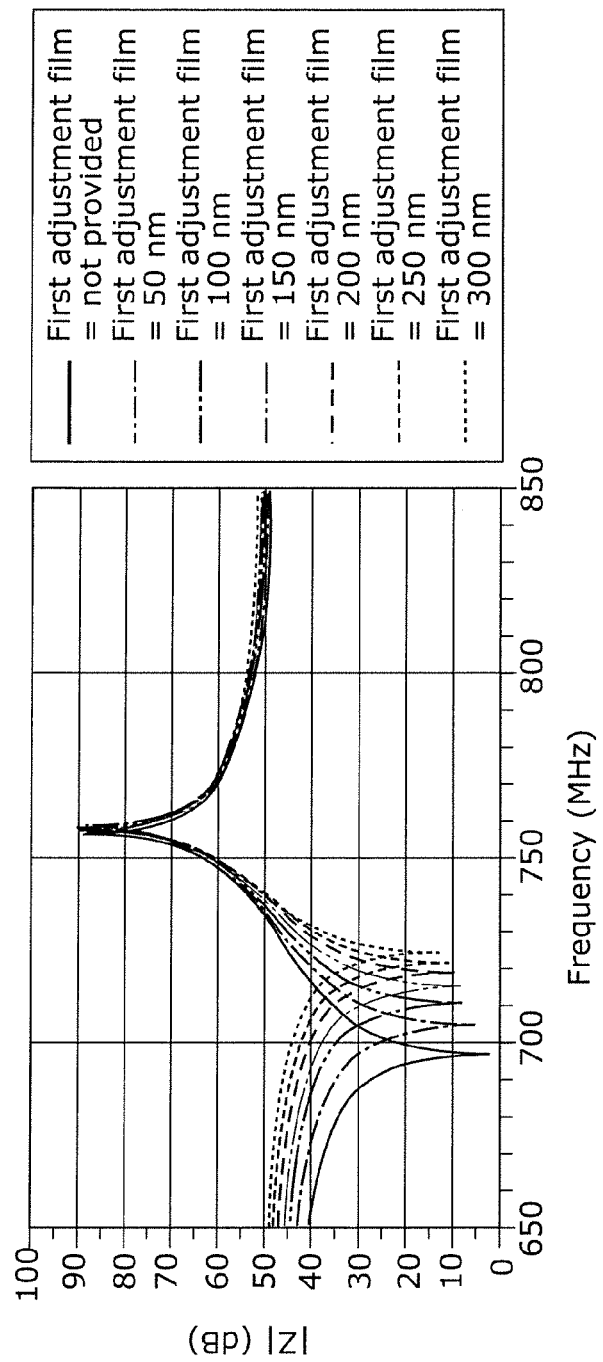
FIG. 8 illustrates a graph showing a relation between the thickness of a first adjustment film and impedance of an acoustic wave resonator.
Figure 9:
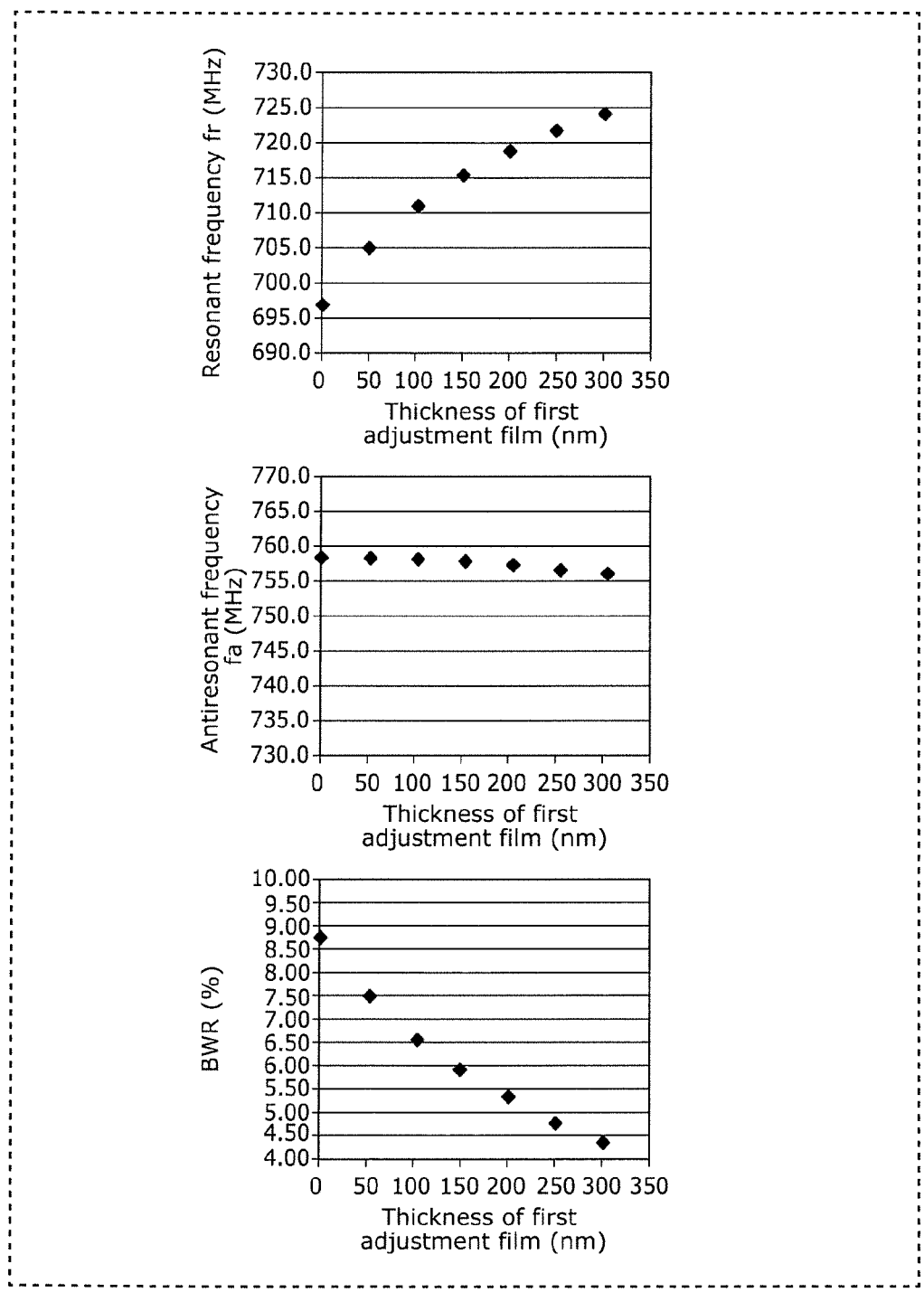
FIG. 9 illustrates graphs showing relations between (i) the thickness of the first adjustment film and (ii) a resonant frequency, an antiresonant frequency, and a fractional band width of an acoustic wave resonator.

FIG. 8 illustrates a graph showing a relation between the thickness of the first adjustment film included in an electrode structure and impedance of an acoustic wave resonator. FIG. 9 illustrates graphs showing relations between (i) the thickness of the first adjustment film and (ii) a resonant frequency, an antiresonant frequency, and a fractional band width of an acoustic wave resonator. FIG. 8 illustrates frequency characteristics of resonance impedance of an acoustic wave resonator, when the thickness of first adjustment film 103a illustrated in FIG. 7B is changed. Note that at this time, a LiNbO$_3$ substrate having −10° cut angle relative to the Y axis is used as piezoelectric substrate 102, and the thickness of the IDT electrode is 595 nm. The top graph in FIG. 9 illustrates a relation between the thickness of the first adjustment film and resonant frequency fr, the middle graph in FIG. 9 illustrates a relation between the thickness of the first adjustment film and antiresonant frequency fa, and the lower graph in FIG. 9 illustrates a relation between the thickness of the first adjustment film and fractional bandwidth BWR.

As illustrated in FIG. 8, if the thickness of the first adjustment film is changed, antiresonant frequency fa hardly changes, whereas resonant frequency fr shifts to other frequencies. More specifically, as illustrated in FIG. 9, the greater the thickness of the first adjustment film is, the higher frequency resonant frequency fr shifts to and the narrower fractional bandwidth BWR is.

The above result shows that examples of a configuration that makes the fractional bandwidth of series-arm resonator s1 greater than the fractional bandwidth of parallel-arm resonator p1 in filter device 10C according to Example 3 include (1) a configuration in which the first adjustment film on the IDT electrode of series-arm resonator s1 is made thinner than the first adjustment film on the IDT electrode of parallel-arm resonator p1, and (2) a configuration in which the first adjustment film is not formed on the IDT electrode of series-arm resonator s1. Further, examples of a configuration that makes the fractional bandwidth of parallel-arm resonator p1 greater than the fractional bandwidth of series-arm resonator s1 in filter device 10D according to Example 4 include (1) a configuration in which the first adjustment film on the IDT electrode of parallel-arm resonator p1 is made thinner than the first adjustment film on the IDT electrode of series-arm resonator s1, and (2) a configuration in which the first adjustment film is not formed on the IDT electrode of parallel-arm resonator p1.

Figure 10:
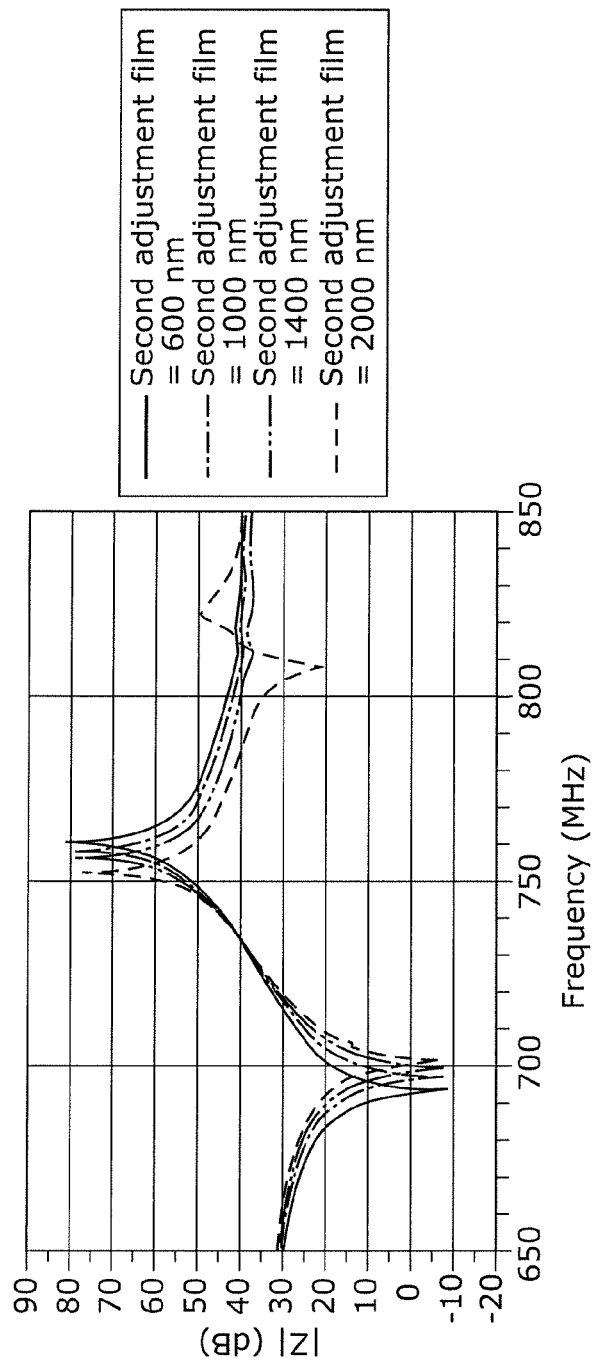
FIG. 10 illustrates a graph showing a relation between the thickness of a second adjustment film and impedance of an acoustic wave resonator.
Figure 11:
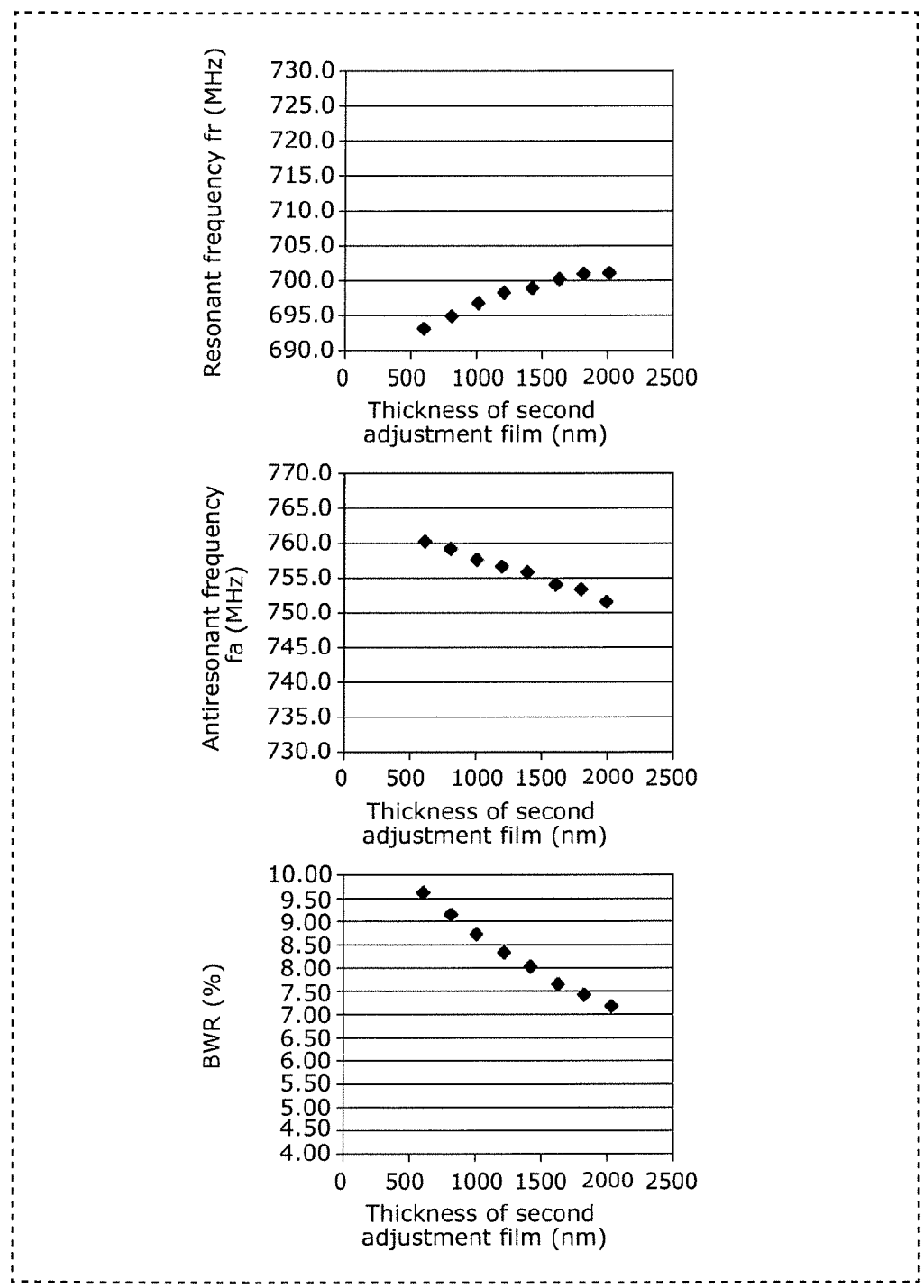
FIG. 11 illustrates graphs showing relations between (i) the thickness of the second adjustment film and (ii) a resonant frequency, an antiresonant frequency, and a fractional band width of an acoustic wave resonator.

FIG. 10 illustrates a graph showing a relation between the thickness of the second adjustment film included in an electrode structure and impedance of an acoustic wave resonator. FIG. 11 illustrates graphs showing relations between (i) the thickness of the second adjustment film and (ii) a resonant frequency, an antiresonant frequency, and a fractional band width of an acoustic wave resonator. FIG. 10 illustrates frequency characteristics of resonance impedance of an acoustic wave resonator when the thickness of the second adjustment film (protective layers 103 and 104) illustrated in FIGS. 7A and 7B is changed. Note that at this time, a LiNbO$_3$ substrate having −10° cut angle relative to the Y axis is used as piezoelectric substrate 102, and the thickness of the IDT electrode is 595 nm. The upper graph in FIG. 11 illustrates a relation between the thickness of the second adjustment film and resonant frequency fr, the middle graph in FIG. 11 illustrates a relation between the thickness of the second adjustment film and antiresonant frequency fa, and the lower graph in FIG. 11 illustrates a relation between the thickness of the second adjustment film and fractional bandwidth BWR.

As illustrated in FIG. 10, if the thickness of the second adjustment film is changed, antiresonant frequency fa and resonant frequency fr shift to other frequencies. More specifically, as illustrated in FIG. 11, the greater the thickness of the second adjustment film is, the higher frequency resonant frequency fr shifts to and the lower frequency antiresonant frequency fa shifts to. Thus, fractional bandwidth BWR decreases.

The above results show that examples of a configuration that makes the fractional bandwidth of series-arm resonator s1 greater than the fractional bandwidth of parallel-arm resonator p1 in filter device 10C according to Example 3 include (1) a configuration in which the second adjustment film on the IDT electrode of series-arm resonator s1 is made thinner than the second adjustment film on the IDT electrode of parallel-arm resonator p1, and (2) a configuration in which the second adjustment film is not formed on the IDT electrode of series-arm resonator s1. Further, examples of a configuration that makes the fractional bandwidth of parallel-arm resonator p1 greater than the fractional bandwidth of series-arm resonator s1 in filter device 10D according to Example 4 include (1) a configuration in which the second adjustment film on the IDT electrode of parallel-arm resonator p1 is made thinner than the second adjustment film on the IDT electrode of series-arm resonator s1, and (2) a configuration in which the second adjustment film is not formed on the IDT electrode of parallel-arm resonator p1.

As described above, the first adjustment film and the second adjustment film may be appropriately provided according to filter characteristics that the filter device is to have. Specifically, for example, the second adjustment film also has functions of improving frequency temperature characteristics and moisture resistant properties, and thus considering frequency temperature characteristics and moisture resistant properties that the filter device is to have, the thickness of the second adjustment film may be determined, and adjustment of the fractional bandwidth may be determined mainly according to the thickness of the first adjustment film and whether the first adjustment film is included.

[1.6 Filter Devices According to Examples 5 and 6]

Figure 12A:
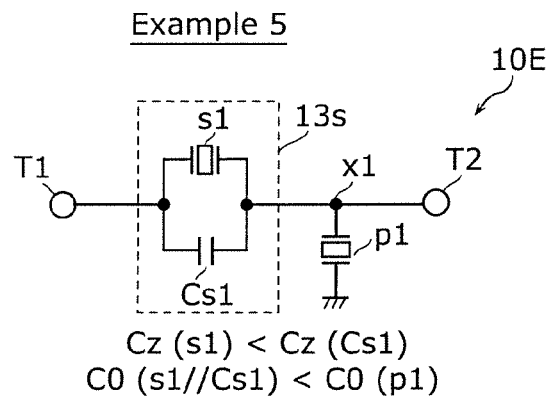
FIG. 12A illustrates a circuit configuration of a filter device according to Example 5.

FIG. 12A illustrates a circuit configuration of filter device 10E according to Example 5. Filter device 10E illustrated in FIG. 12A includes series-arm circuit 13s, parallel-arm resonator p1, and input/output terminals T1 and T2.

Filter device 10E according to Example 5 is different from filter device 10A according to Example 1 in that electrostatic capacitance of series-arm circuit 13s is greater than electrostatic capacitance of parallel-arm resonator p1. In the following, description of common points of filter device 10E according to Example 5 to those of filter device 10A according to Example 1 is omitted, and different points are mainly described.

In this example, series-arm circuit 13s is connected to a path that connects input/output terminals T1 and T2, and includes series-arm resonator s1 and capacitor Cs1. Series-arm circuit 13s is a resonance circuit that includes series-arm resonator s1 and capacitor Cs1. Series-arm resonator s1 is a first acoustic wave resonator connected in parallel to capacitor Cs1, and capacitor Cs1 is a first capacitor connected in parallel to series-arm resonator s1. Parallel-arm resonator p1 is a second acoustic resonator not connected in parallel to a capacitor. Here, electrostatic capacitance density Cz (Cs1) of capacitor Cs1 is higher than electrostatic capacitance density Cz (Cs1) of series-arm resonator s1, and electrostatic capacitance (which may be denoted by C0 (s1//Cs1) in the following) of series-arm circuit 13s is smaller than the electrostatic capacitance (which may be denoted by C0 (p1) in the following) of parallel-arm resonator p1.

Figure 12B:
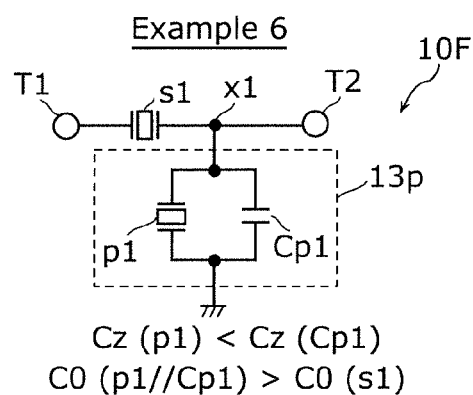
FIG. 12B illustrates a circuit configuration of a filter device according to Example 6.

FIG. 12B illustrates a circuit configuration of filter device 10F according to Example 6. Filter device 10F illustrated in FIG. 12B includes parallel-arm circuit 13p, series-arm resonator s1, and input/output terminals T1 and T2.

Filter device 10F according to Example 6 is different from filter device 10B according to Example 2 in that electrostatic capacitance of parallel-arm circuit 13p is greater than electrostatic capacitance of series-arm resonator s1. In the following, description of common points of filter device 10F according to Example 6 to those of filter device 10B according to Example 2 is omitted, and different points are mainly described.

In this example, series-arm resonator s1 is a second acoustic wave resonator connected on a path that connects input/output terminals T1 and T2, and is included in a series-arm circuit.

Parallel-arm circuit 13p is connected to node x1 on the path and the ground, and includes parallel-arm resonator p1 and capacitor Cp1. Parallel-arm circuit 13p is a resonance circuit that includes parallel-arm resonator p1 and capacitor Cp1. Parallel-arm resonator p1 is a first acoustic wave resonator connected in parallel to capacitor Cp1, and capacitor Cp1 is a first capacitor connected in parallel to parallel-arm resonator p1. Capacitor Cp1 is connected in parallel to parallel-arm resonator p1, electrostatic capacitance density Cz (Cp1) of capacitor Cp1 is higher than electrostatic capacitance density Cz (p1) of parallel-arm resonator p1, and electrostatic capacitance C0 (p1//Cp1) of parallel-arm circuit 13p is higher than electrostatic capacitance C0 (s1) of series-arm resonator s1.

Figure 12C:
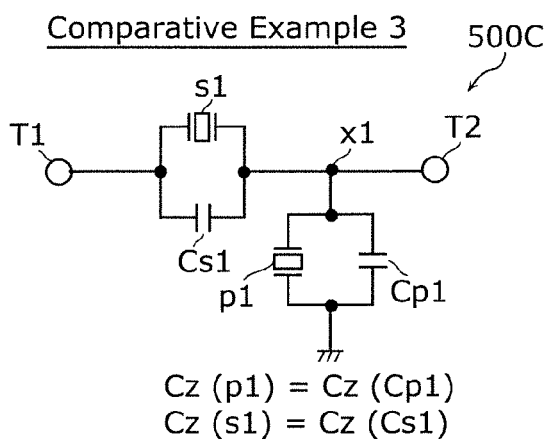
FIG. 12C illustrates a circuit configuration of a filter device according to Comparative Example 3.

FIG. 12C illustrates a circuit configuration of filter device 500C according to Comparative Example 3. Filter device 500C illustrated in FIG. 12C includes a series-arm circuit having the same circuit configuration as the circuit connection configuration of filter device 10E according to Example 5 illustrated in FIG. 12A, and is different from filter device 10E in that electrostatic capacitance density Cz (s1) and electrostatic capacitance density Cz (Cs1) are the same. Filter device 500C includes a parallel-arm circuit having the same circuit configuration as the circuit connection configuration of filter device 10F according to Example 6 illustrated in FIG. 12B, and is different from filter device 10F in that electrostatic capacitance density Cz (p1) and electrostatic capacitance density Cz (Cp1) are the same.

Table 5 illustrates circuit parameters of filter device 10E according to Example 5, filter device 10F according to Example 6, and filter device 500C according to Comparative Example 3.

TABLE 5

|  |  |  | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Comp. Ex. 3 | S-arm ckt | s1 | 840 | 881 | 4.88 | 1.50 | 130.00 | 11538 |
|  |  | Cs1 |  |  |  | 0.50 | 130.00 | 3846 |
|  | P-arm ckt | p1 | 840 | 871 | 3.69 | 2.00 |  | 15385 |
|  |  |  | 800 | 836 | 4.50 | 3.00 | 130.00 | 23077 |
|  |  | Cp1 |  |  |  | 1.00 | 130.00 | 7692 |
|  |  |  | 800 | 827 | 3.38 | 4.00 |  | 30769 |
|  | Filt. device | 500C |  |  |  |  |  | 46154 |
| Ex. 5 | S-arm ckt | s1 | 840 | 881 | 4.88 | 1.50 | 130.00 | 11538 |
|  | 13s | Cs1 |  |  |  | 0.50 | 300.00 | 1667 |
|  | P-arm ckt | p1 | 840 | 871 | 3.69 | 2.00 |  | 13205 |
|  |  |  | 800 | 827 | 3.38 | 4.00 | 130.00 | 30769 |
|  | Filt. device | 10E |  |  |  |  |  | 43974 |
| Ex. 6 | P-arm ckt | p1 | 800 | 836 | 4.50 | 3.00 | 130.00 | 23077 |
|  | 13p | Cp1 |  |  |  | 1.00 | 300.00 | 3333 |
|  |  |  | 800 | 827 | 3.38 | 4.00 |  | 20962 |
|  | S-arm ckt | s1 | 840 | 881 | 4.88 | 2.00 | 130.00 | 15385 |
|  | Filt. device | 10F |  |  |  |  |  | 41795 |

Figure 12D:
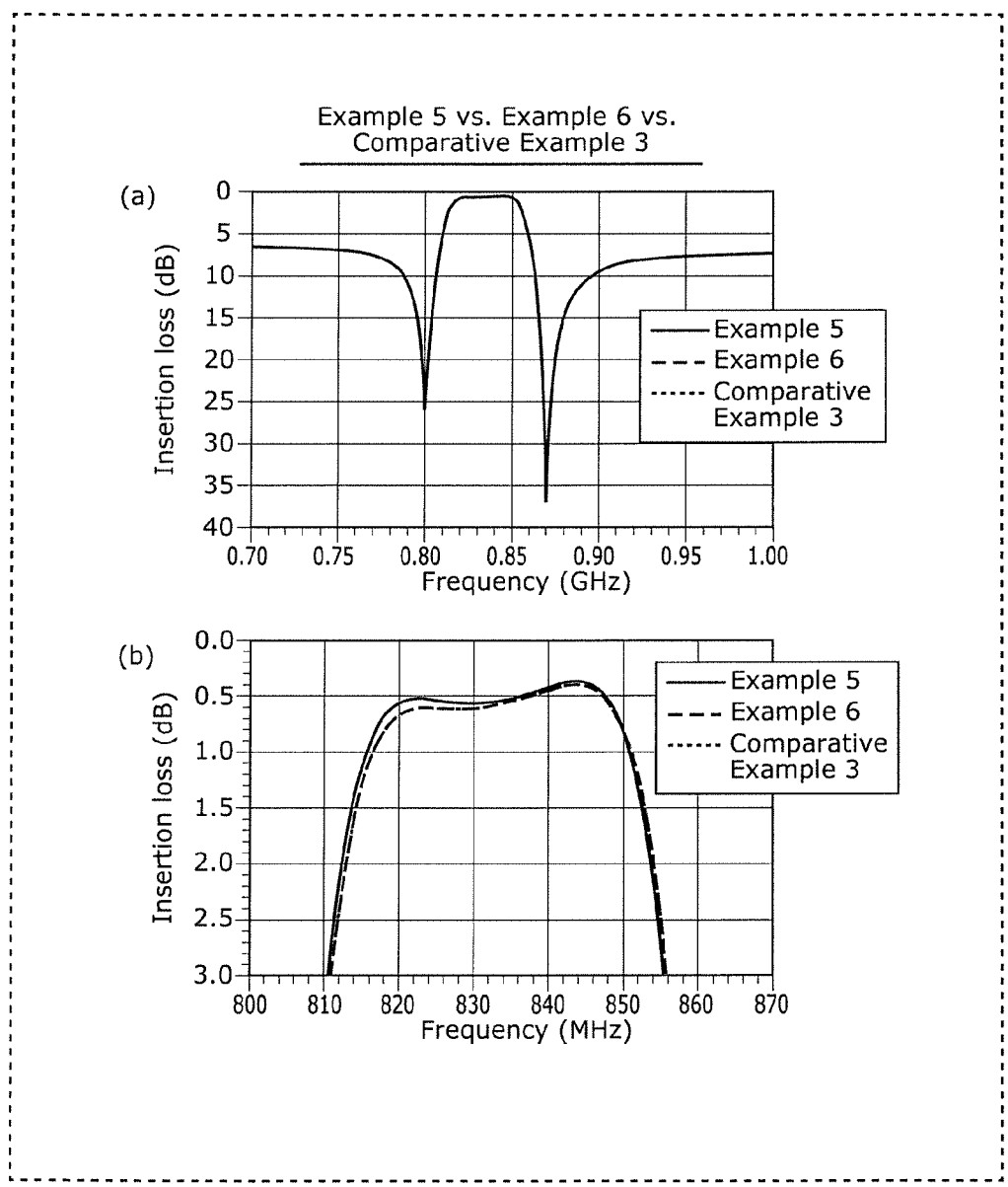
FIG. 12D illustrates graphs showing comparisons of passing characteristics of the filter devices according to Example 5, Example 6, and Comparative Example 3.

FIG. 12D illustrates graphs showing comparisons of passing characteristics of filter device 10E according to Example 5, filter device 10F according to Example 6, and filter device 500C according to Comparative Example 3. As illustrated in (a) of FIG. 12D, passing characteristics of the filter devices according to Example 5, Example 6, and Comparative Example 3 mostly overlap. Furthermore, as illustrated in (b) of FIG. 12D, passing characteristics in the passband of the filter devices according to Example 6 and Comparative Example 3 mostly overlap.

Electrostatic capacitance of the series-arm circuit of each of filter device 10E according to Example 5 and filter device 500C according to Comparative Example 3 is determined by a sum of electrostatic capacitance C0 (s1) of series-arm resonator s1 and electrostatic capacitance C0 (Cs1) of capacitor Cs1. Electrostatic capacitance of the parallel-arm circuit of each of filter device 10F according to Example 6 and filter device 500C according to Comparative Example 3 is determined by a sum of electrostatic capacitance C0 (p1) of parallel-arm resonator p1 and electrostatic capacitance C0 (Cp1) of capacitor Cp1. In the series-arm circuit and the parallel-arm circuit, the greater electrostatic capacitance is, the lower impedance is. Here, assuming that electrostatic capacitance of the series-arm circuit (C0 (s1)+C0 (Cs1)) is the same as electrostatic capacitance C0 (p1) of parallel-arm resonator p1, the series-arm circuit is smaller than parallel-arm resonator p1, since electrostatic capacitance density Cz (Cs1) is higher than electrostatic capacitance density Cz (s1). Further, assuming that electrostatic capacitance of the parallel-arm circuit (C0 (p1)+C0 (Cp1)) is the same as electrostatic capacitance C0 (s1) of series-arm resonator s1, the parallel-arm circuit is smaller than series-arm resonator s1 since electrostatic capacitance density Cz (Cp1) is higher than electrostatic capacitance density Cz (p1).

From this viewpoint, when electrostatic capacitance of parallel-arm circuit 13p (C0 (p1)+C0 (Cp1)) is greater than electrostatic capacitance C0 (s1) of series-arm resonator s1 as in filter device 10F according to Example 6, filter device 10F can be more effectively miniaturized.

Note that filter device 10E according to Example 5 can be miniaturized while insertion loss in a passband is decreased as illustrated in (b) of FIG. 12D, yet as shown in table 5 (the sizes), filter device 10F according to Example 6 can be more efficiently miniaturized than filter device 10E according to Example 5.

[1.7 Filter Device According to Example 7]

Figure 13A:
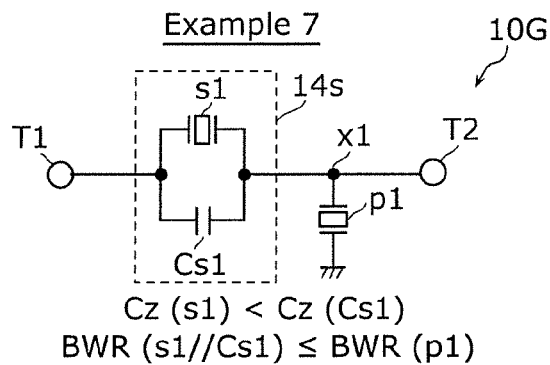
FIG. 13A illustrates a circuit configuration of a filter device according to Example 7.

FIG. 13A illustrates a circuit configuration of filter device 10G according to Example 7. Filter device 10G illustrated in FIG. 13A includes series-arm circuit 14s, parallel-arm resonator p1, and input/output terminals T1 and T2.

Filter device 10G according to Example 7 is different from filter device 10A according to Example 1 in that the fractional bandwidth of series-arm circuit 14s is narrower than that of series-arm circuit 11s. In the following, description of common points of filter device 10G according to Example 7 to those of filter device 10A according to Example 1 is omitted, and different points are mainly described.

In this example, series-arm circuit 14s is connected to a path that connects input/output terminals T1 and T2, and includes series-arm resonator s1 and capacitor Cs1. Series-arm circuit 14s is a resonance circuit that includes series-arm resonator s1 and capacitor Cs1. Series-arm resonator s1 is a first acoustic wave resonator connected in parallel to capacitor Cs1, and capacitor Cs1 is a first capacitor connected in parallel to series-arm resonator s1. Parallel-arm resonator p1 is a second acoustic wave resonator not connected in parallel to a capacitor. Here, electrostatic capacitance density Cz (Cs1) of capacitor Cs1 is higher than electrostatic capacitance density Cz (Cs1) of series-arm resonator s1, and fractional bandwidth BWR (s1//Cs1) of series-arm circuit 14s is narrower than or equal to fractional bandwidth BWR (p1) of parallel-arm resonator p1.

Table 6 shows circuit parameters of filter device 10A according to Example 1, and circuit parameters of filter device 10G according to Example 7.

TABLE 6

| | | | Reso. freq. fr (MHz) | A-reso. freq. fa (MHz) | Fract. BW BWR (%) | ES cap. (pF) | ES cap. dens. Cz (fF/μm$^2$) | Size (μm$^2$) |
|---|---|---|---|---|---|---|---|---|
| Ex. 1 | S-arm ckt 11s | s1 | 840 | 881 | 4.88 | 1.50 | 130.00 | 11538 |
| | | Cs1 | | | | 0.50 | 300.00 | 1667 |
| | P-arm ckt | p1 | 840 | 871 | 3.69 | 2.00 | | 13205 |
| | | | 800 | 836 | 4.50 | 4.00 | 130.00 | 30769 |
| | Filt. device 10A | | | | | | | 43974 |
| Ex. 7 | S-arm ckt 14s | s1 | 842 | 883 | 4.87 | 1.20 | 130.00 | 9231 |
| | | Cs1 | | | | 0.80 | 300.00 | 2667 |
| | P-arm ckt | p1 | 842 | 867 | 2.97 | 2.00 | | 11897 |
| | | | 800 | 836 | 4.50 | 4.00 | 130.00 | 30769 |
| | Filt. device 10G | | | | | | | 42667 |

Figure 13B:
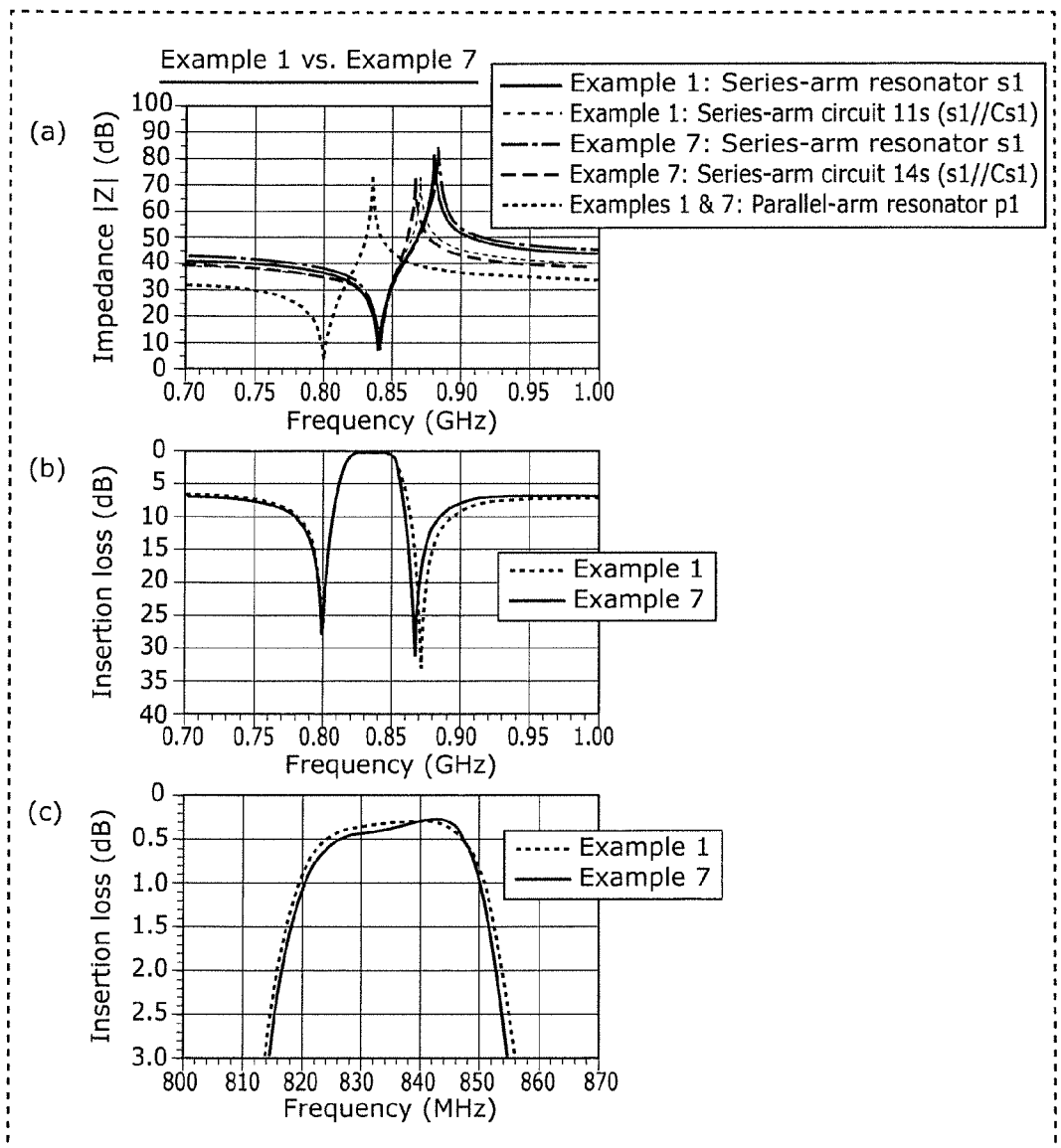
FIG. 13B illustrates comparisons of impedance characteristics and passing characteristics of the filter devices according to Examples 1 and 7.

FIG. 13B illustrates graphs showing comparisons of impedance characteristics and passing characteristics of filter device 10A according to Example 1 and filter device 10G according to Example 7. As illustrated in Table 6, fractional bandwidth BWR (s1//Cs1) of series-arm circuit 11s of filter device 10A is 3.69%, and fractional bandwidth BWR (s1//Cs1) of series-arm circuit 14s of filter device 10G is 2.97%. Further, fractional bandwidth BWR (p1) of parallel-arm resonator p1 is 4.50%. Specifically, in both of Examples 1 and 7, fractional bandwidth BWR (s1//Cs1) of the series-arm circuit is narrower than fractional bandwidth BWR (p1) of parallel-arm resonator p1, yet fractional bandwidth BWR (s1//Cs1) of series-arm circuit 14s according to Example 7 is narrower than fractional bandwidth BWR (s1//Cs1) of series-arm circuit 11s according to Example 1.

The proportion of electrostatic capacitance of capacitor Cs1 in the series-arm circuit is increased by making fractional bandwidth BWR of the series-arm circuit narrower than fractional bandwidth BWR of parallel-arm resonator p1, and thus a further reduction in size is allowed and steepness of a skirt on the passband high-frequency side improves. As illustrated in (b) and (c) of FIG. 13B, steepness of a skirt on the passband high-frequency side further improves in Example 7 than in Example 1 by decreasing fractional bandwidth BWR of the series-arm circuit. With this, the size can be reduced more effectively as illustrated in Table 6.

[1.8 Filter Device According to Example 8]

Figure 14A:
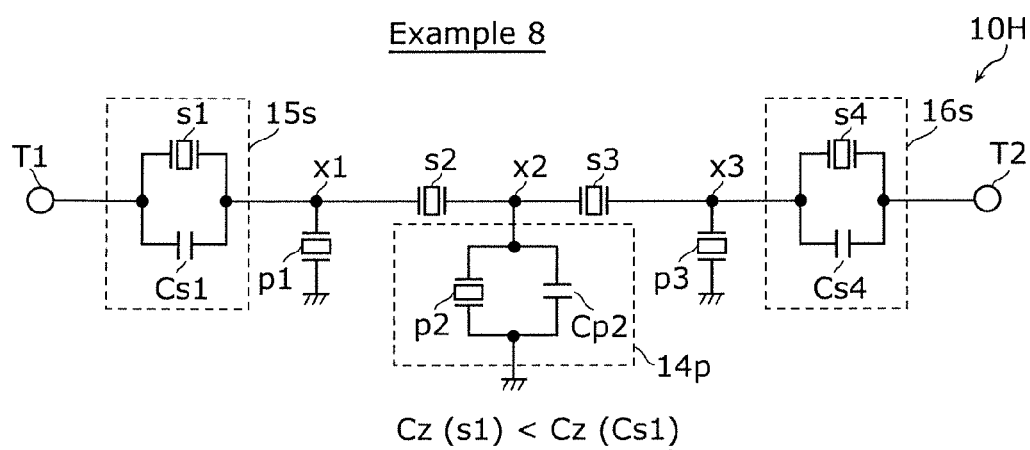
FIG. 14A illustrates a circuit configuration of a filter device according to Example 8.

FIG. 14A illustrates a circuit configuration of filter device 10H according to Example 8. Filter device 10H illustrated in FIG. 14A includes series-arm circuits 15s and 16s, parallel-arm circuit 14p, series-arm resonators s2 and s3, parallel-arm resonators p1 and p3, and input/output terminals T1 and T2. Series-arm resonators s2 and s3 are each included in a series-arm circuit. Parallel-arm resonator p1 is included in a parallel-arm circuit connected to node x1 on a path that connects input/output terminals T1 and T2 and the ground. Parallel-arm resonator p3 is included in a parallel-arm circuit connected to node x3 on the path and the ground.

Filter device 10H according to Example 8 is different from filter device 10A according to Example 1 in that a plurality of series-arm circuits and a plurality of parallel-arm circuits are included. In the following, description of common points of filter device 10H according to Example 8 to those of filter device 10A according to Example 1 is omitted, and different points are mainly described.

In this example, series-arm circuit 15s, series-arm resonator s2, series-arm resonator s3, and series-arm circuit 16s are connected in series to the path that connects input/output terminals T1 and T2 in the stated order.

Series-arm circuit 15s is a resonance circuit that includes series-arm resonator s1 and capacitor Cs1. Series-arm resonator s1 is a first acoustic wave resonator connected in parallel to capacitor Cs1. Capacitor Cs1 is a first capacitor connected in parallel to series-arm resonator s1.

Series-arm circuit 16s is a resonance circuit that includes series-arm resonator s4 and capacitor Cs4. Series-arm resonator s4 is a first acoustic wave resonator connected in parallel to capacitor Cs4. Capacitor Cs4 is a first capacitor connected in parallel to series-arm resonator s4.

Parallel-arm circuit 14p is a resonance circuit that is connected to node x2 on the path and the ground, and includes parallel-arm resonator p2 and capacitor Cp2. Parallel-arm resonator p2 is a first acoustic wave resonator connected in parallel to capacitor Cp2. Capacitor Cp2 is a first capacitor connected in parallel to parallel-arm resonator p2.

According to the above configuration, filter device 10H is included in a multi-level ladder filter circuit that includes one or more series-arm circuits and one or more parallel-arm circuits. As in this example, a filter device that satisfies requirement specification of a band to be used can be achieved by adjusting the number of series-arm circuits and the number of parallel-arm circuits. This example describes an example case where the filter device according to the present embodiment is applied as a Long Term Evolution (LTE) Band 28 transmission filter (transmission passband: 703 to 748 MHz, attenuation band: 758 to 803 MHz).

Here, filter device 10H has features as follows.

(1) Electrostatic capacitance density Cz (Cs1) of capacitor Cs1 is higher than electrostatic capacitance density Cz (s1) of series-arm resonator s1.

(2) Electrostatic capacitance density Cz (Cp2) of capacitor Cp2 is higher than electrostatic capacitance density Cz (p2) of parallel-arm resonator p2.

(3) Electrostatic capacitance density Cz (Cs4) of capacitor Cs4 is higher than electrostatic capacitance density Cz (s4) of series-arm resonator s4.

(4) The fractional bandwidth of series-arm resonator s1 is greater than the fractional bandwidth of each of series-arm resonators s2 and s3 and parallel-arm resonators p1 and p3.

(5) The fractional bandwidth of parallel-arm resonator p2 is greater than the fractional bandwidth of each of series-arm resonators s2 and s3 and parallel-arm resonators p1 and p3.

(6) The fractional bandwidth of series-arm resonator s4 is greater than the fractional bandwidth of each of series-arm resonators s2 and s3 and parallel-arm resonators p1 and p3.

(7) The electrostatic capacitance of series-arm circuit 15s is greater than electrostatic capacitance of each of series-arm resonators s2 and s3 and parallel-arm resonators p1 and p3.

(8) The electrostatic capacitance of parallel-arm circuit 14p is greater than electrostatic capacitance of each of series-arm resonators s2 and s3 and parallel-arm resonators p1 and p3.

(9) The electrostatic capacitance of series-arm circuit 16s is greater than electrostatic capacitance of each of series-arm resonators s2 and s3 and parallel-arm resonators p1 and p3.

(10) The fractional bandwidth of series-arm circuit 15s is narrower than or equal to the fractional bandwidth of each of series-arm resonators s2 and s3 and parallel-arm resonators p1 and p3.

(11) The fractional bandwidth of parallel-arm circuit 14p is narrower than or equal to the fractional bandwidth of each of series-arm resonators s2 and s3 and parallel-arm resonators p1 and p3.

(12) The fractional bandwidth of series-arm circuit 16s is narrower than or equal to the fractional bandwidth of each of series-arm resonators s2 and s3 and parallel-arm resonators p1 and p3.

Table 7 shows circuit parameters of filter device 10H according to Example 8, and circuit parameters of filter device 500D according to Comparative Example 4.

TABLE 7

| | | | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Comp. Ex. 4 | S-arm ckt | s1 | 724.5 | 762.5 | 5.24 | 7.61 | 115.00 | 66165 |
| | Cs1 | | | | | 1.50 | 115.00 | 13052 |
| | | | 724.5 | 756.5 | 4.42 | 9.11 | | 79217 |
| | S-arm ckt | s2 | 724.5 | 762.5 | 5.24 | 2.48 | 115.00 | 21530 |
| | S-arm ckt | s3 | 723.0 | 779.0 | 7.75 | 1.95 | 115.00 | 16930 |
| | S-arm ckt | s4 | 732.0 | 771.0 | 5.33 | 8.00 | 115.00 | 69557 |
| | Cs4 | | | | | 1.72 | 115.00 | 14948 |
| | | | 732.0 | 764.0 | 4.37 | 9.72 | | 84504 |
| | P-arm ckt | p1 | 686.0 | 719.5 | 4.88 | 5.59 | 115.00 | 48565 |
| | P-arm ckt | p2 | 690.0 | 724.0 | 4.93 | 5.13 | 115.00 | 44626 |
| | Cp2 | | | | | 1.01 | 115.00 | 8739 |
| | | | 690.0 | 718.5 | 4.13 | 6.14 | | 53365 |
| | P-arm ckt | p3 | 689.5 | 723.0 | 4.86 | 3.71 | 115.00 | 32296 |
| Filt. device 500D | | | | | | | | 336409 |

TABLE 7-continued

| | | | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Ex. 8 | S-arm ckt | s1 | 727.0 | 783.5 | 7.77 | 4.91 | 115.00 | 42696 |
| | 15s | Cs1 | | | | 4.20 | 300.00 | 14000 |
| | | | 727.0 | 758.0 | 4.26 | 9.11 | | 56696 |
| | S-arm ckt | s2 | 724.5 | 762.5 | 5.24 | 2.48 | 115.00 | 21530 |
| | S-arm ckt | s3 | 723.0 | 779.0 | 7.75 | 1.95 | 115.00 | 16930 |
| | S-arm ckt | s4 | 733.5 | 790.5 | 7.77 | 5.32 | 115.00 | 46243 |
| | 16s | Cs4 | | | | 4.40 | 300.00 | 14667 |
| | | | 733.5 | 765.0 | 4.29 | 9.72 | | 60910 |
| | P-arm ckt | p1 | 686.0 | 719.5 | 4.88 | 5.59 | 115.00 | 48565 |
| | P-arm ckt | p2 | 690.0 | 744.0 | 7.83 | 3.14 | 115.00 | 27278 |
| | 14p | Cp2 | | | | 3.00 | 300.00 | 10000 |
| | | | 690.0 | 718.0 | 4.06 | 6.14 | | 37278 |
| | P-arm ckt | p3 | 689.5 | 723.0 | 4.86 | 3.71 | 115.00 | 32296 |
| | Filt. device | 10H | | | | | | 274206 |

Figure 14B:
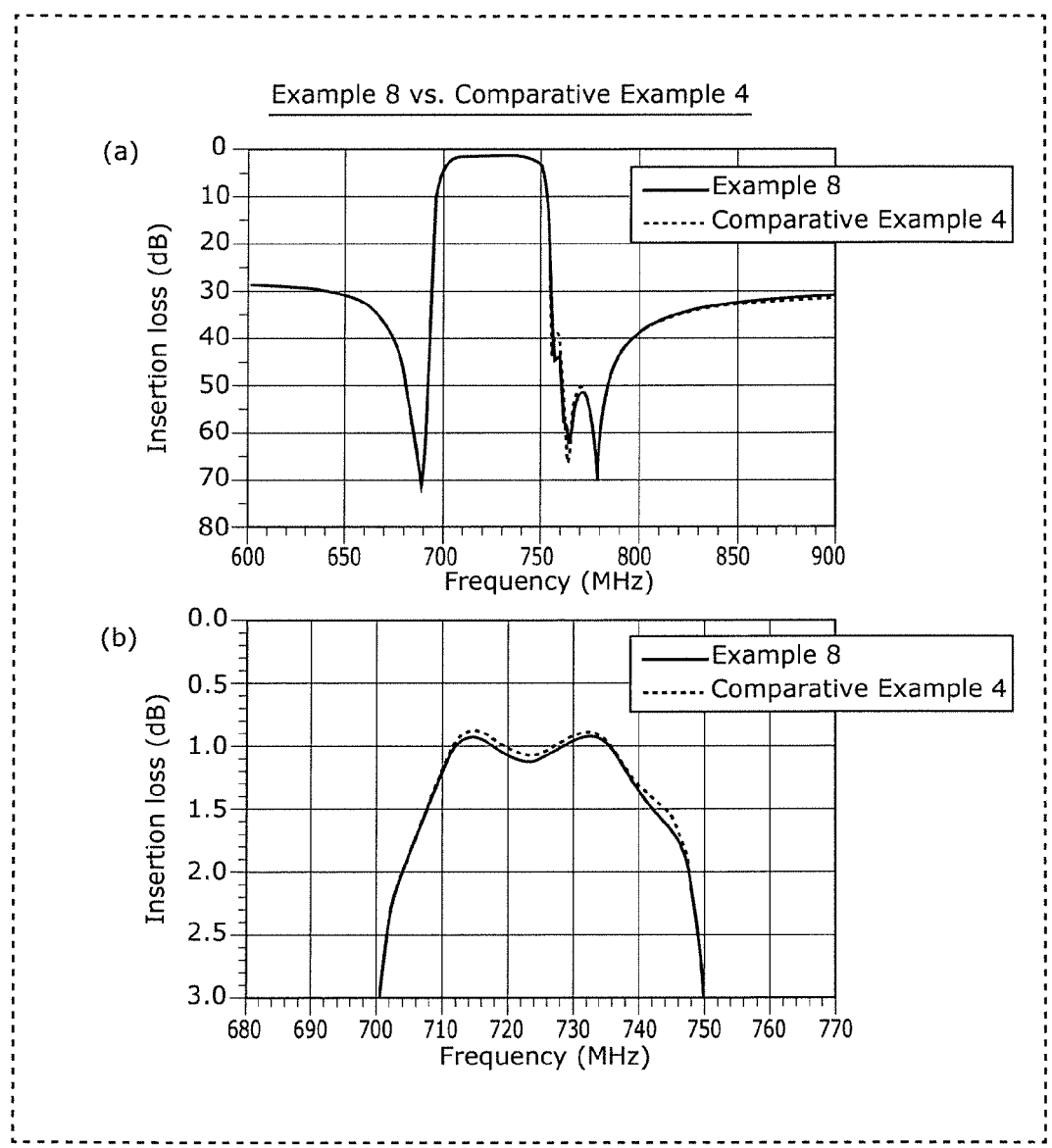
FIG. 14B illustrates graphs showing comparisons of passing characteristics of the filter device according to Example 8 and a filter device according to Comparative Example 4.

FIG. 14B illustrates graphs showing comparisons of passing characteristics of filter device 10H according to Example 8 and filter device 500D according to Comparative Example 4.

Note that filter device 500D according to Comparative Example 4 has the same circuit configuration as the circuit connection configuration of filter device 10H according to Example 8 illustrated in FIG. 14A, and is different from filter device 10H in that electrostatic capacitance density Cz (Cs1) and electrostatic capacitance density Cz (s1) are the same, electrostatic capacitance density Cz (Cp2) and electrostatic capacitance density Cz (p2) are the same, and electrostatic capacitance density Cz (Cs4) and electrostatic capacitance density Cz (s4) are the same. Accordingly, as illustrated in FIG. 14B, passing characteristics of filter device 10H according to Example 8 in and near the passband are substantially the same as passing characteristics of filter device 500D according to Comparative Example 4 in and near the passband.

On the other hand, filter device 10H according to Example 8 has features (1) to (12) as above, and thus can be further miniaturized while maintaining filter characteristics, as illustrated in Table 7.

Note that design parameters of the first acoustic wave resonators included in series-arm circuits 15s and 16s and parallel-arm circuit 14p each of which is a resonance circuit may be different as illustrated in Table 7. Furthermore, design parameters of the first capacitors included in series-arm circuits 15s and 16s and parallel-arm circuit 14p may also be different.

In filter device 10H according to Example 8, among one or more series-arm circuits and one or more parallel-arm circuits, two or more circuits may each have such a resonance circuit as stated above.

In filter device 10H according to Example 8, it is sufficient if the resonance circuits satisfy at least features (1) to (3) stated above among features (1) to (12) stated above.

In features (4) to (12) stated above, a fractional bandwidth or electrostatic capacitance of a resonance circuit or a resonator included in the resonance circuit is compared with the fractional bandwidth or electrostatic capacitance of each of series-arm resonators s2 and s3 and parallel-arm resonators p1 and p3, it is sufficient if the fractional bandwidth or the electrostatic capacitance of the resonance circuit or the resonator included in the resonance circuit satisfy conditions, as compared with the fractional bandwidth or electrostatic capacitance of at least one of the resonators, namely series-arm resonators s2 and s3 and parallel-arm resonators p1 and p3.

[1.9 Filter Device According to Example 9]

Figure 15A:
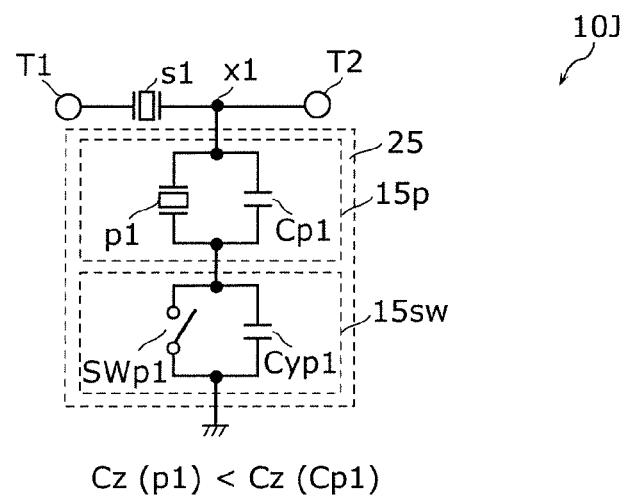
FIG. 15A illustrates a circuit configuration of a filter device according to Example 9.

FIG. 15A illustrates a circuit configuration of filter device 10J according to Example 9. Filter device 10J illustrated in FIG. 15A includes parallel-arm circuit 25, series-arm resonator s1, and input/output terminals T1 and T2.

Filter device 10J according to Example 9 is different from filter device 10B according to Example 2 in that parallel-arm circuit 25 includes a switch circuit. In the following, description of common points of filter device 10J according to Example 9 to those of filter device 10B according to Example 2 is omitted, and different points are mainly described.

In this example, series-arm resonator s1 is a second acoustic wave resonator connected to a path that connects input/output terminals T1 and T2, and is included in a series-arm circuit.

Parallel-arm circuit 25 is connected to node x1 on the path and the ground, and includes resonance circuit 15p and switch circuit 15sw connected in series to a path that connects node x1 and the ground. Resonance circuit 15p includes parallel-arm resonator p1 and capacitor Cp1. Parallel-arm resonator p1 is a first acoustic wave resonator connected in parallel to capacitor Cp1. Capacitor Cp1 is a first capacitor connected in parallel to parallel-arm resonator p1. Here, electrostatic capacitance density Cz (Cp1) of capacitor Cp1 is higher than electrostatic capacitance density Cz (p1) of parallel-arm resonator p1.

Switch circuit 15sw includes capacitor Cyp1 and switch SWp1 connected in parallel to capacitor Cyp1.

Note that capacitor Cyp1 (second capacitor) may be an inductor, or may be an impedance element that includes at least one of a capacitor, an inductor, or an acoustic wave resonator.

Table 8 shows circuit parameters of filter device 10J according to Example 9.

TABLE 8

|  |  |  | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Ex. 9 | Reso. ckt | p1 | 800 | 868 | 8.50 | 4.00 | 130.00 | 30769 |
|  | 15p | Cp1 |  |  |  | 2.00 | 300.00 | 6667 |
|  |  | Total | 800 | 846 | 5.75 | 6.00 |  | 37436 |
|  | SW ckt | Cyp1 |  |  |  | 10.00 | 300.00 | 33333 |
|  | 15sw | SWp1 On | 800 | 846 | 5.75 |  |  |  |
|  |  | SWp1 Off | 817.5 | 846 | 3.49 |  |  |  |
|  | S-arm ckt | s1 | 850 | 904 | 6.35 | 2.00 | 130.00 | 15385 |
|  | Filt. device 103 |  |  |  |  |  |  | 86154 |

Figure 15B:
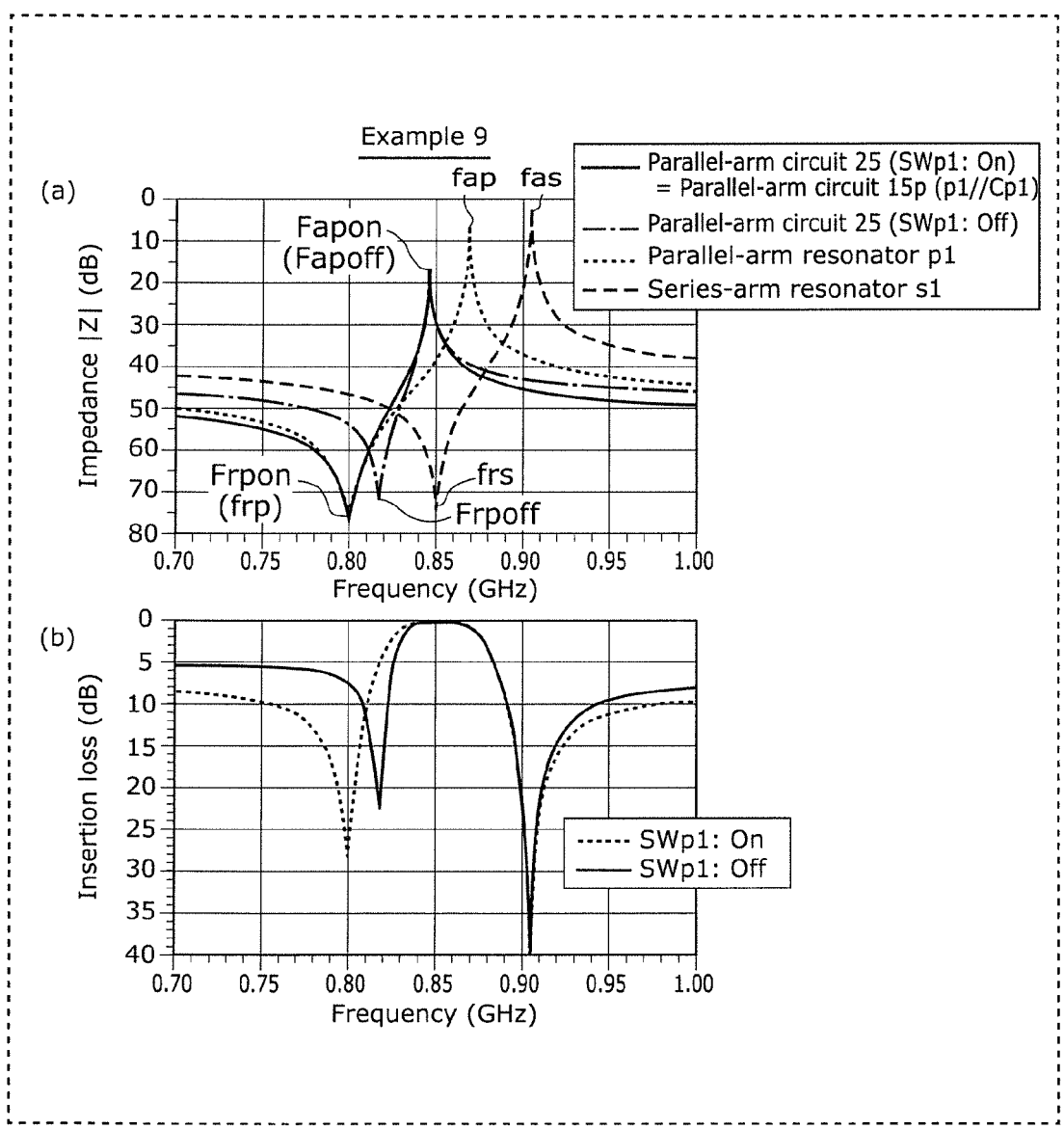
FIG. 15B illustrates graphs showing impedance characteristics and passing characteristics of the filter device according to Example 9.

FIG. 15B illustrates graphs showing impedance characteristics of the resonators and the circuits included in filter device 10J according to Example 9, and passing characteristics of filter device 10J according to Example 9. As illustrated in (a) of FIG. 15B, the impedance of switch circuit 15sw can be changed by switching between the conducting state (on) and the non-conducting state (off) of switch SWp1, so that resonant frequency Frp at which impedance of parallel-arm circuit 25 has a local minimum value can be switched to another frequency (between Frpon and Frpoff). Accordingly, as illustrated in (b) of FIG. 15B, the frequency of the attenuation pole of filter device 10J on the passband low-frequency side shifts to another frequency, and thus the passband width and the attenuation on the passband low-frequency side can be changed.

Switch circuit 15sw and parallel-arm resonator p1 are connected in series, and thus of a resonator connected in series to switch circuit 15sw is to be designed to have low impedance (to have great electrostatic capacitance). Accordingly, the resonator is expected to have a large size. In contrast, according to filter device 10J according to this example, the resonator is achieved by resonance circuit 15p in which parallel-arm resonator p1 and capacitor Cp1 having an electrostatic capacitance density higher than that of parallel-arm resonator p1 are connected in parallel to each other, thus miniaturizing the filter device and achieving filter device 10J having a frequency-tunable function.

[1.10 Filter Device According to Examples 10 and 11]

Figure 16A:
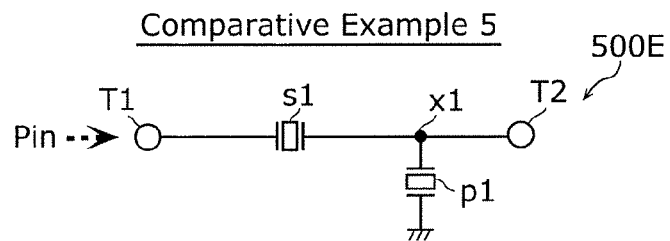
FIG. 16A illustrates a circuit configuration of a filter device according to Comparative Example 5.
Figure 16B:
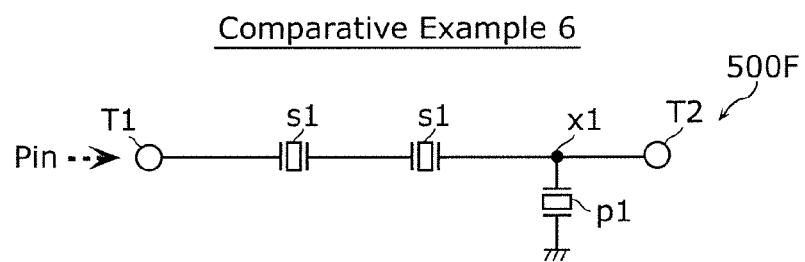
FIG. 16B illustrates a circuit configuration of a filter device according to Comparative Example 6.
Figure 17A:
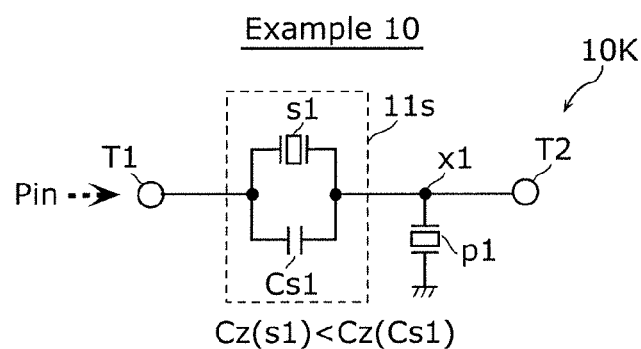
FIG. 17A illustrates a circuit configuration of a filter device according to Example 10.
Figure 17B:
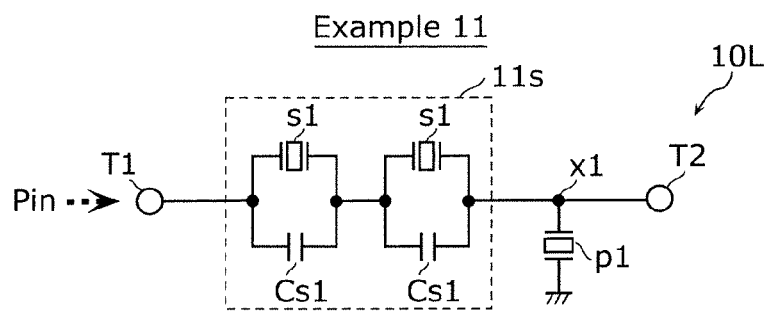
FIG. 17B illustrates a circuit configuration of a filter device according to Example 11.

FIG. 16A illustrates a circuit configuration of filter device 500E according to Comparative Example 5. FIG. 16B illustrates a circuit configuration of filter device 500F according to Comparative Example 6. FIG. 17A illustrates a circuit configuration of filter device 10K according to Example 10. FIG. 17B illustrates a circuit configuration of filter device 10L according to Example 11.

Table 9 shows circuit parameters of filter device 500E according to Comparative Example 5, filter device 500F according to Comparative Example 6, filter device 10K according to Example 10, and filter device 10L according to Example 11.

TABLE 9

|  |  |  | Reso. freq. fr (MHz) | A-reso. freq. fa (MHz) | Fract. BW BWR (%) | ES cap. (pF) | ES cap. dens. Cz (fF/μm²) | Size (μm²) |
|---|---|---|---|---|---|---|---|---|
| Comp. Ex. 5 | S-arm ckt | s1 | 840 | 878 | 4.52 | 3.00 | 130.00 | 23077 |
|  | P-arm ckt | p1 | 800 | 836 | 4.50 | 4.00 | 130.00 | 30769 |
| Comp. Ex. 6 | S-arm ckt | s1 | 840 | 878 | 4.52 | 6.00 | 130.00 | 46154 |
|  | P-arm ckt | p1 | 800 | 836 | 4.50 | 4.00 | 130.00 | 30769 |
| Ex. 10 | S-arm ckt | s1 | 840 | 911 | 8.45 | 1.55 | 130.00 | 11923 |
|  | 11s | Cs1 |  |  |  | 1.45 | 300.00 | 4833 |
|  |  |  | 840 | 878 | 4.52 | 3.00 |  | 16756 |
|  | P-arm ckt | p1 | 800 | 836 | 4.50 | 4.00 | 130.00 | 30769 |
| Ex. 11 | S-arm ckt | s1 | 840 | 911 | 8.45 | 3.10 | 130.00 | 23846 |
|  | 11s | Cs1 |  |  |  | 2.90 | 300.00 | 9667 |
|  |  |  | 840 | 878 | 4.52 | 6.00 |  | 33513 |
|  | P-arm ckt | p1 | 800 | 836 | 4.50 | 4.00 | 130.00 | 30769 |

Filter device 500E according to Comparative Example 5 illustrated in FIG. 16A includes series-arm resonator s1, parallel-arm resonator p1, and input/output terminals T1 and T2. Series-arm resonator s1 is included in a series-arm circuit. Parallel-arm resonator p1 is included in a parallel-arm circuit connected to node x1 on a path that connects input/output terminals T1 and T2 and the ground. Filter device 500E does not include a capacitor connected in parallel to any of the resonators. Radio-frequency power Pin is applied through input/output terminal T1.

Filter device 500F according to Comparative Example 6 illustrated in FIG. 16B includes two series-arm resonators s1 connected in series, parallel-arm resonator p1, and input/output terminals T1 and T2. Two series-arm resonators s1 connected in series are included in a single series-arm circuit. Parallel-arm resonator p1 is included in a parallel-arm circuit connected to the ground and node x1 on a path that connects input/output terminals T1 and T2. Filter device 500F does not include a capacitor connected in parallel to a resonator. Radio-frequency power Pin is applied through input/output terminal T1. Filter device 500F according to Comparative Example 6 is different from filter device 500E according to Comparative Example 5 in a configuration in which the series-arm resonators of the series-arm circuit connected to input/output terminal T1 are serially divided. According to this configuration, as compared with filter device 500E according to Comparative Example 5, a potential difference (voltage) across each series-arm resonator s1 connected to input/output terminal T1 through which radio-frequency power is applied can be decreased, and thus power durability of filter device 500F can be improved. Note that according to this configuration, impedance of the series-arm circuit is the same as that of the series-arm circuit of filter device 500E according to Comparative Example 5, and thus filter device 500F has the same passing characteristics as those of filter device 500E. Yet, impedance of each of two series-arm resonators s1 connected in series decreases (electrostatic capacitance increases), and thus the size increases.

Filter device 10K according to Example 10 illustrated in FIG. 17A includes series-arm circuit 11s, parallel-arm resonator p1, and input/output terminals T1 and T2. Filter device 10K has the same circuit configuration as that of filter device 10A according to Example 1. Electrostatic capacitance density Cz (Cs1) of capacitor Cs1 is higher than electrostatic capacitance density Cz (s1) of series-arm resonator s1. Filter device 10K according to Example 10 is different from filter device 10A according to Example 1 in that radio-frequency power Pin is applied through input/output terminal T1, and the fractional bandwidth of series-arm resonator s1 is wider than the fractional bandwidth of parallel-arm resonator p1.

In filter device 10K according to Example 10, series-arm resonator s1 is a resonator having a wide fractional bandwidth and the fractional bandwidth of the resonance circuit (series-arm circuit 11s) is decreased by capacitor Cs1, so that the fractional bandwidth of the resonance circuit is made the same as the fractional bandwidth of the series-arm circuit of filter device 500E according to Comparative Example 5.

Here, in filter device 10K according to Example 10, series-arm circuit 11s is connected, not via a series-arm circuit that includes an acoustic wave resonator or a parallel-arm circuit that includes an acoustic wave resonator, to a terminal through which radio-frequency power is applied out of input/output terminals T1 and T2.

Series-arm resonator s1 has the lowest power durability at antiresonant frequency fas1 thereof. Antiresonant frequency Fas1 of series-arm circuit 11s constituted by series-arm resonator s1 and capacitor Cs1 connected in parallel is lower than antiresonant frequency fas1 of series-arm resonator s1. Accordingly, power consumption can be reduced at antiresonant frequency fas1 at which power durability of series-arm resonator s1 is low. Accordingly, power durability of series-arm circuit 11s can be improved, and power durability of filter device 10K can be increased.

Filter device 10L according to Example 11 illustrated in FIG. 17B includes series-arm circuit 11s constituted by two resonance circuits connected in series, parallel-arm resonator p1, and input/output terminals T1 and T2. Each of the two above resonance circuits is constituted by series-arm resonator s1 and capacitor Cs1 connected in parallel.

In this example, series-arm circuit 11s is connected in series to a path that connects input/output terminals T1 and T2, not via an acoustic wave resonator. Series-arm circuit 11s has a configuration in which two resonance circuits are connected in series to each other, each of the two resonance circuits being constituted by series-arm resonator s1 and capacitor Cs1 connected in parallel. Series-arm resonator s1 is a first acoustic wave resonator connected in parallel to capacitor Cs1, and capacitor Cs1 is a first capacitor connected in parallel to series-arm resonator s1. Electrostatic capacitance density Cz (Cs1) of capacitor Cs1 is higher than electrostatic capacitance density Cz (s1) of series-arm resonator s1.

Parallel-arm resonator p1 is included in a parallel-arm circuit connected to node x1 on the path and the ground.

Radio-frequency power Pin is applied through input/output terminal T1.

Power durability of the acoustic wave resonators has a correlation with voltages across the elements and the circuits.

Table 10 shows voltages across the circuit elements in filter device 500E according to Comparative Example 5, filter device 500F according to Comparative Example 6, filter device 10K according to Example 10, and filter device 10L according to Example 11.

TABLE 10

| Apply power thru T1 | Highest voltage (V) | | | |
|---|---|---|---|---|
| 1 W (30 dBm) | Comp. Ex. 5 | Comp. Ex. 6 | Ex. 10 | Ex. 11 |
| S-arm resonator s1 | 19.84 | 9.92 | | |
| S-arm ckt 11s | | | 19.41 | 9.60 |
| P-arm resonator p1 | 9.76 | 9.64 | 9.76 | 9.66 |

| Apply power thru T2 | Highest voltage (V) | | | |
|---|---|---|---|---|
| 1 W (30 dBm) | Comp. Ex. 5 | Comp. Ex. 6 | Ex. 10 | Ex. 11 |
| S-arm resonator s1 | 18.05 | 9.02 | | |
| S-arm ckt 11s | | | 17.64 | 8.71 |
| P-arm resonator p1 | 18.45 | 18.45 | 18.14 | 18.25 |

As illustrated in Table 10, voltages across series-arm/parallel-arm circuits connected to a terminal through which power is applied are high. When power is applied through input/output terminal T1, a voltage across series-arm circuit 11s connected to input/output terminal T1 is high, whereas when power is applied through input/output terminal T2, a voltage across parallel-arm resonator p1 connected to input/output terminal T2 is high. Accordingly, a series-arm circuit and/or a parallel-arm circuit connected to a terminal through which power is applied are/is to be serially divided. Note that when serially dividing the circuit(s), impedance of each element and each circuit is to be lowered (electrostatic capacitance thereof is to be increased), and thus the filter device can be miniaturized by adopting a resonance circuit constituted by an acoustic wave resonator and a capacitor connected in parallel.

According to the above configuration, a voltage across series-arm circuit 11s of filter device 10L connected to input/output terminal T1 through which radio-frequency power is applied can be made lower than filter device 10K according to Example 10, and thus filter device 10L has greater power durability than that of filter device 10K.

Generally, if a configuration in which one series-arm resonator or one parallel-arm resonator is serially divided (a configuration in which a plurality of resonators are connected in series) is adopted, a total size of the resonators is obtained by multiplying a squared total number of resonators as a result of being serially divided, by the size of a resonator not serially divided. In Comparative Example 6, the series-arm circuit has a configuration in which two series-arm resonators are connected in series (a total number of resonators as a result of being serially divided is 2), and thus the size of the series-arm circuit in Comparative Example 6 is 4 times the size of the series-arm circuit in Comparative Example 5 which includes one series-arm resonator (not serially divided). Specifically, as shown in Table 9, in Comparative Example 5, the size of series-arm resonator s1 is 23077 µm², whereas in Comparative Example 6, a total size of two series-arm resonators s1 is 92308 µm² (46154 µm²×2).

In contrast, as illustrated in Table 9, in Example 10, the size of series-arm circuit 11s is 16756 µm², whereas in Example 11, the size of series-arm circuit 11s is 47692 µm² (23846 µm²×2). Specifically, in Example 11, series-arm circuit 11s includes two resonance circuits, yet an increase in size thereof is just 2.8 times the series-arm circuit in Example 10 that includes one resonance circuit.

On the other hand, if the comparative examples are compared with examples, in Comparative Example 5, the size of series-arm resonator s1 is 23077 µm², whereas in Example 10, the size of series-arm circuit 11s is 16756 µm². In Comparative Example 6, a total size of two series-arm resonators s1 is 92308 µm², whereas in Example 11, a total size of two series-arm resonators s1 is 47692 µm².

Specifically, even if a series-arm circuit (or a parallel-arm circuit) is serially divided to improve power durability, a feature that electrostatic capacitance density Cz (Cs1) (or Cz (Cp1)) of capacitor Cs1 (or Cp1) is higher than electrostatic capacitance density Cz (s1) (or Cz (p1)) of series-arm resonator s1 (parallel-arm resonator p1) achieves reduction in the size of the series-arm circuit (or the parallel-arm circuit).

When high power is applied to the series-arm circuit or the parallel-arm circuit that includes an acoustic wave resonator, the acoustic wave resonator may be damaged. Accordingly, use of a circuit constituted by a plurality of resonators connected in series is a typical measure. In this case, each of the resonators connected in series in the circuit is to have a great electrostatic capacitance, which results in an increase in the size of the circuit, namely the resultant acoustic wave resonator.

According to the above configuration, a plurality of resonance circuits are connected in series not via acoustic wave resonators in a series-arm circuit or a parallel-arm circuit that includes an acoustic wave resonator and is connected to a terminal through which power is applied, and thus power durability of the series-arm circuit/the parallel-arm circuit can be ensured. Accordingly, a small filter device having ensured power durability can be achieved.

Furthermore, from the viewpoint of resonance characteristics of a resonance circuit, a series-arm circuit or a parallel-arm circuit connected to a terminal through which power is applied is achieved by a resonance circuit constituted by an acoustic wave resonator and a capacitor connected in parallel, thus improving power durability. Here, when no capacitor Cx is included and only acoustic wave resonator reso1 is included, a voltage across acoustic wave resonator reso1 is the highest at antiresonant frequency fa, and thus antiresonant frequency fa is a frequency at which power durability is the lowest.

In contrast, if capacitor Cx is connected in parallel to acoustic wave resonator reso1, power durability improves due to: (1) antiresonant frequency Fa of a resonance circuit is spaced apart from antiresonant frequency fa of acoustic wave resonator reso1 at which power durability is the lowest, and (2) power durability improves by distributing power to be consumed to acoustic wave resonator reso1 having electrostatic capacitance $C_0$ and capacitor Cx.

[1.11 Multiplexers According to Examples 12 and 13]

The multiplexers according to the present embodiment each include a plurality of filters that include the filter device (10A to 10L) according to any of Examples 1 to 11, and each have a configuration in which input terminals or output terminals of the filters are directly or indirectly connected to a common terminal.

Figure 18A:
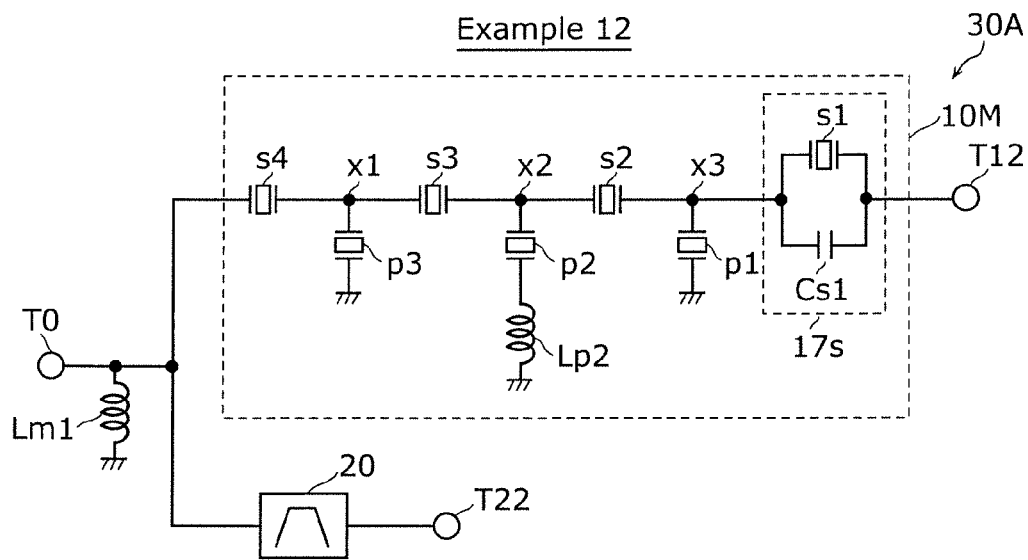
FIG. 18A illustrates a circuit configuration of a multiplexer according to Example 12.

FIG. 18A illustrates a circuit configuration of multiplexer 30A according to Example 12. Multiplexer 30A illustrated in FIG. 18A includes filters 10M and 20, common terminal T0, input/output terminals T12 and T22, and inductor Lm1.

Filter 10M is connected to common terminal T0 and input/output terminal T12, filter 20 is connected to common terminal T0 and input/output terminal T22, and inductor Lm1 is connected to common terminal T0 and the ground. Note that filters 10M and 20 may not be directly connected to common terminal T0 as illustrated in FIG. 18A, and may be indirectly connected to common terminal T0 via, for example, an impedance matching circuit, a phase shifter, a circulator, or a switch element that can select two or more filters.

Filter 10M includes series-arm circuit 17s, series-arm resonators s2, s3, and s4, parallel-arm resonators p1, p2, and p3, and inductor Lp2. Series-arm resonators s4, s3, and s2 and series-arm circuit 17s are connected in series to a path that connects common terminal T0 and input/output terminal T12 in the stated order.

Series-arm circuit 17s is a resonance circuit that includes series-arm resonator s1 and capacitor Cs1. Series-arm resonator s1 is a first acoustic wave resonator connected in parallel to capacitor Cs1, and capacitor Cs1 is a first capacitor connected in parallel to series-arm resonator s1.

Series-arm resonators s2, s3, and s4 are each included in a series-arm circuit.

Parallel-arm resonator p1 is a parallel-arm circuit connected to node x3 on the path and the ground. A circuit constituted by parallel-arm resonator p2 and inductor Lp2 connected in series is a parallel-arm circuit connected to node x2 on the path and the ground. Parallel-arm resonator p3 is a parallel-arm circuit connected to node x1 on the path and the ground.

Electrostatic capacitance density Cz (Cs1) of capacitor Cs1 is higher than electrostatic capacitance density Cz (s1) of series-arm resonator s1.

Further, filter 10M according to Example 12 has the following features.
(1) The fractional bandwidth of series-arm resonator s1 is greater than the fractional bandwidth of each of series-arm resonators s2, s3, and s4 and parallel-arm resonators p1, p2, and p3.
(2) The electrostatic capacitance of series-arm circuit 17s is greater than electrostatic capacitance of each of series-arm resonators s2, s3, and s4 and parallel-arm resonators p1, p2, and p3.

Note that in filter 10M according to Example 12, series-arm resonator s1 and series-arm circuit 17s may not satisfy (1) and (2) above. In features (1) and (2) above, the fractional bandwidth and electrostatic capacitance of series-arm resonator s1 and series-arm circuit 17s are compared with the fractional bandwidth and electrostatic capacitance of each of series-arm resonators s2, s3, and s4 and parallel-arm resonators p1, p2, and p3, yet it is sufficient if the fractional bandwidths and electrostatic capacitance of series-arm resonator s1 and series-arm circuit 17s satisfy conditions by comparing with the fractional bandwidth and electrostatic capacitance of at least one of series-arm resonators s2, s3, and s4 or parallel-arm resonators p1, p2, and p3.

The following conditions may be satisfied depending on a band to be used, although the conditions are not satisfied in Example 12.

(3) The fractional bandwidth of series-arm circuit 17s is narrower than or equal to the fractional bandwidth of each of series-arm resonators s2, s3, and s4 and parallel-arm resonators p1, p2, and p3.

According to the above configuration, filter 10M is included in a multi-level ladder filter circuit that includes one or more series-arm circuits and one or more parallel-arm circuits. As in this example, a filter device that satisfies requirement specification of a band to be used can be achieved by adjusting the number of series-arm circuits and the number of parallel-arm circuits. Note that the configuration of filter 10M is not limited to the above configurations, and may be a configuration that includes a circuit configuration of the filter device (10A to 10L) according to any one of Examples 1 to 11.

Filter 20 has a passband having a frequency range different from that of the passband of filter 10M, and a circuit configuration thereof is not limited to the above configurations.

This example describes an example case where filter 10M is applied as an LTE Band 20 receiving filter (receiving passband: 791 to 821 MHz, attenuation (transmission) band: 832 to 862 MHz). Furthermore, this example describes an example case where filter 20 is applied as an LTE Band 8 receiving filter (receiving passband: 925 to 960 MHz, attenuation (transmission) band: 880 to 915 MHz).

According to the above configuration, since multiplexer 30A includes filter 10M that includes series-arm circuit 17s, a miniaturized multiplexer can be provided while maintaining filter characteristics of filter 10M.

Figure 18B:
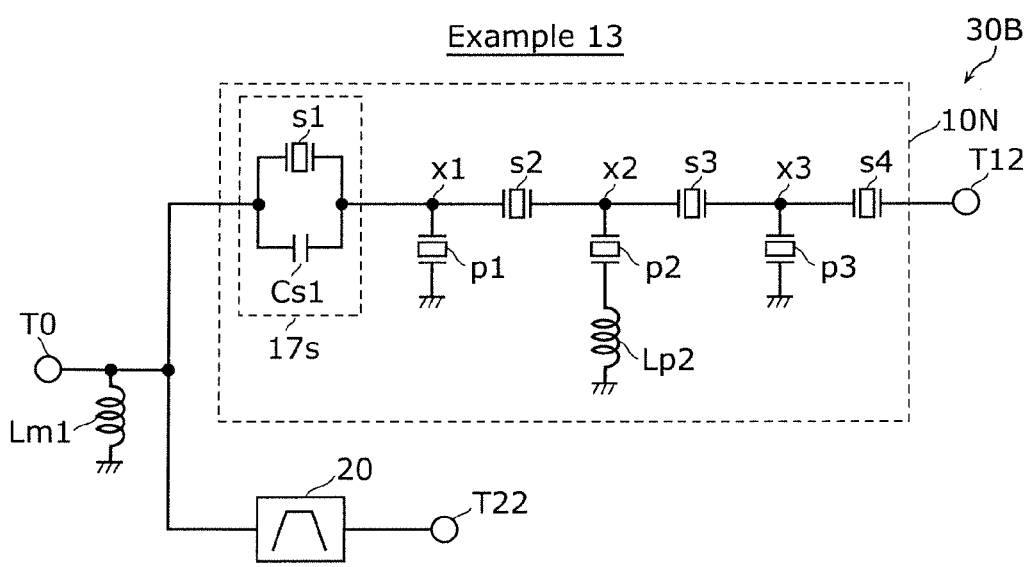
FIG. 18B illustrates a circuit configuration of a multiplexer according to Example 13.

FIG. 18B illustrates a circuit configuration of multiplexer 30B according to Example 13. Multiplexer 30B illustrated in FIG. 18B includes filters 10N and 20, common terminal T0, input/output terminals T12 and T22, and inductor Lm1. Multiplexer 30B according to Example 13 is different from multiplexer 30A according to Example 12 only in the circuit configuration of filter 10N. In the following, description of common points of multiplexer 30B according to Example 13 to those of multiplexer 30A according to Example 12 is omitted, and different points are mainly described.

Filter 10N is connected to common terminal T0 and input/output terminal T12, filter 20 is connected to common terminal T0 and input/output terminal T22, and inductor Lm1 is connected to common terminal T0 and the ground.

Filter 10N includes series-arm circuit 17s, series-arm resonators s2, s3, and s4, parallel-arm resonators p1, p2, and p3, and inductor Lp2. Series-arm circuit 17s and series-arm resonators s2, s3, and s4 are connected in series to a path that connects common terminal T0 and input/output terminal T12 in the stated order.

Parallel-arm resonator p1 is a parallel-arm circuit connected to node x1 on the path and the ground. A circuit constituted by parallel-arm resonator p2 and inductor Lp2 connected in series is a parallel-arm circuit connected to node x2 on the path and the ground. Parallel-arm resonator p3 is a parallel-arm circuit connected to node x3 on the path and the ground.

Electrostatic capacitance density Cz (Cs1) of capacitor Cs1 is higher than electrostatic capacitance density Cz (s1) of series-arm resonator s1.

According to the above configuration, common terminal T0 and series-arm circuit 17s are connected to each other not via a series-arm circuit that includes an acoustic wave resonator or a parallel-arm circuit that includes an acoustic wave resonator. The passband of filter 10N is located in a lower frequency range than the passband of filter 20. In other words, filter 20 that is at least one of the filters except filter 10N has a passband having a frequency range higher than the frequency range of the passband of filter 10N.

This example also describes an example case in which filter 10N is applied as an LTE Band 20 receiving filter (receiving passband: 791 to 821 MHz, attenuation (transmission) band: 832 to 862 MHz), similarly to Example 12. Furthermore, this example describes an example case in which filter 20 is applied as an LTE Band 8 receiving filter (receiving passband: 925 to 960 MHz, attenuation (transmission) band: 880 to 915 MHz).

Table 11 shows circuit parameters of filter 10M according to Example 12, and circuit parameters of filter 10N according to Example 13.

TABLE 11

|  |  |  | Reso. freq. fr (MHz) | A-reso. freq. fa (MHz) | Fract. BW BWR (%) | ES cap. (pF) | ES cap. dens. Cz (fF/$\mu m^2$) | Size ($\mu m^2$) |
|---|---|---|---|---|---|---|---|---|
| Ex. 12 | S-arm ckt | s1 | 819.9 | 887.0 | 8.18 | 6.02 | 130.00 | 46292 |
|  | 17s | Cs1 |  |  |  | 2.50 | 300.00 | 8333 |
|  |  |  | 819.9 | 868.0 | 5.87 | 8.52 |  | 54626 |
| Ex. 13 | S-arm ckt | s2 | 806.6 | 843.0 | 4.51 | 1.45 | 130.00 | 11138 |
|  | S-arm ckt | s3 | 808.2 | 845.0 | 4.55 | 1.46 | 130.00 | 11246 |
|  | S-arm ckt | s4 | 796.6 | 832.0 | 4.44 | 8.10 | 130.00 | 62315 |
|  | P-arm ckt | p1 | 778.9 | 812.5 | 4.31 | 2.22 | 130.00 | 17038 |
|  | P-arm ckt | p2 | 770.7 | 803.5 | 4.26 | 7.61 | 130.00 | 58500 |
|  | P-arm ckt | p3 | 769.2 | 801.5 | 4.20 | 4.71 | 130.00 | 36262 |

According to the above configuration, since multiplexer 30B includes filter 10N that includes series-arm circuit 17s similarly to Example 12, a miniaturized multiplexer can be provided while maintaining filter characteristics of filter 10N.

Figure 19A:
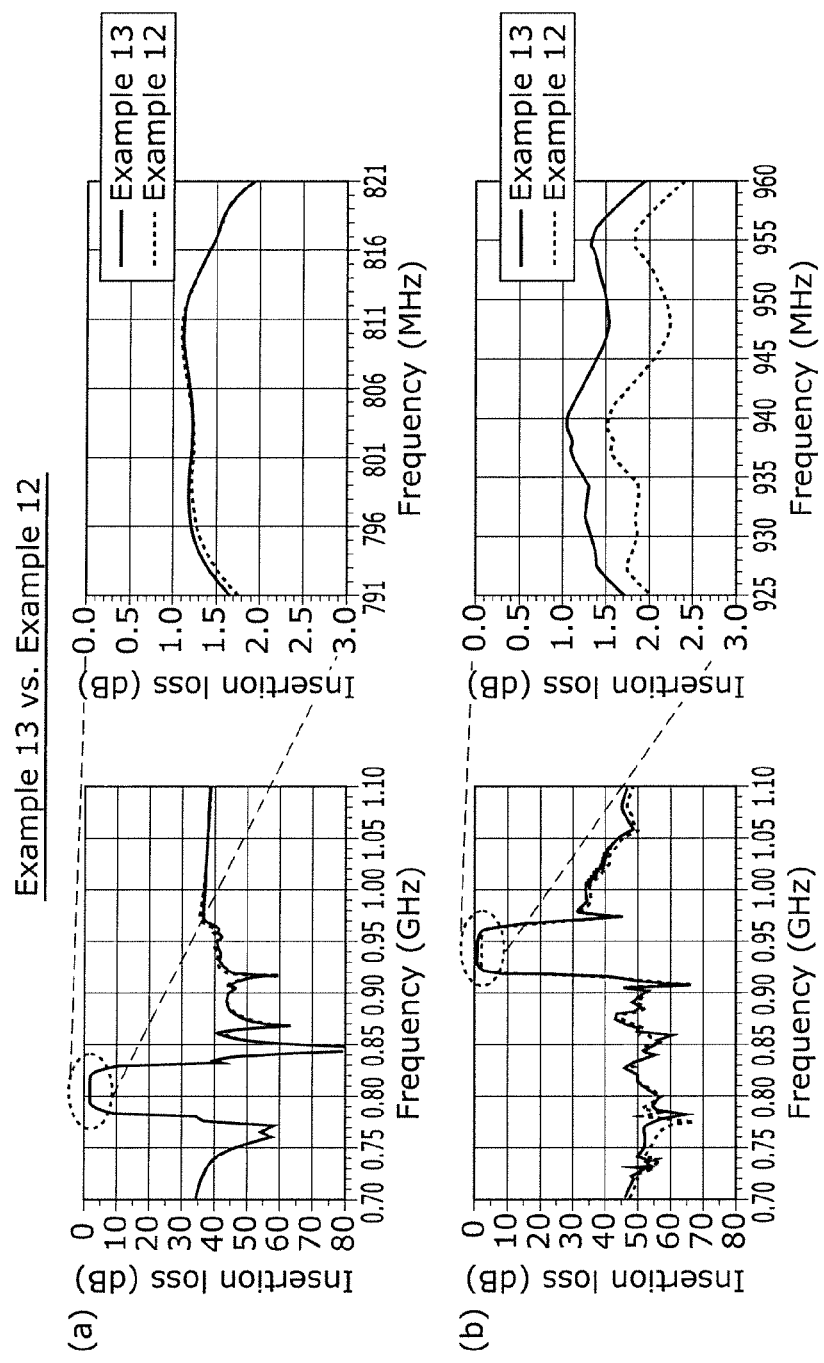
FIG. 19A illustrates graphs showing comparisons of passing characteristics of the multiplexers according to Examples 12 and 13.
Figure 19B:
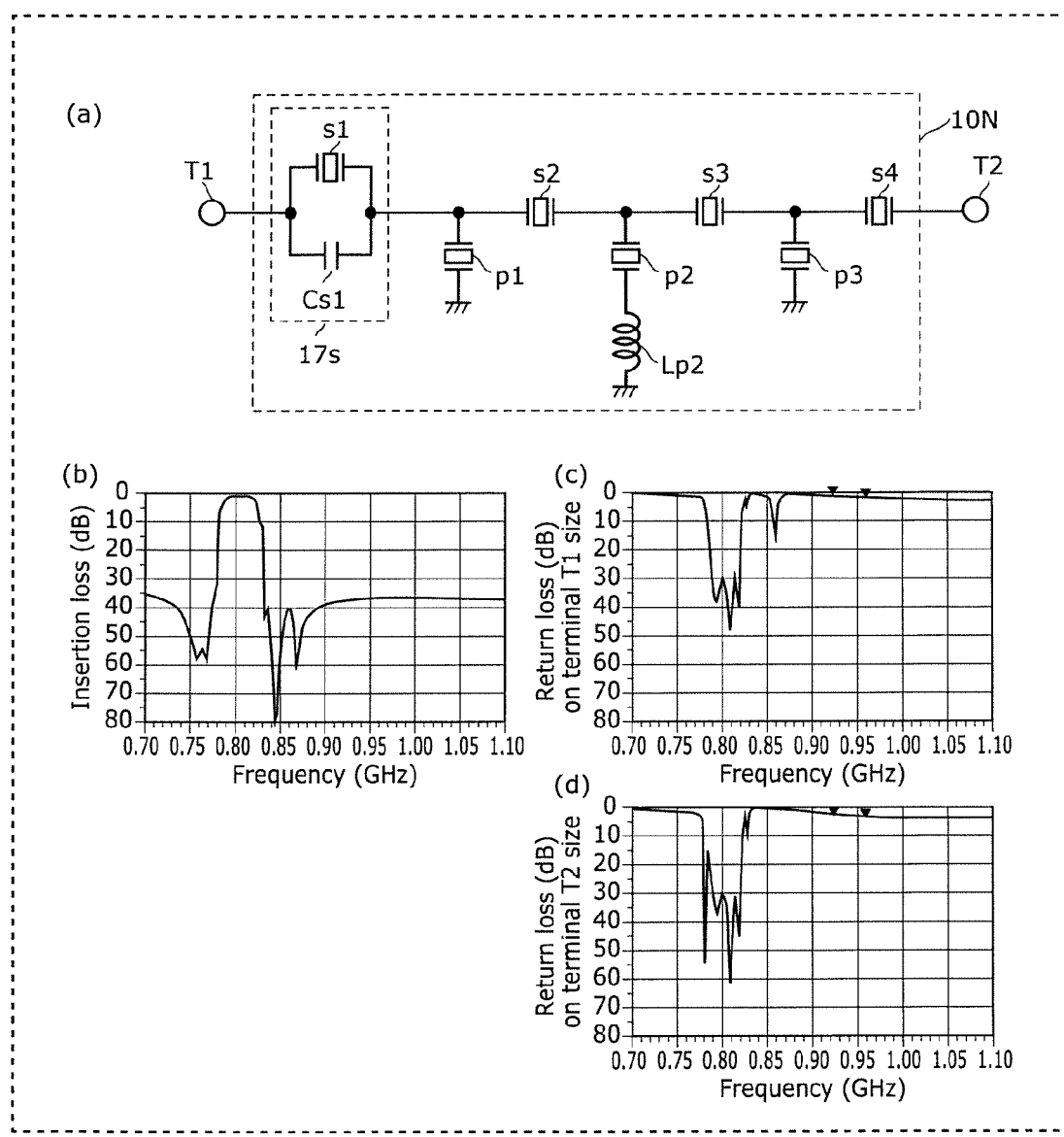
FIG. 19B illustrates graphs showing passing characteristics and return characteristics of a filter having a lower frequency passband according to Example 13.
Figure 19C:
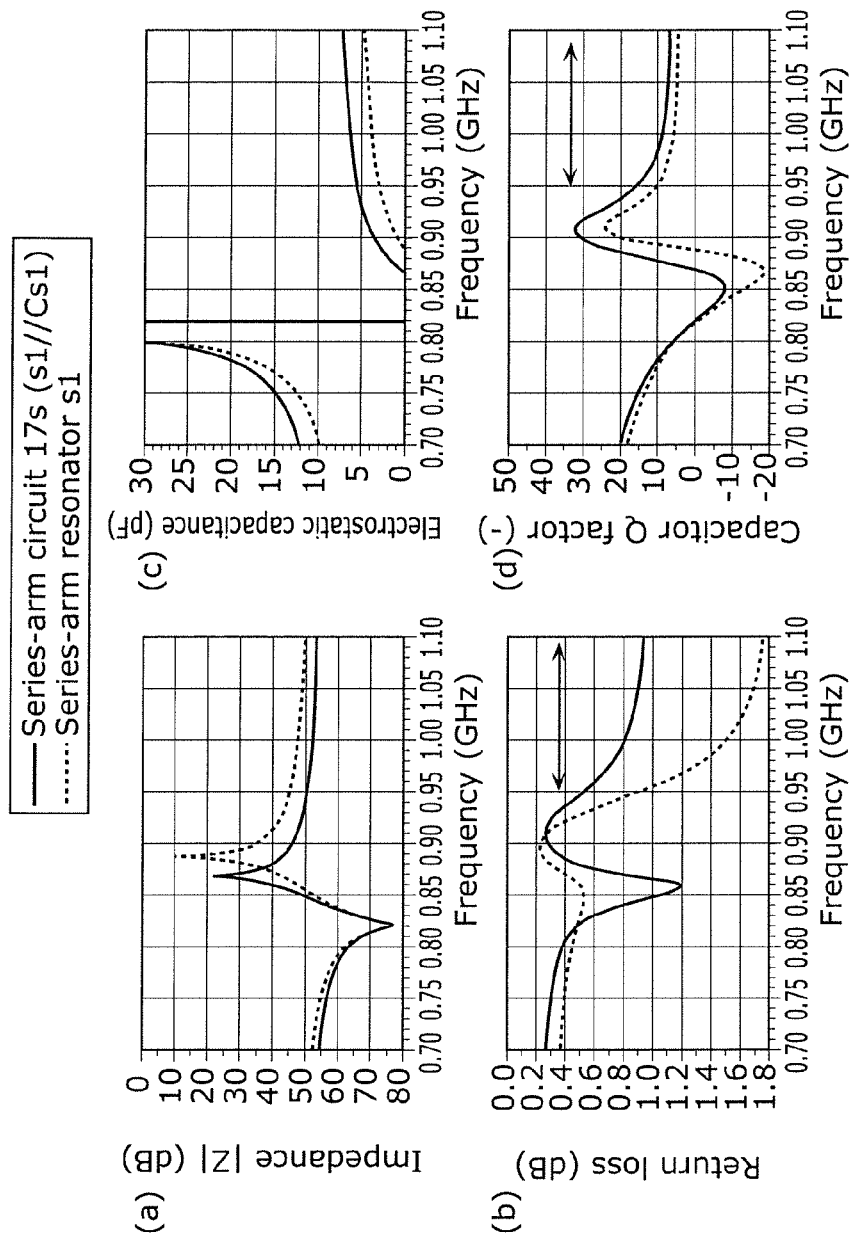
FIG. 19C illustrates graphs showing impedance characteristics, return characteristics, and capacitance characteristics of a resonance circuit of the filter having a lower frequency passband according to Example 13.

FIG. 19A illustrates graphs showing comparisons of passing characteristics of multiplexer 30A according to Example 12 and multiplexer 30B according to Example 13. FIG. 19B illustrates graphs showing passing characteristics and return characteristics of filter 10N alone according to Example 13. FIG. 19C illustrates graphs showing impedance characistics, return characteristics, and capacitance characteristics of series-arm circuit 17s and series-arm resonator s1 of filter 10N according to Example 13.

Here, in filter 10M according to Example 12, the series-arm circuit connected to common terminal T0 includes only series-arm resonator s4. On the other hand, in filter 10N according to Example 13, series-arm circuit 17s connected to common terminal T0 includes a resonance circuit constituted by series-arm resonator s1 and capacitor Cs1 connected in parallel.

As illustrated in (b) of FIG. 19C, loss due to bulk waves radially traveling (bulk wave loss) occurs in a frequency region having a higher frequency range than the antiresonant frequency of the series-arm resonator, and the series-arm resonator operates as a capacitor having a low Q factor in the frequency region, as illustrated in (d) of FIG. 19C. On the other hand, as illustrated in (b) and (d) of FIG. 19C, the resonance circuit constituted by the series-arm resonator and the capacitor connected in parallel is a circuit constituted by a series-arm resonator that has bulk wave loss and a capacitor that does not have bulk wave loss connected in parallel, and thus a capacitor Q factor improves in a frequency region in which the series-arm resonator has bulk wave loss.

The frequency range of the passband of filter 20 according to Example 12 is higher than the frequency range of the passband of filter 10M according to Example 12, and the frequency range of the passband of filter 20 according to Example 13 is higher than the frequency range of the passband of filter 10N according to Example 13.

Accordingly, there is a concern that insertion loss of filter 20 increases in multiplexer 30A according to Example 12 in which the series-arm circuit connected to common terminal T0 includes only a series-arm resonator. In contrast, insertion loss of filter 20 decreases in multiplexer 30B according to Example 13 in which the series-arm circuit connected to common terminal T0 includes a resonance circuit.

As illustrated in (c) and (d) of FIG. 19B, in filter 10N according to Example 13, return loss in the passband of filter 20 (0.638 to 1.009 dB) on the input/output terminal T1 side where series-arm circuit 17s is connected is smaller than the return loss (1.324 to 1.730 dB) in the passband of filter 20 on the input/output terminal T2 side where series-arm circuit 17s is not connected.

Accordingly, as illustrated in (a) of FIG. 19A, insertion loss of filter 10M according to Example 12 and insertion loss of filter 10N according to Example 13 are substantially the same, whereas as illustrated in (b) of FIG. 19A, insertion loss of filter 20 according to Example 12 is 2.37 dB, but on the contrary, insertion loss of filter 20 according to Example 13 is 1.91 dB. Specifically, insertion loss of filter 20 is less in Example 13 than in Example 12.

As described above, according to filter 10N according to Example 13, power is distributed to series-arm resonator s1 having bulk wave loss and capacitor Cs1 having no bulk wave loss in series-arm circuit 17s, and thus bulk wave loss in series-arm circuit 17s can be decreased. Series-arm circuit 17s is connected to common terminal T0, and thus return loss in the passband of filter 20 in filter 10N when viewed from the common terminal T0 side can be decreased. Accordingly, the insertion loss in the passband of filter 20 having a high frequency range can be decreased.

Note that as an example of a circuit configuration of the multiplexer, a circuit configuration in which two filters are connected to common terminal T0 is described in the present embodiment, yet the number of filters connected to common terminal T0 is not limited to two, and may be three or more.

Specifically, the multiplexer according to the present disclosure includes a plurality of filters that include the filter device according to any of Examples 1 to 11, and the input terminals or the output terminals of the plurality of filters may be directly or indirectly connected to common terminal T0.

One of the series-arm circuit or the parallel-arm circuit that includes a resonance circuit is connected to common terminal T0 not via another series-arm circuit that includes an acoustic wave resonator or another parallel-arm circuit that includes an acoustic wave resonator, and at least one of the filters other than the above filter device may have a passband having a frequency range higher than the frequency range of the passband of the filter device.

[1.12 Filter Device According to Example 14]

In this example, an electrode configuration of the filter device according to any of Examples 1 to 11 described above or the resonance circuit (a series-arm circuit or a parallel-arm circuit) included in the multiplexer according to Example 12 or 13 is to be described.

Figure 20A:
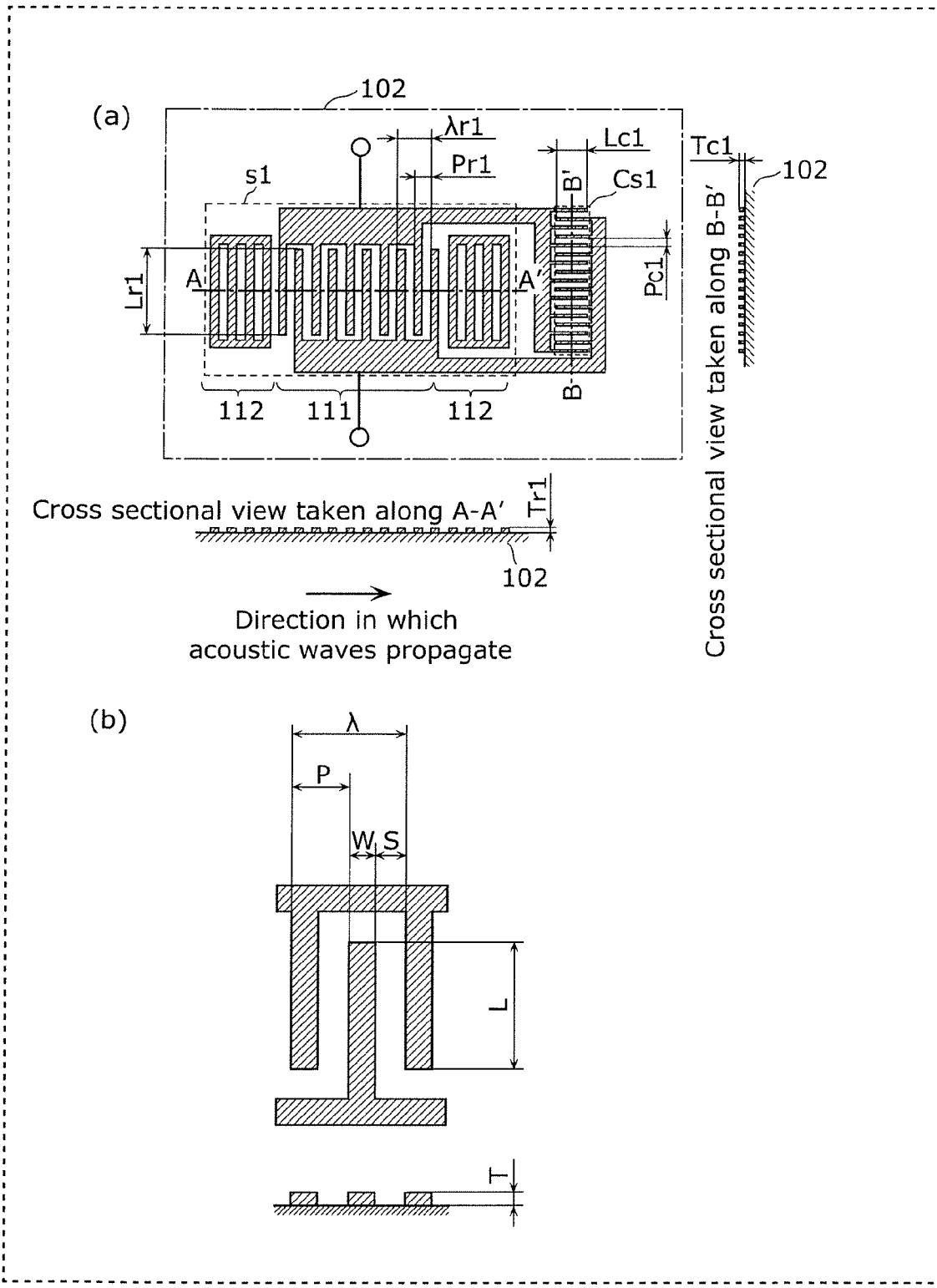
FIG. 20A schematically illustrates a structure of electrodes of a resonance circuit included in the filter devices and the multiplexers according to Embodiment 1.

FIG. 20A schematically illustrates an electrode structure of a resonance circuit included in the filter device and the multiplexer according to Embodiment 1. Specifically, (a) of FIG. 20A illustrates a plan view of an electrode on a substrate of series-arm circuit 11s according to Example 1, a cross-sectional view taken along line A-A' in the plan view, and a cross-sectional view taken along line B-B' in the plan view, and (b) of FIG. 20A illustrates an enlarged view of the electrode. Note that the electrode structure illustrated in FIG. 20A is for describing a typical structure of a comb-shaped capacitor electrode included in series-arm resonator s1 and capacitor Cs1 that are included in series-arm circuit 11s. Accordingly, the numbers and the lengths, for instance, of electrode fingers included in an IDT electrode and a comb-shaped capacitor electrode in resonators are not limited to the number and the length of electrode fingers illustrated in FIG. 20A. The electrode structure illustrated in FIG. 20A is applied not only to the resonance circuit in Example 1, but also to resonance circuits according to other examples.

As illustrated in (a) of FIG. 20A, series-arm resonator s1 includes an IDT electrode formed on piezoelectric substrate 102. Series-arm resonator s1 includes IDT electrode 111, one set of reflectors 112, and piezoelectric substrate 102. IDT electrode 111 includes electrode fingers, and one set of bus bar electrodes facing each other with the electrode fingers therebetween, and has a configuration in which the electrode fingers are alternately connected to one bus bar electrode and the other bus bar electrode in the set. Here, the electrode fingers are formed in a direction orthogonal to the direction in which acoustic waves propagate, and are cyclically formed in the propagation direction. Note that it is sufficient if substrate 102 at least partly has piezoelectric properties.

In series-arm resonator s1 having such a configuration, the wavelength of acoustic waves excited is determined by the design parameter of IDT electrode 111, for instance. The design parameter of IDT electrode 11i is to be described in the following.

Note that although electrode parameters of IDT electrode 11i and capacitor Cs1 are denoted by P, W, S, and L in (b) of FIG. 20A, electrode parameters of IDT electrode 11i are defined as Pr1, Wr1, Sr1, and Lr1, and electrode parameters of capacitor Cs1 are defined as Pc1, Wc1, Sc1, and Lc1 in the following description when referring to (b) of FIG. 20A.

The wavelength of acoustic waves is determined by repeating cycle λr1 of electrode fingers connected to one bus bar electrode among the electrode fingers. Electrode finger pitch (a pitch of electrode fingers, that is, electrode finger cycle) Pr1 is ½ repeating cycle λr1. As illustrated in (b) of FIG. 20A, Pr1 is defined as Pr1=(Wr1+Sr1), where Wr1 denotes the line width of an electrode finger and Sr1 denotes the space width between adjacent electrode fingers (a gap between electrode fingers). Further, crossing width Lr1 of IDT electrode 111 is the length of overlapping electrode fingers when an electrode finger connected to one of the bus bar electrodes in the set and an electrode finger connected to the other bus bar electrode in the set are viewed in the direction in which acoustic waves propagate. The electrode duty ratio (duty ratio) indicates a percentage made up by the line width of each of electrode fingers, and is defined by a proportion of the line width of each of the electrode fingers to a value obtained by adding the line width to the space width, that is, Wr1/(Wr1+Sr1). Thus, the electrode duty ratio of IDT electrode 111 is defined by the proportion of the width of each of the electrode fingers to an electrode finger pitch (a pitch of the electrode fingers), that is, Wr1/Pr1. A pair count is the number of paired electrode fingers, and is substantially half the total number of electrode fingers. For example, Mr1=2Nr1+1 is satisfied, where Nr1 denotes the pair count, and Mr1 denotes a total number of electrode fingers. The thickness of electrode fingers in IDT electrode 111 indicates thickness Tr1 of an electrode film that forms the electrode fingers. Electrostatic capacitance $C_0$ of series-arm resonator s1 is expressed by Expression 5 below.

[Math 5]

$$\text{Electrostatic capacitance } C_0 = \frac{\varepsilon_0 \cdot \varepsilon_r \cdot \text{pair count} \cdot \text{crossing width} \cdot Pr1}{2 \cdot Sr1} \quad \text{(Expression 5)}$$

Note that $\varepsilon_0$ denotes permittivity in a vacuum, and $\varepsilon_r$ denotes permittivity of the surface of substrate 102 that includes the electrodes.

Next, the structure of capacitor Cs1 is to be described.

Capacitor Cs1 includes piezoelectric substrate 102, and comb-shaped capacitor electrode formed on piezoelectric substrate 102. The comb-shaped capacitor electrode includes a plurality of electrode fingers. As illustrated in (a) of FIG. 20A, the comb-shaped capacitor electrode is included in an electrode film, similarly to IDT electrode 111. Specifically, the comb-shaped capacitor electrode included in capacitor Cs1 is formed on piezoelectric substrate 102 on which IDT electrode 111 included in series-arm resonator s1 is formed. Note that the comb-shaped capacitor electrode and IDT electrode 111 may be formed on different piezoelectric substrates.

The comb-shaped capacitor electrode includes a plurality of electrode fingers, and one set of bus bar electrodes facing each other with the electrode fingers therebetween, and has a configuration in which the electrode fingers are alternately connected to one bus bar electrode and the other bus bar electrode in the set. Here, the electrode fingers are formed in the direction in which acoustic waves propagate, and are cyclically formed in the direction orthogonal to the propagation direction.

In capacitor Cs1 having such a configuration, characteristics such as capacitance and a Q factor are determined by design parameters of the comb-shaped capacitor electrode, for instance. The following is to describe the design parameter of the comb-shaped capacitor electrode.

The electrode finger pitch of the comb-shaped capacitor electrode (a pitch of electrode fingers, that is, an electrode finger cycle) Pc1 is defined as Pc1=Wc1+Sdc1 when Wc1 denotes the line width of an electrode finger, and Sdc1 denotes the space width between adjacent electrode fingers (a gap between electrode fingers) as illustrated in (b) of FIG. 20A. The electrode duty ratio (duty ratio) indicates a percentage made up by the line width of each of the electrode fingers, and is defined by a proportion of the line width of each of electrode fingers to a value obtained by adding the line width to the space width, that is, Wc1/(Wc1+Sc1). Thus, the electrode duty ratio is defined by the proportion of the width of each of the electrode fingers to a pitch of the electrode fingers, that is, Wc1/Pc1. A pair count is the number of paired electrode fingers, and is substantially half the total number of electrode fingers. For example, Mc1=2Nc1+1 is satisfied, where Nc1 denotes the pair count, and Mc1 denotes a total number of electrode fingers. The thickness of electrode fingers of the comb-shaped capacitor electrode indicates thickness Tc1 of an electrode film that forms the electrode fingers. Electrostatic capacitance $C_x$ of the comb-shaped capacitor electrode is expressed by Expression 6 below.

[Math 6]

$$\text{Electrostatic capacitance } Cx = \frac{\varepsilon_0 \cdot \varepsilon_r \cdot \text{pair count} \cdot \text{crossing width} \cdot Pc1}{2 \cdot Sc1} \quad \text{(Expression 6)}$$

Next, design parameters of the comb-shaped capacitor electrode included in capacitor Cs1 and IDT electrode 111 of series-arm resonator s1 connected in parallel to capacitor Cs1 are to be described by making comparisons.

In the filter device and the multiplexer according to the present embodiment, gap Sc1 between electrode fingers of capacitor Cs1 is narrower than gap Sr1 between electrode fingers in the IDT electrode of series-arm resonator s1. Expressions 5 and 6 indicate that the narrower pitch Pc1 of and gap Sc1 between electrode fingers are, the greater electrostatic capacitance of the comb-shaped capacitor electrode is and the smaller the size thereof is. According to this, electrostatic capacitance density Cz (Cs1) of capacitor Cs1 can be made higher than electrostatic capacitance density Cz (s1) of series-arm resonator s1, and furthermore capacitor Cs1 can be miniaturized.

Figure 20B:
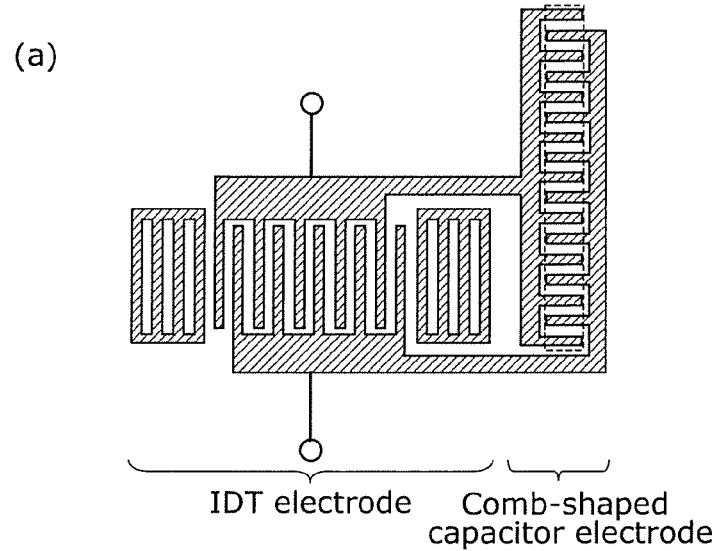
FIG. 20B schematically illustrates a structure of electrodes of a resonance circuit included in a filter device according to a comparative example.
Figure 20B:
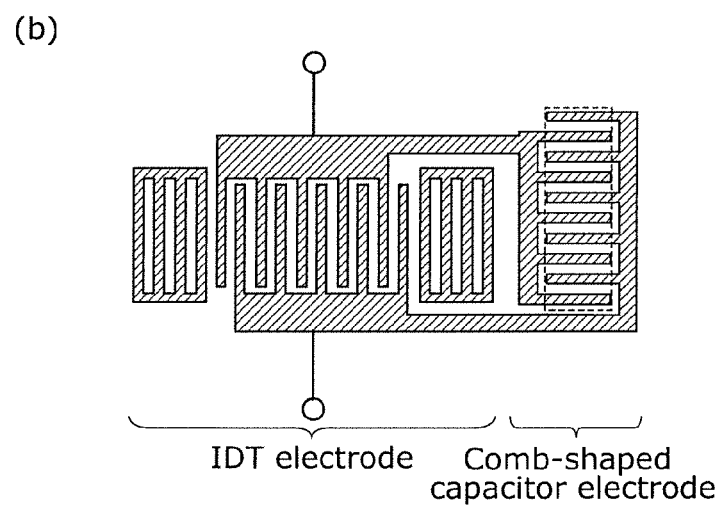

FIG. 20B schematically illustrates the electrode structure of a resonance circuit included in the filter device and the multiplexer according to a comparative example. Parts (a) and (b) of FIG. 20B illustrate the electrode configurations according to which electrostatic capacitance density Cz (Cs1) of capacitor Cs1 is the same as electrostatic capacitance density Cz (s1) of series-arm resonator s1. In (a) of FIG. 20B, the pair count of electrode fingers is high without narrowing pitch Pc1 of and gap Sc1 between electrode fingers to ensure electrostatic capacitance of capacitor Cs1. In (b) of FIG. 20B, to ensure the electrostatic capacitance of capacitor Cs1, the crossing width of electrode fingers is increased without narrowing pitch Pc1 of and gap Sc1 between electrode fingers. According to Expressions 5 and 6 and (a) and (b) of FIG. 20B, the size of capacitor Cs1 cannot be decreased without changing pitch Pc1 of and gap Sc1 between electrode fingers. Accordingly, to increase electrostatic capacitance density Cz (Cs1) of capacitor Cs1, pitch Pc1 of and gap Sc1 between electrode fingers are to be narrowed.

Figure 21A:
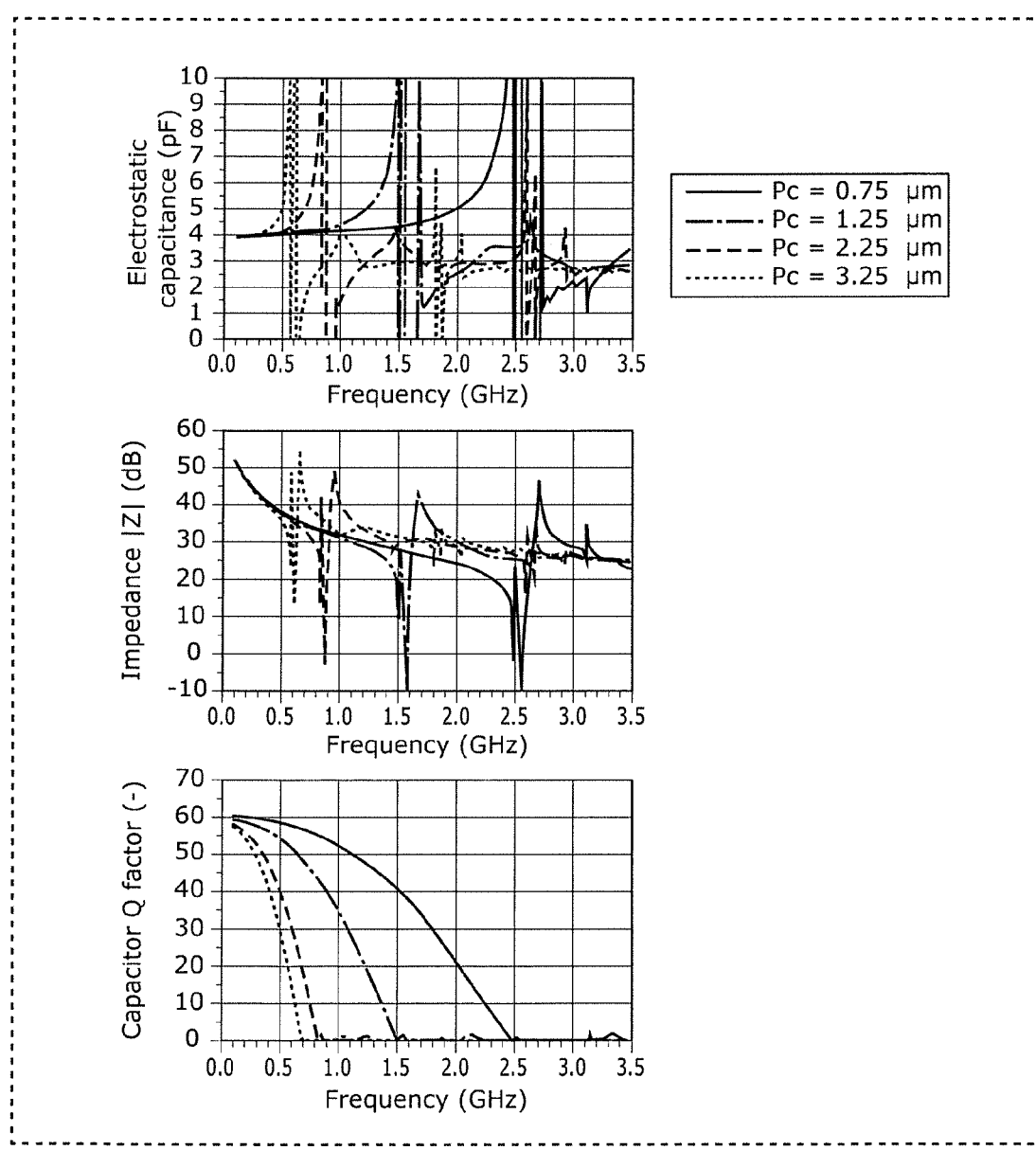
FIG. 21A illustrates graphs showing relations between (i) electrode finger pitches of a comb-shaped capacitor and (ii) capacitance, impedance, and a capacitor Q factor of the comb-shaped capacitor, in a typical example.
Figure 21B:
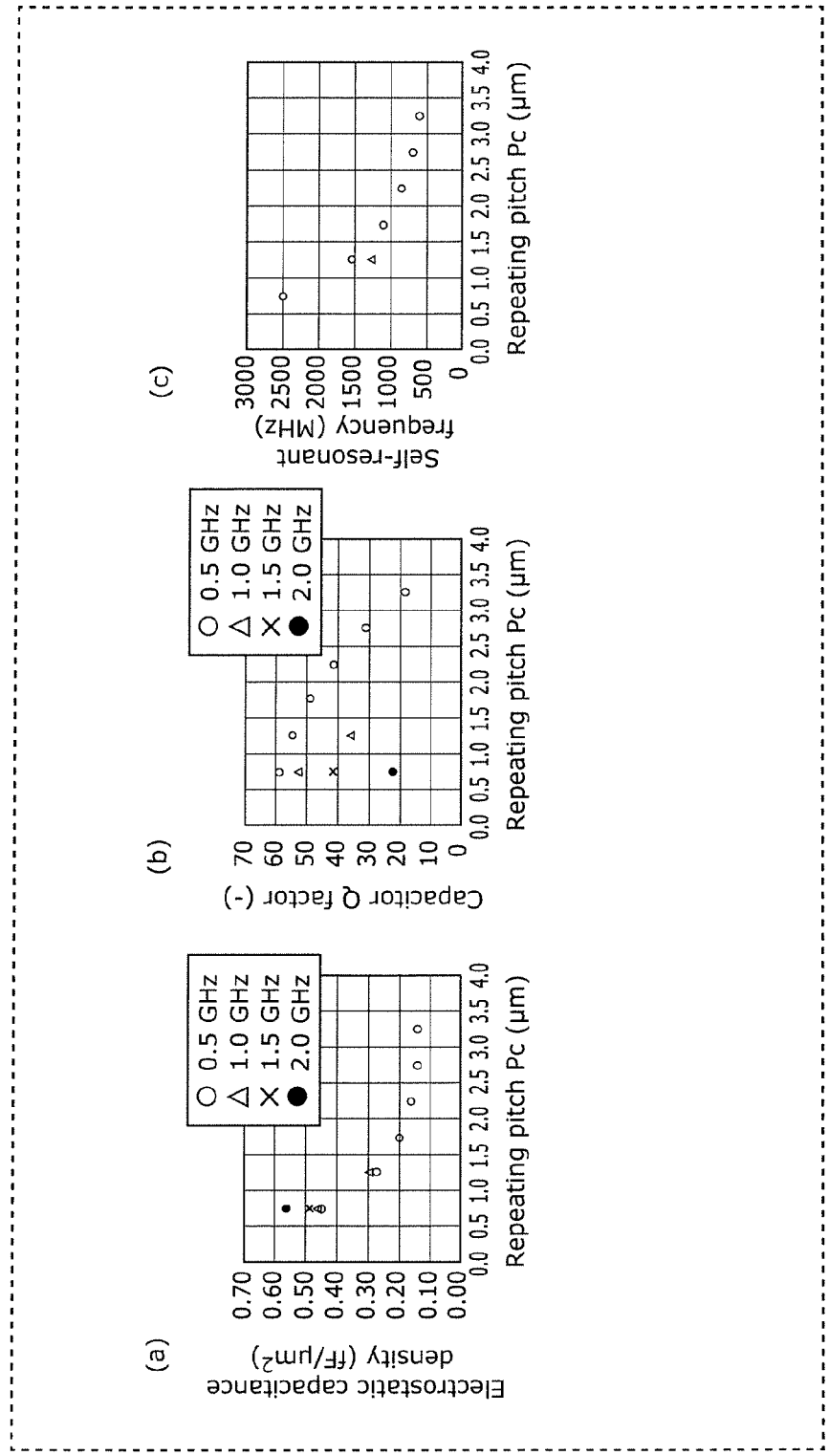
FIG. 21B illustrates graphs showing relations between (i) an electrode finger pitch of a comb-shaped capacitor and (ii) capacitance per unit area, a capacitor Q factor, and a self-resonant frequency of the comb-shaped capacitor, in a typical example.
Figure 21C:
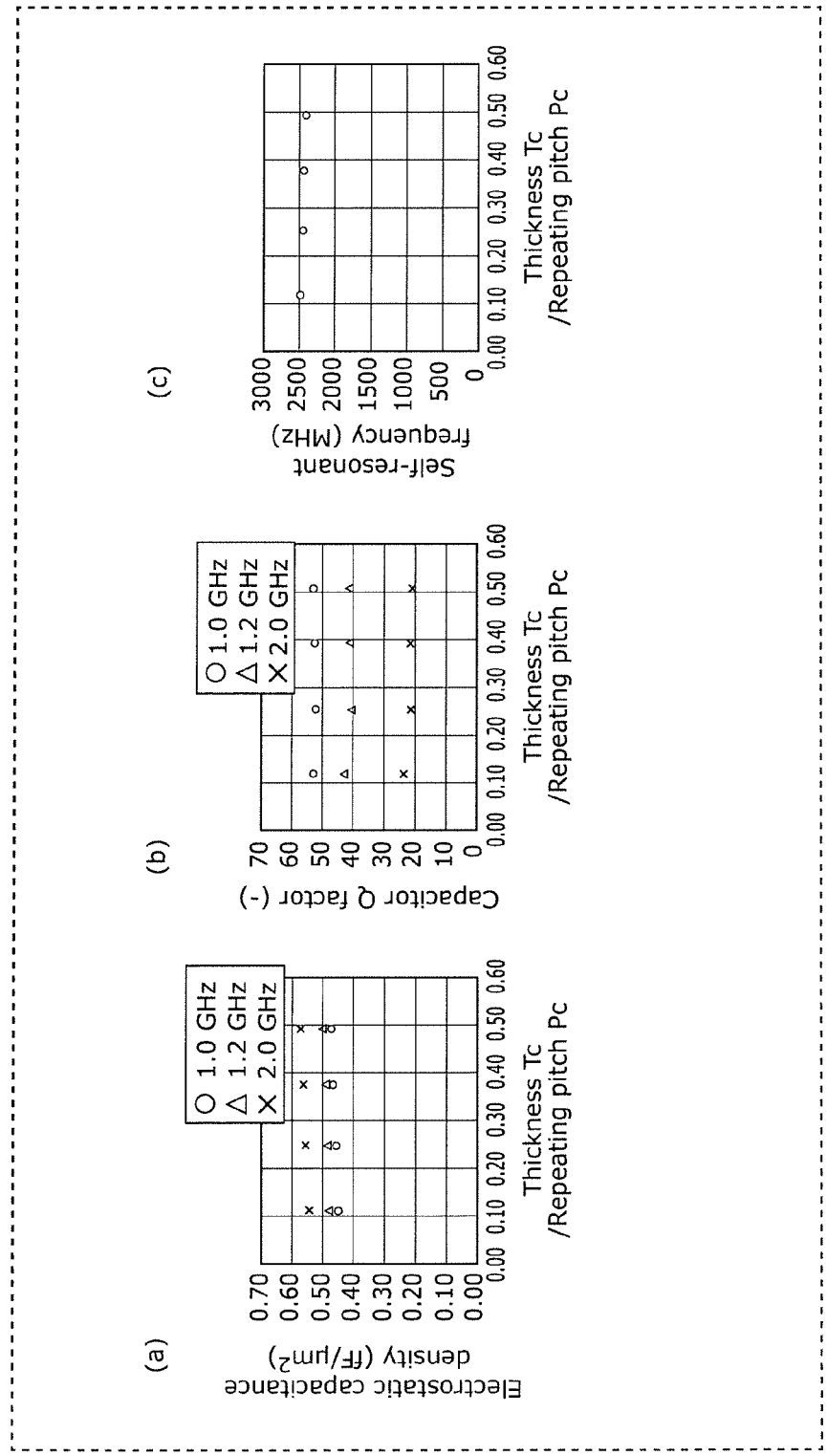
FIG. 21C illustrates graphs showing relations between (i) a proportion of the thickness to an electrode finger pitch of a comb-shaped capacitor and (ii) capacitance per unit area, a capacitor Q factor, and a self-resonant frequency of the comb-shaped capacitor, in a typical example.
Figure 21D:
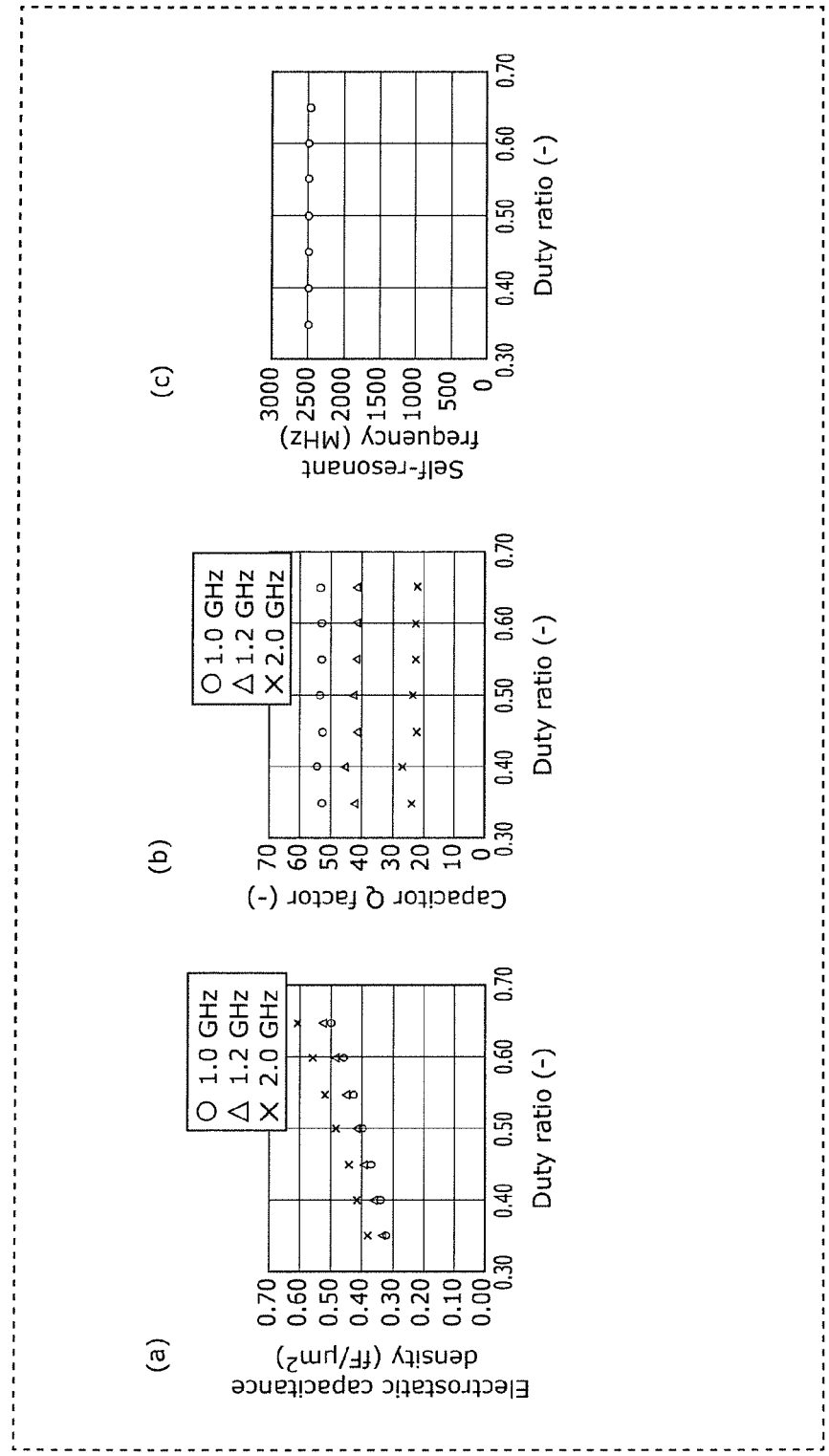
FIG. 21D illustrates graphs showing relations between (i) a duty ratio of a comb-shaped capacitor and (ii) capacitance per unit area, a capacitor Q factor, and self-resonant frequency of the comb-shaped capacitor, in a typical example.

FIG. 21A illustrates graphs showing relations between (i) the electrode finger pitches of the comb-shaped capacitor and (ii) electrostatic capacitance, impedance, and a capacitor Q factor of the comb-shaped capacitor, in a typical example. FIG. 21B illustrates graphs showing relations between (i) the electrode finger pitch of the comb-shaped capacitor and (ii) capacitance per unit area, a capacitor Q factor, and a self-resonant frequency of the comb-shaped capacitor, in a typical example. FIG. 21C illustrates graphs showing relations between (i) a proportion of the thickness of the comb-shaped capacitor to the electrode finger pitch thereof and (ii) capacitance per unit area, a capacitor Q factor, and a self-resonant frequency of the comb-shaped capacitor, in a typical example. FIG. 21D illustrates graphs showing relations between (i) the duty ratio of the comb-shaped capacitor and (ii) capacitance per unit area, a capacitor Q factor, and a self-resonant frequency of the comb-shaped capacitor, in a typical example. Note that the thickness and the duty ratio of the comb-shaped capacitor are constant in the data shown in FIGS. 21A to 21C.

FIGS. 21A and 21B show that the following advantageous effects are obtained if the electrode finger pitch is decreased while the electrode duty ratio is maintained constant.
(1) The self-resonant frequency shifts to a higher frequency (the middle graph in FIG. 21A and (c) of FIG. 21B).
(2) A capacitor Q factor improves (the lower graph in FIG. 21A and (b) of FIG. 21B).
(3) Electrostatic capacitance per unit area increases ((a) of FIG. 21B). Accordingly, the size of capacitor Cs1 is decreased.

Thickness Tc1 of the electrode fingers in capacitor Cs1 may be smaller than thickness Tr1 of the electrode fingers in series-arm resonator s1. As illustrated in FIG. 21C, even if the thickness of electrode fingers is changed, there is no great change in capacitance characteristics such as electrostatic capacitance density, capacitor Q factor, and self-resonant frequency. Note that the electrode finger pitch can be narrowed by decreasing the thickness of electrode fingers. Due to the manufacturing restrictions, the upper limit of the thickness of electrode fingers is about 40% of the electrode finger pitches. Accordingly, the electrode finger pitch can be narrowed by decreasing the thickness of electrode fingers, and thus the electrode finger pitch illustrated in FIG. 21B yields further advantageous effects.

The duty ratio of the comb-shaped capacitor electrode of capacitor Cs1 may be greater than the duty ratio of the IDT electrode of series-arm resonator s1. FIG. 21D shows that if the duty ratio of an electrode is increased, the electrostatic capacitance density is increased, yet a capacitor Q factor and a self-resonant frequency do not change. Accordingly, the above configuration achieves an increase in the electrostatic capacitance density of the comb-shaped capacitor electrode, and thus reduction in the size of capacitor Cs1 and space therefor are achieved.

Note that this example has described a configuration in which a series-arm circuit operates as a resonance circuit, as an example, yet similar advantageous effects are obtained even if, for example, a configuration in which a parallel-arm circuit operates as a resonance circuit as in filter device 10B according to Example 2 is adopted.

Accordingly, the gap between electrode fingers of capacitor Cp1 is narrower than the gap between electrode fingers in the IDT electrode of parallel-arm resonator p1. According to this, capacitor Cp1 can be miniaturized while electrostatic capacitance density Cz (Cp1) of capacitor Cp1 is made higher than electrostatic capacitance density Cz (p1) of parallel-arm resonator p1.

The electrode finger pitch of capacitor Cp1 may be narrower than the electrode finger pitch of parallel-arm resonator p1.

The thickness of electrode fingers in capacitor Cp1 may be thinner than the thickness of a plurality of electrode fingers in parallel-arm resonator p1.

The duty ratio of the comb-shaped capacitor electrode of capacitor Cp1 may be greater than the duty ratio of the IDT electrode of parallel-arm resonator p1.

Note that the electrode finger pitch, the thickness, and the duty ratio, for instance, of each of the elements (series-arm resonator s1, parallel-arm resonator p1, and capacitors Cs1 and Cp1) are not necessarily even, and may be uneven due to variations caused in the manufacturing process, for instance, or due to adjustment of characteristics, for instance. Accordingly, portions of the comb-shaped capacitor electrodes and the IDT electrodes included in the elements may not satisfy the above relations of, for instance, the electrode finger pitch, the thickness, and the duty ratio. However, the relations of the electrode finger pitch, the thickness, and the duty ratio in each of the elements may be substantially satisfied, and may be satisfied based on, for example, an average electrode finger pitch, an average thicknesses, and an average duty ratio of a comb-shaped capacitor electrode/an IDT electrode.

[1.13 Filter Device According to Example 15]

This example describes the electrode configuration of a capacitor included in a resonance circuit (a series-arm circuit or a parallel-arm circuit) included in the filter device according to any one of Examples 1 to 11 described above or the multiplexer according to Example 12 or 13.

Figure 22A:
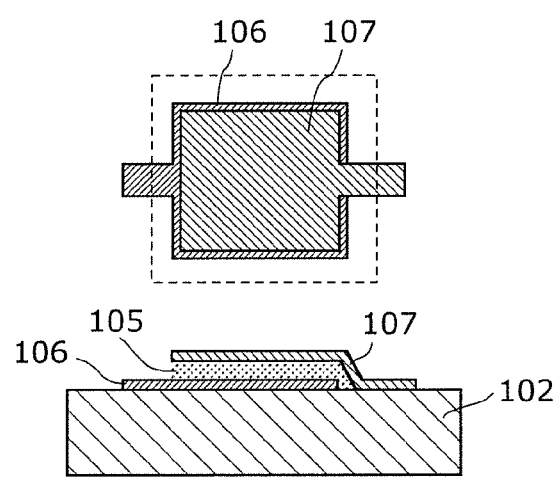
FIG. 22A schematically illustrates an electrode structure of a capacitor included in the filter devices and the multiplexers according to Embodiment 1.

FIG. 22A schematically illustrates the electrode structure of a capacitor included in the filter device and the multiplexer according to Embodiment 1. Specifically, FIG. 22A illustrates a cross-sectional view of an electrode on the substrate of capacitor Cs1 included in series-arm circuit 11s according to Example 1. Capacitor Cs1 has a metal-insulator-metal (MIM) structure. Note that the cross-sectional structure of the electrode of capacitor Cs1 illustrated in FIG. 22A is for describing a typical structure. The structure of the electrode illustrated in FIG. 22A is applied not only to the resonance circuit in Example 1, but also to the resonance circuits in the other examples.

Capacitor Cs1 illustrated in FIG. 22A includes first electrode 106 formed on substrate 102, second electrode 107 facing first electrode 106, and insulating component 105 disposed between first electrode 106 and second electrode 107.

Electrostatic capacitance $C_M$ of the capacitor having the MIM structure illustrated in FIG. 22A is represented by Expression 7.

[Math 7]

$$C_M = \frac{\varepsilon_0 \varepsilon_r S_M}{d} \quad \text{(Expression 7)}$$

In Expression 7, $\varepsilon_0$ denotes a permittivity in a vacuum, $S_M$ denotes an overlapping area of first electrode 106 and second electrode 107 facing each other, and d denotes the thickness of insulating component 105. According to Expression 7, the electrostatic capacitance per unit area can be increased by increasing dielectric constant $\varepsilon_r$ of insulating component 105 and/or by decreasing thickness d of insulating component 105. According to this, electrostatic capacitance density Cz (Cs1) of capacitor Cs1 is made higher than electrostatic capacitance density Cz (s1) of series-arm resonator s1, and at the same time, capacitor Cs1 can be miniaturized. Here, dielectric constant $\varepsilon_r$ of insulating component 105 is preferably higher than the dielectric constant of piezoelectric substrate 102.

Figure 22B:
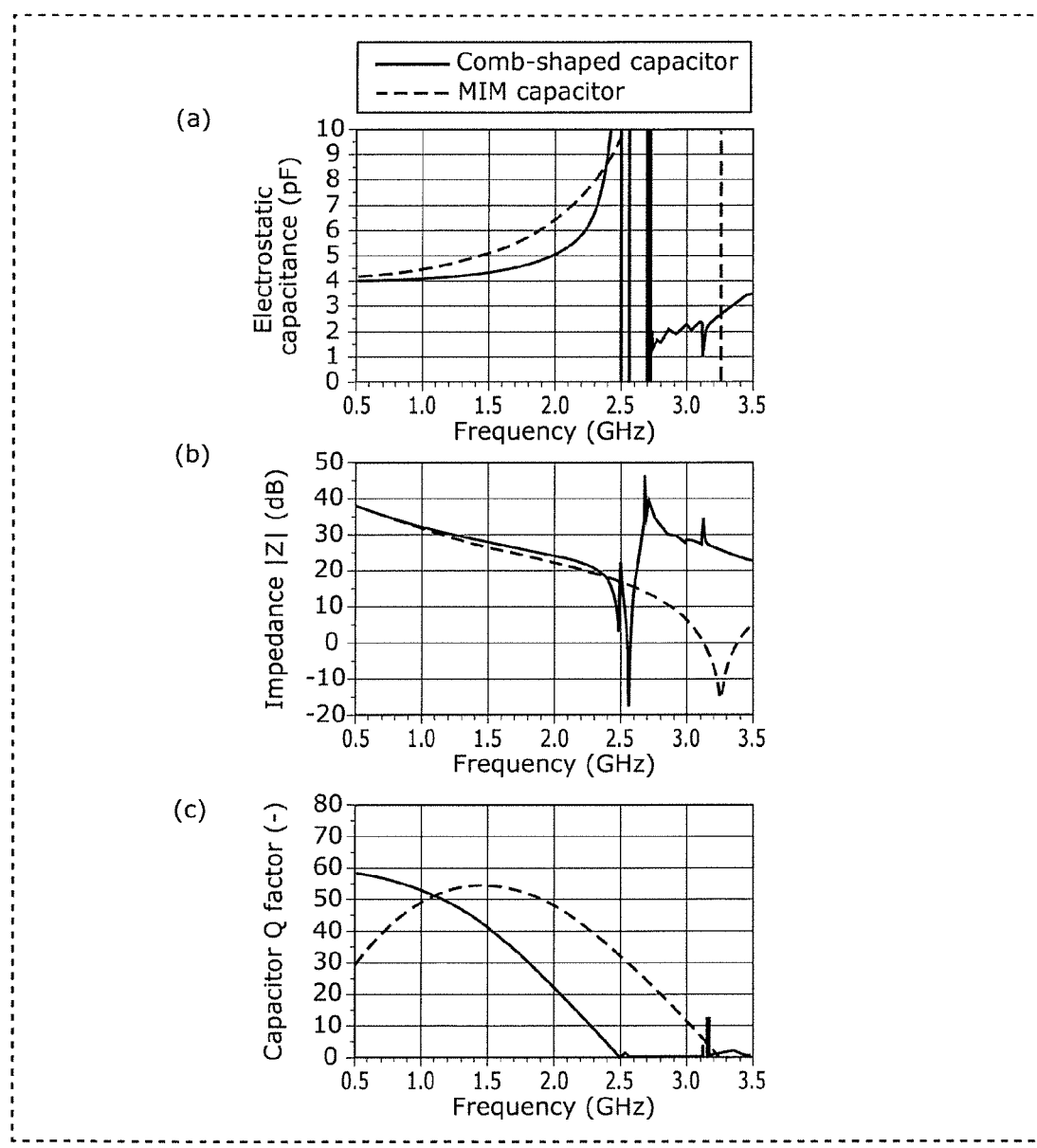
FIG. 22B illustrates graphs showing comparisons of capacitance, impedance, and capacitor Q factors of a comb-shaped electrode capacitor and an MIM capacitor.

FIG. 22B illustrates graphs showing comparisons of capacitance, impedance, and capacitor Q factors of a comb-shaped electrode capacitor and an MIM capacitor. As illustrated in (c) of FIG. 22B, the MIM capacitor has a feature that a capacitor Q factor is greater than that of the comb-shaped electrode capacitor in a higher frequency region. Although depending on the electrode design, the self-resonant frequency of the MIM capacitor can be located at a higher frequency than that of the comb-shaped electrode capacitor, as illustrated in (b) of FIG. 22B.

Embodiment 2

The filter device and the multiplexer described in Embodiment 1 are applicable to a radio frequency front-end circuit and a communication device for a system in which a large number of bands are used. In view of this, such a radio frequency front-end circuit and such a communication device are to be described in the present embodiment.

Figure 23A:
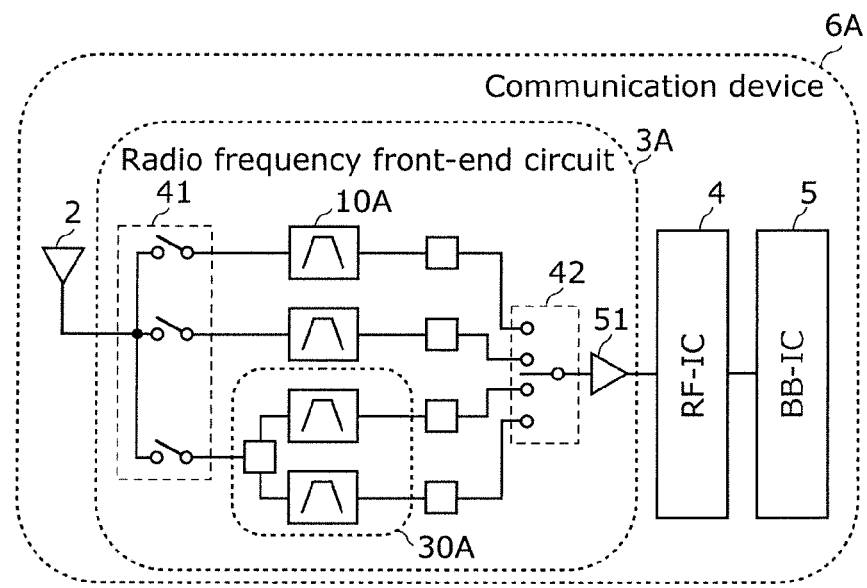
FIG. 23A illustrates a configuration of a communication device according to Embodiment 2.

FIG. 23A illustrates a configuration of communication device 6A according to Embodiment 2. As illustrated in FIG. 23A, communication device 6A includes radio frequency front-end circuit 3A, radio frequency (RF) signal processing circuit (RF integrated circuit (IC)) 4, baseband signal processing circuit (BBIC) 5, and antenna element 2.

Radio frequency front-end circuit 3A includes filter device 10A according to Example 1, multiplexer 30A according to Example 12, receiving amplifier circuit 51, and switches 41 and 42. Radio frequency front-end circuit 3A is a receiving front end circuit that demultiplexes a radio-frequency signal received by antenna element 2.

Switch 41 includes a common connection terminal and a plurality of selection terminals, the common connection terminal is connected to antenna element 2, a first selection terminal among the selection terminals is connected to filter device 10A, a second selection terminal among the selection terminals is connected to another filter, and a third selection terminal among the selection terminals is connected to multiplexer 30A. The above configuration allows switch 41 to switch between connection and disconnection of antenna element 2 to/from filter device 10A, the other filter, and multiplexer 30A.

Switch 42 includes a common connection terminal and a plurality of selection terminals, the common connection terminal is connected to receiving amplifier circuit 51, a first selection terminal among the selection terminals is connected to filter device 10A, a second selection terminal among the selection terminals is connected to another filter, a third selection terminal among the selection terminals is connected to one of filters included in multiplexer 30A, and a fourth selection terminal among the selection terminals is connected to the other filter included in multiplexer 30A. The above configuration allows switch 42 to switch between connection and disconnection of receiving amplifier circuit 51 to/from filter device 10A, the other filter, one of the filters of multiplexer 30A, and the other filter of multiplexer 30A.

Note that in multiplexer 30A, an impedance matching circuit, a phase shifter, a circulator, or a switch element that can select two or more filters, for instance, may be connected between a common terminal of multiplexer 30A and the two filters.

In addition, an impedance matching circuit may be disposed upstream or downstream of filter device 10A and multiplexer 30A.

Radio frequency front-end circuit 3A may not include both filter device 10A and multiplexer 30A, and may include only one of them.

Radio frequency front-end circuit 3A may include one of the filter devices according to Examples 2 to 11, instead of filter device 10A according to Example 1, and may include multiplexer 30B according to Example 13, instead of multiplexer 30A according to Example 12.

Receiving amplifier circuit 51 is a low-noise amplifier that amplifies power of received radio frequency signals passing through the passbands of filter device 10A, the other filter, and multiplexer 30A.

RF signal processing circuit (RFIC) 4 processes radio frequency signals to be transmitted and received by antenna element 2. Specifically, RF signal processing circuit (RFIC) 4 processes a radio frequency signal (here, a radio frequency signal received) input through a receiver signal path from antenna element 2 by down-conversion, for instance, and outputs a received signal generated by being processed to baseband signal processing circuit (BBIC) 5. RF signal processing circuit (RFIC) 4 processes a signal to be transmitted which is input from baseband signal processing circuit (BBIC) 5 by up-conversion, for instance, and outputs a radio frequency signal (here, a radio frequency signal to be transmitted) generated by being processed to a transmitter signal path (not illustrated in FIG. 23A).

According to the above configuration, insertion loss in passbands of filter device 10A and multiplexer 30A is decreased, and furthermore filter device 10A and multiplexer 30A can be miniaturized. Accordingly, the gain in radio frequency front-end circuit 3A improves, and furthermore radio frequency front-end circuit 3A can be miniaturized. The communication quality of communication device 6A can be improved, and the size thereof can be decreased.

Figure 23B:
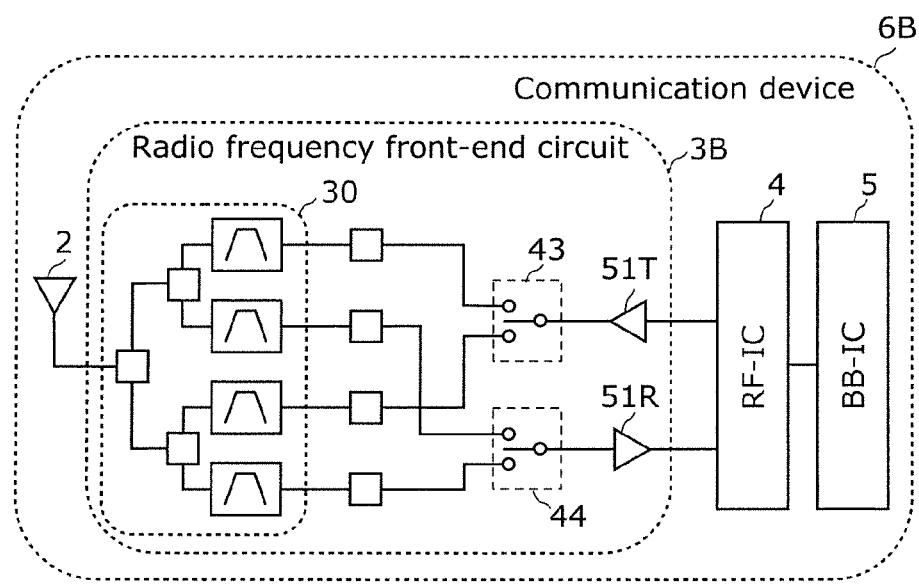
FIG. 23B illustrates a configuration of a communication device according to a variation of Embodiment 2.

FIG. 23B illustrates a configuration of communication device 6B according to a variation of Embodiment 2. As illustrated in FIG. 23B, communication device 6B includes radio frequency front-end circuit 3B, RF signal processing circuit (RFIC) 4, baseband signal processing circuit (BBIC) 5, and antenna element 2.

Radio frequency front-end circuit 3B includes multiplexer 30, transmission amplifier circuit 51T, receiving amplifier circuit 51R, and switches 43 and 44. Radio frequency front-end circuit 3B is a transmitting and receiving front end circuit which demultiplexes radio frequency signals received by antenna element 2 and multiplexes radio frequency signals generated by RFIC 4.

In multiplexer 30, a first duplexer and a second duplexer are connected to a common terminal. The first duplexer includes a first transmission filter, and a first receiving filter. The second duplexer includes a second transmission filter, and a second receiving filter. The filter device according to any one of Examples 1 to 11 is applied to at least one of the first transmission filter, the first receiving filter, the second transmission filter, and the second receiving filter. Note that an impedance matching circuit, a phase shifter, a circulator, or a switch element that can select two or more filters, for instance, may be connected between the first duplexer and the second duplexer, between the first transmission filter and the first receiving filter, and between the second transmission filter and the second receiving filter.

An impedance matching circuit may be disposed upstream or downstream of multiplexer 30.

Multiplexer 30 may not include a duplexer, and may include a transmission filter alone, and a receiving filter alone.

Switch 43 includes a common connection terminal and a plurality of selection terminals, the common connection terminal is connected to transmission amplifier circuit 51T, a first selection terminal among the selection terminals is connected to the first transmission filter, and a second selection terminal among the selection terminals is connected to the second transmission filter. According to the above configuration, switch 43 switches between connection and disconnection of transmission amplifier circuit 51T to/from the first transmission filter and the second transmission filter.

Switch 44 includes a common connection terminal and a plurality of selection terminals, the common connection terminal is connected to receiving amplifier circuit 51R, a first selection terminal among the selection terminals is connected to the first receiving filter, and a second selection terminal among the selection terminals is connected to the second receiving filter. According to the above configuration, switch 44 switches between connection and disconnection of receiving amplifier circuit 51R to/from the first receiving filter and the second receiving filter.

Transmission amplifier circuit 51T is a power amplifier that amplifies power of radio frequency signals to be transmitted that pass through the passbands of the first transmission filter and the second transmission filter. Receiving amplifier circuit 51R is a low-noise amplifier that amplifies power of received radio frequency signals that pass through the passbands of the first receiving filter and the second receiving filter.

According to the above configuration, insertion loss in the passband of multiplexer 30 is decreased, and at the same time, multiplexer 30 can be miniaturized. Accordingly, the gain in radio frequency front-end circuit 3B improves, and furthermore radio frequency front-end circuit 3B can be miniaturized. The communication quality of communication device 6B is improved, and the size thereof can be decreased.

OTHER EMBODIMENTS

The above has described the filter device, the multiplexer, the radio frequency front-end circuit, and the communication device according to the present disclosure, using Embodiments 1 and 2, yet the present disclosure is not limited to the above embodiments. The present disclosure also encompasses another embodiment achieved by combining arbitrary elements in the above embodiments, variations as a result of applying, to the embodiments, various modifications that may be conceived by those skilled in the art without departing from the scope of the present disclosure, and various devices that include the filter device, the multiplexer, the radio frequency front-end circuit, and the communication device according to the present disclosure.

Note that a series-arm circuit and a parallel-arm circuit in Embodiments 1 and 2 are defined as follows.

A parallel-arm circuit is disposed between the ground and a node on a path that connects a first input/output terminal and a second input/output terminal.

A series-arm circuit is disposed between the node on the path connected with the parallel-arm circuit and the first input/output terminal or the second input/output terminal, or is disposed between a node on the path connected with a parallel-arm circuit and another node on the path connected with another parallel-arm circuit.

The duplexer in Embodiment 2 indicates not only a multiplexer in which in frequency division duplex (FDD), a transmission signal flows into one filter and a reception signal flows into another filter, but also indicates a multiplexer in which in time division duplex (TDD), a transmission signal flows into one filter and a reception signal flows into another filter.

For example, a controller that switches between on and off of switch SWp1 in Example 9, switches 41 and 42 in radio frequency front-end circuit 3A, and switches 43 and 44 in radio frequency front-end circuit 3B, for instance, may be disposed in RFIC 4. Alternatively, the controller may be disposed outside RFIC 4 and, for example, may be disposed in any of radio frequency front-end circuits 3A and 3B. Specifically, the configurations of radio frequency front-end circuits 3A and 3B are not limited to the configurations described above, and radio frequency front-end circuits 3A and 3B may each include one of the filter devices according to the examples of Embodiment 1, and a controller that controls on and off of a switch element included in the filter device.

For example, an inductor and/or a capacitor may be connected between elements in radio frequency front-end circuits 3A and 3B or communication devices 6A and 6B. Note that the inductor may include a line inductor achieved by a line that connects elements.

Switch SWp1 according to Example 9 is a single pole single throw (SPST) switch element, is, for example, a field effect transistor (FET) switch that includes GaAs or complementary metal oxide semiconductor (CMOS) or a diode switch, and is achieved as a switch integrated circuit (IC). Note that the switch element is not limited to a semiconductor switch, and may be a mechanical switch that includes micro electro mechanical systems (MEMS). Such switches are small, and thus the filter device according to Embodiment 1 can be miniaturized.

The series-arm resonator and the parallel-arm resonator included in the filter device and the multiplexer according to Embodiment 1 are acoustic wave resonators that use acoustic waves, and are, for example, resonators that use surface acoustic waves (SAWs), resonators that use bulk acoustic waves (BAWs), film bulk acoustic resonators (FBARs), or solidly mounted resonators (SMRs). Accordingly, this can achieve a small filter device having high selectivity. Note that surface acoustic waves indicate acoustic waves that propagate on the surface of a piezoelectric component or the interface of materials, and indicate acoustic waves of various types achieved using an IDT electrode. Examples of surface acoustic waves include surface waves, Love waves, leaky waves, Rayleigh waves, boundary waves, leaky SAWs, pseudo SAWs, and plate waves.

The term "ground" in Embodiments 1 and 2 refers to a reference electrode, and is, for example, an electrode having a potential used as a reference in the filter device according to Embodiment 1.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a filter device miniaturized while maintaining filter characteristics, a multiplexer, a front end circuit, and a communication device.

The invention claimed is:

1. A filter device that includes a first input/output terminal and a second input/output terminal, the filter device comprising:
   a series-arm circuit disposed on a path that connects the first input/output terminal and the second input/output terminal; and
   a parallel-arm circuit connected to a node on the path and a ground,
      wherein at least one of the series-arm circuit or the parallel-arm circuit includes a resonance circuit, and
   the resonance circuit includes:
      a first acoustic wave resonator; and
      a first capacitor connected in parallel to the first acoustic wave resonator, and having a greater electrostatic capacitance per unit area than that for the first acoustic wave resonator, wherein the first acoustic wave resonator is a surface acoustic wave resonator that includes:
         a piezoelectric substrate; and
         an interdigital transducer (IDT) electrode that is formed on the piezoelectric substrate and includes electrode fingers,
   the first capacitor includes a comb-shaped capacitor that is formed on the piezoelectric substrate and includes electrode fingers, and
   a gap between adjacent electrode fingers out of the electrode fingers included in the comb-shaped capacitor is narrower than a gap between adjacent electrode fingers out of the electrode fingers included in the IDT electrode.

2. The filter device according to claim 1,
   wherein one of the series-arm circuit or the parallel-arm circuit includes the resonance circuit, and an other of the series-arm circuit or the parallel-arm circuit includes a second acoustic wave resonator not connected in parallel to a capacitor, and
   under a condition that a value obtained by dividing a difference between an antiresonant frequency of an acoustic wave resonator and a resonant frequency of the acoustic wave resonator by the resonant frequency of the acoustic wave resonator is defined as a fractional bandwidth of the acoustic wave resonator, the first acoustic wave resonator has a fractional bandwidth greater than a fractional bandwidth of the second acoustic wave resonator.

3. The filter device according to claim 2, wherein
   under a condition that a fractional bandwidth of the acoustic wave resonator is defined as a value obtained by dividing a difference between an antiresonant frequency of an acoustic wave resonator and a resonant frequency of the acoustic wave resonator by the resonant frequency of the acoustic wave resonator, and
   under a condition that a fractional bandwidth of the resonance circuit is defined as a value obtained by dividing a difference between an antiresonant frequency of a resonance circuit and a resonant frequency of the resonance circuit by the resonant frequency of the resonance circuit, the antiresonant frequency of the resonance circuit being a frequency at which an impedance of the resonance circuit has a local maximum value, and the resonant frequency of the resonance circuit being a frequency at which the impedance of the resonance circuit has a local minimum value,
   the resonance circuit has a fractional bandwidth narrower than or equal to a fractional bandwidth of the second acoustic wave resonator.

4. The filter device according to claim 1,
   wherein one of the series-arm circuit or the parallel-arm circuit includes the resonance circuit, and an other of the series-arm circuit or the parallel-arm circuit includes a second acoustic wave resonator not connected in parallel to a capacitor, and
   the resonance circuit has an electrostatic capacitance greater than that of the second acoustic wave resonator.

5. The filter device according to claim 1,
   the series-arm circuit includes one or more other series-arm circuits;
   the parallel-arm circuit includes one or more other parallel-arm circuits each connected to a node on the path and the ground, and
   two or more resonance circuits disposed in two or more of the one or more other series-arm circuits and the one or more other parallel-arm circuits, the two or more resonance circuits having a same structure as the resonance circuit,
      wherein the one or more other series-arm circuits and the one or more other parallel-arm circuits are included in a multi-level ladder filter circuit.

6. The filter device according to claim 1,
   wherein the parallel-arm circuit includes:
      the resonance circuit; and
      a switch circuit connected in series to the resonance circuit, the switch circuit including
         an impedance element that is one of a second capacitor and an inductor, and
         a switch element connected in parallel to the impedance element.

7. The filter device according to claim 1,
   wherein the at least one of the series-arm circuit or the parallel-arm circuit includes other resonance circuits each of which having a same structure as the resonance circuit, and
   the other resonance circuits are connected in series.

8. The filter device according to claim 1,
   wherein a repeating pitch of the electrode fingers included in the comb-shaped capacitor is narrower than a repeating pitch of the electrode fingers included in the IDT electrode.

9. The filter device according to claim 1,
   wherein the electrode fingers included in the comb-shaped capacitor are thinner than the electrode fingers included in the IDT electrode.

10. The filter device according to claim 1,
    wherein under a condition that a ratio of a width of electrode fingers to a pitch of the electrode fingers is defined as a duty ratio, electrode fingers of the comb-shaped capacitor have a duty ratio higher than that for the IDT electrode.

11. The filter device according to claim 1,
    wherein the first acoustic wave resonator is a surface acoustic wave resonator that includes:
       a piezoelectric substrate; and
       an interdigital transducer (IDT) electrode that is formed on the piezoelectric substrate and includes electrode fingers,
    the first capacitor includes:
       a first electrode;
       a second electrode facing the first electrode; and
       an insulating component disposed between the first electrode and the second electrode, and the insulating component has a permittivity higher than a permittivity of the piezoelectric substrate.

12. A multiplexer, comprising:
a plurality of filters that each include a circuit having a same structure as the filter device according to claim 1, wherein input terminals or output terminals of the plurality of filters are directly or indirectly connected to a common terminal.

13. The multiplexer according to claim 12,
wherein one of the input terminal and the output terminal of the filter device is connected to the at least one of the series-arm circuit or the parallel-arm circuit that includes the resonance circuit and not via a series-arm circuit that includes an acoustic wave resonator or a parallel-arm circuit that includes an acoustic wave resonator, and
at least one of the plurality of filters other than the filter device has a passband having a frequency range higher than a frequency range of a passband of the filter device.

14. A radio frequency front-end circuit, comprising:
the filter device according to claim 1;
a multiplexer that includes a plurality of filters that each include a circuit having a same structure as the filter device according to claim 1, wherein input terminals or output terminals of the plurality of filters are directly or indirectly connected to a common terminal; and
an amplifier circuit directly or indirectly connected to the filter device and the multiplexer.

15. A communication device, comprising:
a radio frequency (RF) signal processing circuit that processes a radio frequency signal to be transmitted by an antenna element and a radio frequency signal received by the antenna element; and
the radio frequency front-end circuit according to claim 14 that conveys the radio frequency signals between the antenna element and the RF signal processing circuit.

16. A radio frequency front-end circuit, comprising:
a multiplexer that includes a plurality of filters that each include a circuit having a same structure as the filter device according to claim 1, wherein the first acoustic wave resonator is a surface acoustic wave resonator that includes:
a piezoelectric substrate; and
an interdigital transducer (IDT) electrode that is formed on the piezoelectric substrate and includes electrode fingers,
the first capacitor includes a comb-shaped capacitor that is formed on the piezoelectric substrate and includes electrode fingers, and
a gap between adjacent electrode fingers out of the electrode fingers included in the comb-shaped capacitor is narrower than a gap between adjacent electrode fingers out of the electrode fingers included in the IDT electrode,
wherein input terminals or output terminals of the plurality of filters are directly or indirectly connected to a common terminal; and
an amplifier circuit directly or indirectly connected to the filter device for each of the plurality of filters and the multiplexer.

17. A filter device that includes a first input/output terminal and a second input/output terminal, the filter device comprising:
a series-arm circuit disposed on a path that connects the first input/output terminal and the second input/output terminal; and
a parallel-arm circuit connected to a node on the path and a ground,
wherein at least one of the series-arm circuit or the parallel-arm circuit includes a resonance circuit, and
the resonance circuit includes:
a first acoustic wave resonator; and
a first capacitor connected in parallel to the first acoustic wave resonator, and having a greater electrostatic capacitance per unit area than that for the first acoustic wave resonator
wherein the first capacitor includes:
a first electrode;
a second electrode facing the first electrode; and
an insulating component disposed between the first electrode and the second electrode,
the first acoustic wave resonator includes:
a third electrode;
a fourth electrode facing the third electrode; and
a piezoelectric component disposed between the third electrode and the fourth electrode, and
the insulating component has a permittivity higher than a permittivity of the piezoelectric component.

18. The filter device according to claim 17,
wherein the at least one of the series-arm circuit or the parallel-arm circuit is connected
to a terminal through which power is applied out of the first input/output terminal and the second input/output terminal, and not via a circuit that includes an acoustic wave resonator.

19. A filter device that includes a first input/output terminal and a second input/output terminal, the filter device comprising:
a series-arm circuit disposed on a path that connects the first input/output terminal and the second input/output terminal; and
a parallel-arm circuit connected to a node on the path and a ground,
wherein at least one of the series-arm circuit or the parallel-arm circuit includes a resonance circuit, and
the resonance circuit includes:
a first acoustic wave resonator; and
a first capacitor connected in parallel to the first acoustic wave resonator, and having a greater electrostatic capacitance per unit area than that for the first acoustic wave resonator
wherein the first capacitor includes:
a first electrode;
a second electrode facing the first electrode; and
an insulating component disposed between the first electrode and the second electrode,
the first acoustic wave resonator includes:
a third electrode;
a fourth electrode facing the third electrode; and
a piezoelectric component disposed between the third electrode and the fourth electrode, and
the insulating component is thinner than the piezoelectric component.

* * * * *